US012112805B2

United States Patent

(12) United States Patent
Fukuzumi et al.

(10) Patent No.: US 12,112,805 B2
(45) Date of Patent: Oct. 8, 2024

(54) APPARATUS CONTAINING MEMORY ARRAY STRUCTURES HAVING MULTIPLE SUB-BLOCKS

(71) Applicant: MICRON TECHNOLOGY, INC., Boise, ID (US)

(72) Inventors: Yoshiaki Fukuzumi, Yokohama (JP); Jun Fujiki, Tokyo (JP); Shuji Tanaka, Kanagawa (JP); Masanobu Saito, Chiba (JP)

(73) Assignee: Micron Technology, Inc., Boise, ID (US)

(*) Notice: Subject to any disclaimer, the term of this patent is extended or adjusted under 35 U.S.C. 154(b) by 150 days.

(21) Appl. No.: 17/889,471

(22) Filed: Aug. 17, 2022

(65) Prior Publication Data

US 2023/0085034 A1 Mar. 16, 2023

Related U.S. Application Data

(60) Provisional application No. 63/238,892, filed on Aug. 31, 2021.

(51) Int. Cl.

| | |
|---|---|
| ***G11C 16/10*** | (2006.01) |
| ***G11C 16/04*** | (2006.01) |
| ***H10B 41/10*** | (2023.01) |
| ***H10B 41/27*** | (2023.01) |
| ***H10B 41/35*** | (2023.01) |
| ***H10B 43/10*** | (2023.01) |

(Continued)

(52) U.S. Cl.

CPC .......... *G11C 16/10* (2013.01); *G11C 16/0483* (2013.01); *H10B 41/10* (2023.02); *H10B 41/27* (2023.02); *H10B 41/35* (2023.02); *H10B 43/10* (2023.02); *H10B 43/27* (2023.02); *H10B 43/35* (2023.02)

(58) Field of Classification Search

CPC .... G11C 16/10; G11C 16/0483; H10B 41/10; H10B 27/35; H10B 43/10; H10B 43/27; H10B 43/35

See application file for complete search history.

(56) References Cited

U.S. PATENT DOCUMENTS

| | | | |
|---|---|---|---|
| 7,450,422 | B2 | 11/2008 | Roohparvar |
| 7,551,467 | B2 | 6/2009 | Roohparvar |
| 2013/0092994 | A1 | 4/2013 | Shim et al. |

(Continued)

OTHER PUBLICATIONS

International Search Report and Written Opinion of the International Searching Authority for Application No. PCT/US2022/041449 mailed Dec. 7, 2022 (12 pages).

*Primary Examiner* — Son L Mai
(74) *Attorney, Agent, or Firm* — Dicke, Billig & Czaja, PLLC

(57) ABSTRACT

Apparatus might include an array of memory cells comprising a plurality of strings of series-connected memory cells, a data line, a plurality of sets of field-effect transistors with each of the sets of field-effect transistors between the data line and a respective string of series-connected memory cells and having N field-effect transistors that are fabricated to have a respective binary permutation of two threshold voltages of a plurality of possible binary permutations of two threshold voltages having N positions, and N select lines that are each connected to a control gate of a respective field-effect transistor of each of the sets of field-effect transistors.

45 Claims, 42 Drawing Sheets

(51) Int. Cl.

| | |
|---|---|
| ***H10B 43/27*** | (2023.01) |
| ***H10B 43/35*** | (2023.01) |

(56) References Cited

U.S. PATENT DOCUMENTS

| | | | | |
|---|---|---|---|---|
| 2013/0094287 | A1 | 4/2013 | Lee et al. | |
| 2019/0198515 | A1 | 6/2019 | Hosoda et al. | |
| 2019/0221272 | A1 | 7/2019 | Tanzawa et al. | |
| 2024/0079058 | A1* | 3/2024 | Fujiki ................ | G11C 16/0483 |

* cited by examiner

APPARATUS CONTAINING MEMORY ARRAY STRUCTURES HAVING MULTIPLE SUB-BLOCKS

RELATED APPLICATION

This application claims the benefit of U.S. Provisional Application No. 63/238,892, filed on Aug. 31, 2021, hereby incorporated herein in its entirety by reference.

TECHNICAL FIELD

The present disclosure relates generally to integrated circuits and integrated circuit operation, and, in particular, in one or more embodiments, the present disclosure relates to memory array structures having multiple sub-blocks, apparatus containing such memory array structures, and operation of such apparatus.

BACKGROUND

Integrated circuit devices traverse a broad range of electronic devices. One particular type include memory devices, oftentimes referred to simply as memory. Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor might be connected to a source, while each drain select transistor might be connected to a data line, such as column bit line. Variations using more than one select gate between a string of memory cells and the source, and/or between the string of memory cells and the data line, are known.

A general trend in semiconductor memory fabrication is to increase memory density. This might be accomplished by decreasing feature sizes and/or utilizing three-dimensional array structures to increase the number of memory cells formed in a given area of a semiconductor wafer. However, such approaches have limitations.

DETAILED DESCRIPTION

Figure 1:
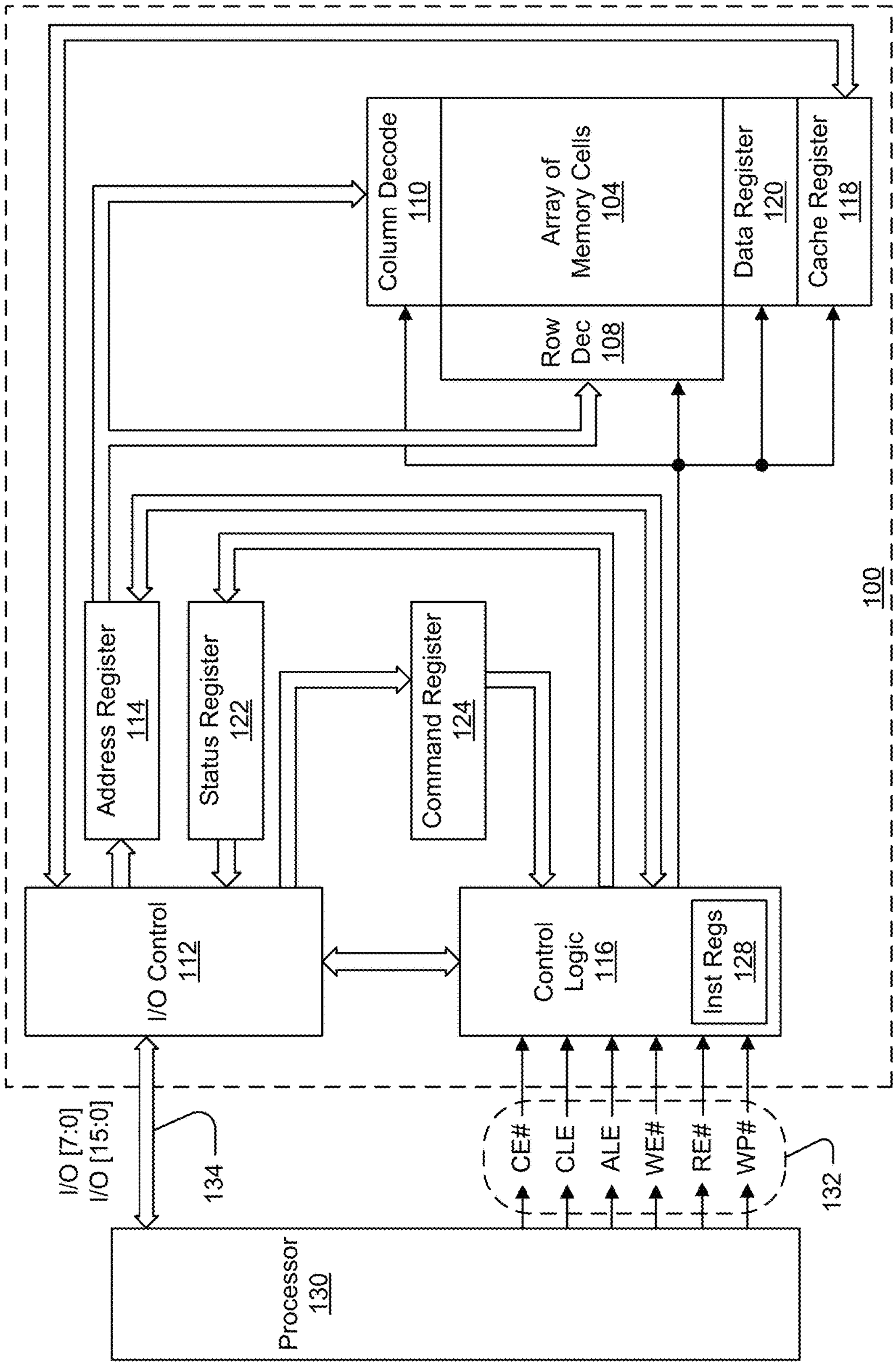
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments might be utilized and structural, logical and electrical changes might be made without departing from the scope of the present disclosure. The following detailed description is, therefore, not to be taken in a limiting sense.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting by a conductive path unless otherwise apparent from the context.

As used herein, multiple acts being performed concurrently will mean that each of these acts is performed for a respective time period, and each of these respective time periods overlaps, in part or in whole, with each of the remaining respective time periods. In other words, portions of each of those acts are simultaneously performed for at least some period of time.

It is recognized herein that even where values might be intended to be equal, variabilities and accuracies of industrial processing and operation might lead to differences from their intended values. These variabilities and accuracies will generally be dependent upon the technology utilized in fabrication and operation of the integrated circuit device. As such, if values are intended to be equal, those values are deemed to be equal regardless of their resulting values.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, might be a memory controller or other external host device.

Memory device 100 includes an array of memory cells 104 that might be logically arranged in rows and columns. The array of memory cells 104 might contain array structures in accordance with one or more embodiments. Memory cells of a logical row are typically connected to the same access line (commonly referred to as a word line) while memory cells of a logical column are typically selectively connected to the same data line (commonly referred to as a bit line). A single access line might be associated with more than one logical row of memory cells and a single data line might be associated with more than one logical column. Memory cells (not shown in FIG. 1) of at least a portion of array of memory cells 104 are capable of being programmed to one of at least two target data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and might generate status information for the external processor 130, i.e., control logic 116 is configured to perform access operations (e.g., sensing operations [which might include read operations and verify operations], programming operations and/or erase operations) on the array of memory cells 104. The control logic 116 is in communication with row decode circuitry 108 and column decode circuitry 110 to control the row decode circuitry 108 and column decode circuitry 110 in response to the addresses. The control logic 116 might include instruction registers 128 which might represent computer-usable memory for storing computer-readable instructions. For some embodiments, the instruction registers 128 might represent firmware. Alternatively, the instruction registers 128 might represent a grouping of memory cells, e.g., reserved block(s) of memory cells, of the array of memory cells 104. The control logic 116 might be configured, e.g., in response to such computer-readable instructions, to cause the memory 100 to perform methods of one or more embodiments.

Control logic 116 might further be in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data might be passed from the cache register 118 to the data register 120 for transfer to the array of memory cells 104; then new data might be latched in the cache register 118 from the I/O control circuitry 112. During a read operation, data might be passed from the cache register 118 to the I/O control circuitry 112 for output to the external processor 130; then new data might be passed from the data register 120 to the cache register 118. The cache register 118 and/or the data register 120 might form (e.g., might form a portion of) a page buffer of the memory device 100. A page buffer might further include sensing devices (not shown in FIG. 1) to sense a data state of a memory cell of the array of memory cells 104, e.g., by sensing a state of a data line connected to that memory cell. A status register 122 might be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) might be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands might be received over input/output (I/O) pins [7:0] of I/O bus 134 at I/O control circuitry 112 and might then be written into command register 124. The addresses might be received over input/output (I/O) pins [7:0] of I/O bus 134 at I/O control circuitry 112 and might then be written into address register 114. The data might be received over input/output (I/O) pins [7:0] for an 8-bit device or input/output (I/O) pins [15:0] for a 16-bit device at I/O control circuitry 112 and then might be written into cache register 118. The data might be subsequently written into data register 120 for programming the array of memory cells 104. For another embodiment, cache register 118 might be omitted, and the data might be written directly into data register 120. Data might also be output over input/output (I/O) pins [7:0] for an 8-bit device or input/output (I/O) pins [15:0] for a 16-bit device. Although reference might be made to I/O pins, they might include any conductive nodes providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 might not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) might be used in the various embodiments.

Figure 2A:
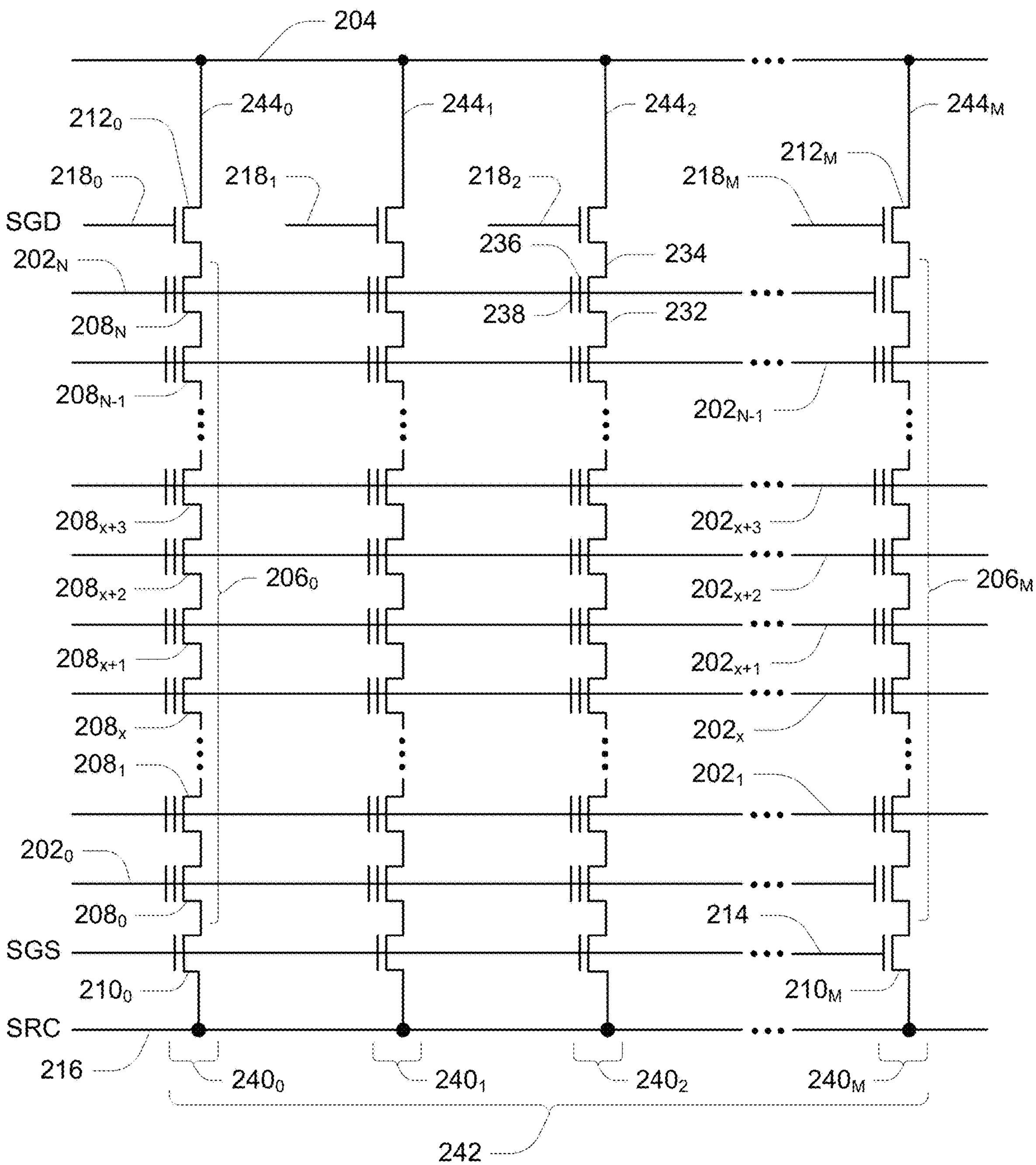
FIG. 2A is a schematic of a portion of an array of memory cells of the related art.

FIG. 2A is a schematic of a portion of an array of memory cells, such as a NAND memory array, of the related art. The array of memory cells includes access lines (e.g., word lines) $\mathbf{202}_0$ to $\mathbf{202}_N$, and a data line (e.g., bit line) 204.

The array of memory cells might be arranged in rows (each corresponding to an access line 202) and columns (each corresponding to a data line 204). Each column might include a string of series-connected memory cells (e.g., non-volatile memory cells), such as one of NAND strings $\mathbf{206}_0$ to $\mathbf{206}_M$. Each NAND string 206 might be connected (e.g., selectively connected) to a common source (SRC) 216 and might include memory cells $\mathbf{208}_0$ to $\mathbf{208}_N$. The memory cells 208 might represent non-volatile memory cells for storage of data.

The memory cells 208 of each NAND string 206 might be connected in series between a select gate 210 (e.g., a field-effect transistor), such as one of the select gates $\mathbf{210}_0$ to $\mathbf{210}_M$, and a select gate 212 (e.g., a field-effect transistor), such as one of the select gates $\mathbf{212}_0$ to $\mathbf{212}_M$. Select gates $\mathbf{210}_0$ to $\mathbf{210}_M$ might be commonly connected to a select line 214, such as a source select line (SGS), and select gates $\mathbf{212}_0$ to $\mathbf{212}_M$ might be connected to different select lines 218, e.g., select lines $\mathbf{218}_0$-$\mathbf{218}_M$. A control gate of each select gate 210 might be connected to select line 214. A control gate of each select gate 212 might be connected to a respective select line 218. As used herein, a field-effect transistor, e.g., an integrated circuit device using an electric field to control the flow of current, might be alternatively referred to as a transistor.

A source of each select gate 210 might be connected to common source 216. The drain of each select gate 210 might be connected to a memory cell 208 of the corresponding NAND string 206. For example, the drain of select gate $\mathbf{210}_0$ might be connected to the source of memory cell $\mathbf{208}_0$ of the corresponding NAND string $\mathbf{206}_0$. Therefore, each select gate 210 for a corresponding NAND string 206 might be configured to selectively connect that NAND string 206 to common source 216.

The drain of each select gate 212 might be connected to the data line 204. The source of each select gate 212 might be connected to a memory cell 208 of the corresponding NAND string 206. For example, the source of select gate $\mathbf{212}_0$ might be connected to memory cell $\mathbf{208}_N$ of the corresponding NAND string $\mathbf{206}_0$. Therefore, each select gate 212 for a corresponding NAND string 206 might be configured to selectively connect that NAND string 206 to the data line 204.

A sub-block of memory cells 240, e.g., sub-blocks of memory cells $\mathbf{240}_0$-$\mathbf{240}_M$, might each include one or more NAND strings 206 having their select gates 212 connected to a same select line 218. A block of memory cells 242 might include each sub-block of memory cells 240 sharing a same set of access lines 202. Each sub-block of memory cells 240 might have one or more respective channel material structures 244, with each channel material structure 244 forming a channel of the select gate 210, the select gate 212, and each memory cell 208 of its respective NAND string 206. For example, the channel material structure $\mathbf{244}_0$ might form a channel for the select gate $\mathbf{210}_0$, the select gate $\mathbf{212}_0$, and each memory cell $\mathbf{208}_0$-$\mathbf{208}_N$ of the NAND string $\mathbf{206}_0$.

Typical construction of memory cells 208 includes a data-storage structure 236 (e.g., a floating gate, charge trap, or other structure configured to store charge) that can determine a data state of the memory cell (e.g., through changes in threshold voltage), and a control gate 238, as shown in FIG. 2A. The data-storage structure 236 might include both conductive and dielectric structures while the control gate 238 is generally formed of one or more conductive materials. In some cases, memory cells 208 might further have a defined source/drain (e.g., source) 232 and a defined source/drain (e.g., drain) 234. Memory cells 208 have their control gates 238 connected to (and in some cases form) an access line 202.

Figure 2B:
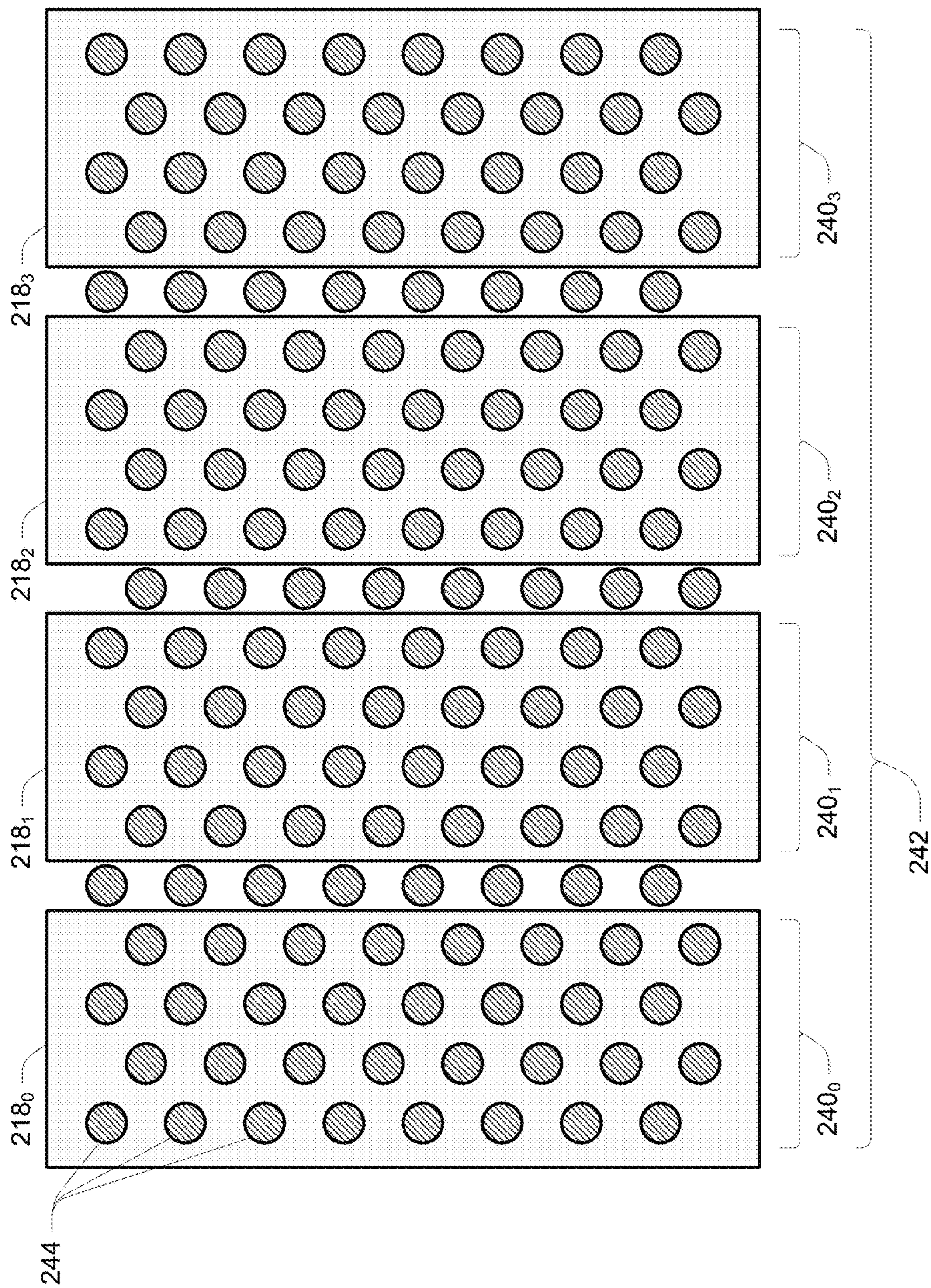
FIGS. 2B-2C might represent top views of an array of memory cells including a structure of the type depicted in FIG. 2A, and further depicting a separation of select lines.

FIG. 2B might represent a top view of an array of memory cells including a structure of the type depicted in FIG. 2A, and further depicting a separation of select lines 218 facilitated by the inclusion of dummy channel material structures 244, e.g., channel material structures 244 that are not connected to a select line 218 and thus could be inaccessible for data storage. The select lines $\mathbf{218}_0$-$\mathbf{218}_3$ for the sub-blocks of memory cells $\mathbf{240}_0$-$\mathbf{240}_3$, respectively, are each depicted to be conductive plates, as is common in 3D NAND arrays. Although separation of the select lines 218 as depicted in FIG. 2B facilitates independent selection of the sub-blocks of memory cells 240, such separation generally increases the footprint of a block of memory cells 242 due to the inclusion of dummy channel material structures 244 that do not contribute to the overall data storage capacity of the memory.

Figure 2C:
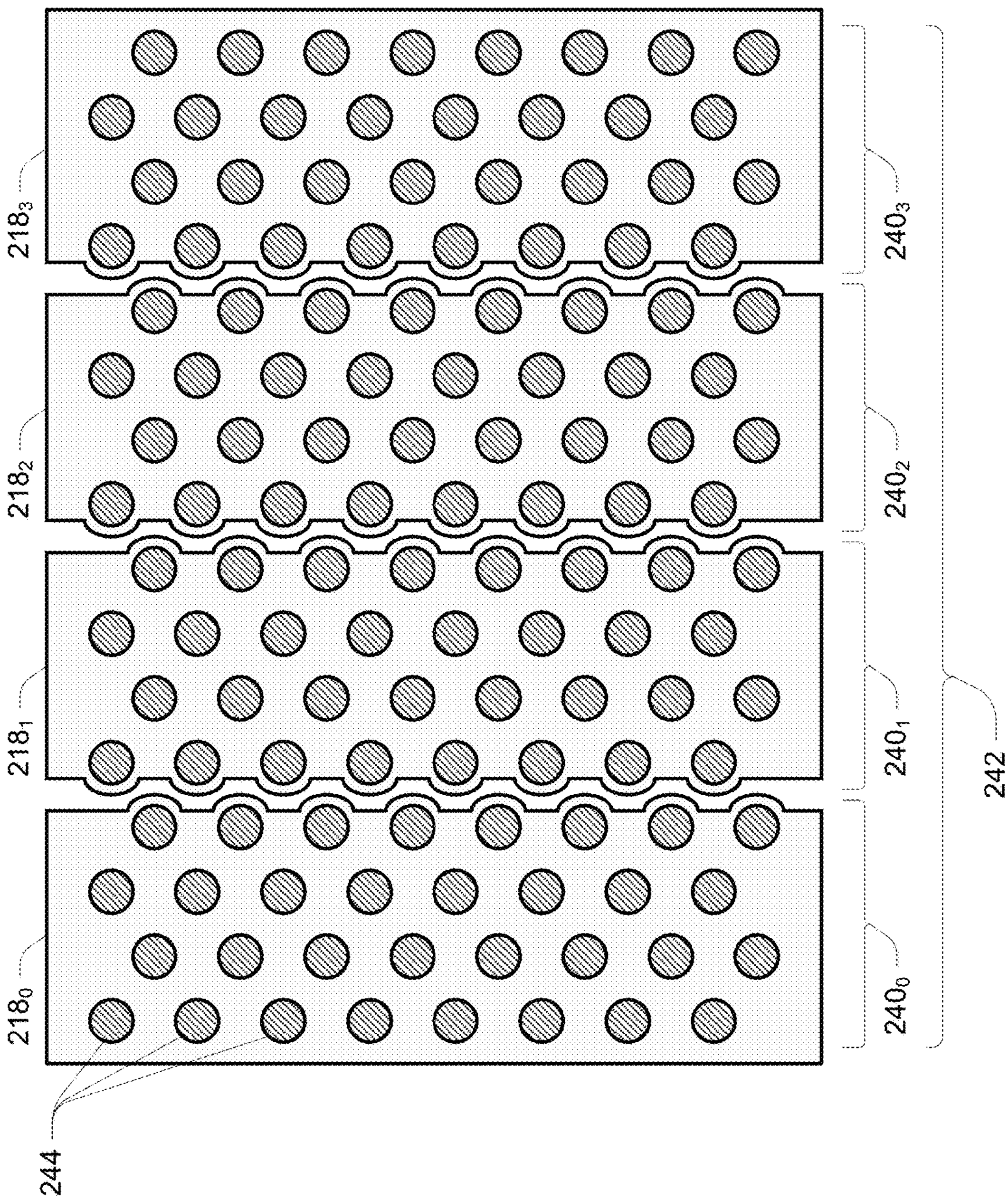

FIG. 2C might represent a top view of an array of memory cells including a structure of the type depicted in FIG. 2A, and further depicting a separation of select lines 218 facilitated by the use of a weave cut between the select lines 218. For example, the select gates connected to the select lines 218, e.g., select gates 212, might utilize a different structure than the memory cells 208, e.g., lacking a data storage structure and using a thinner gate dielectric. This might provide sufficient spacing between control gates to provide adequate isolation of the select lines 218. The select lines $\mathbf{218}_0$-$\mathbf{218}_3$ for the sub-blocks of memory cells $\mathbf{240}_0$-$\mathbf{240}_3$, respectively, are each depicted to be conductive plates, as is common in 3D NAND arrays. Although separation of the select lines 218 as depicted in FIG. 2C facilitates independent selection of the sub-blocks of memory cells 240, such separation might become impracticable as feature dimensions of the array structures become smaller. Various embodiments seek to facilitate independent selection of sub-blocks of memory cells 240 without separation between select lines 218.

Figure 3A:
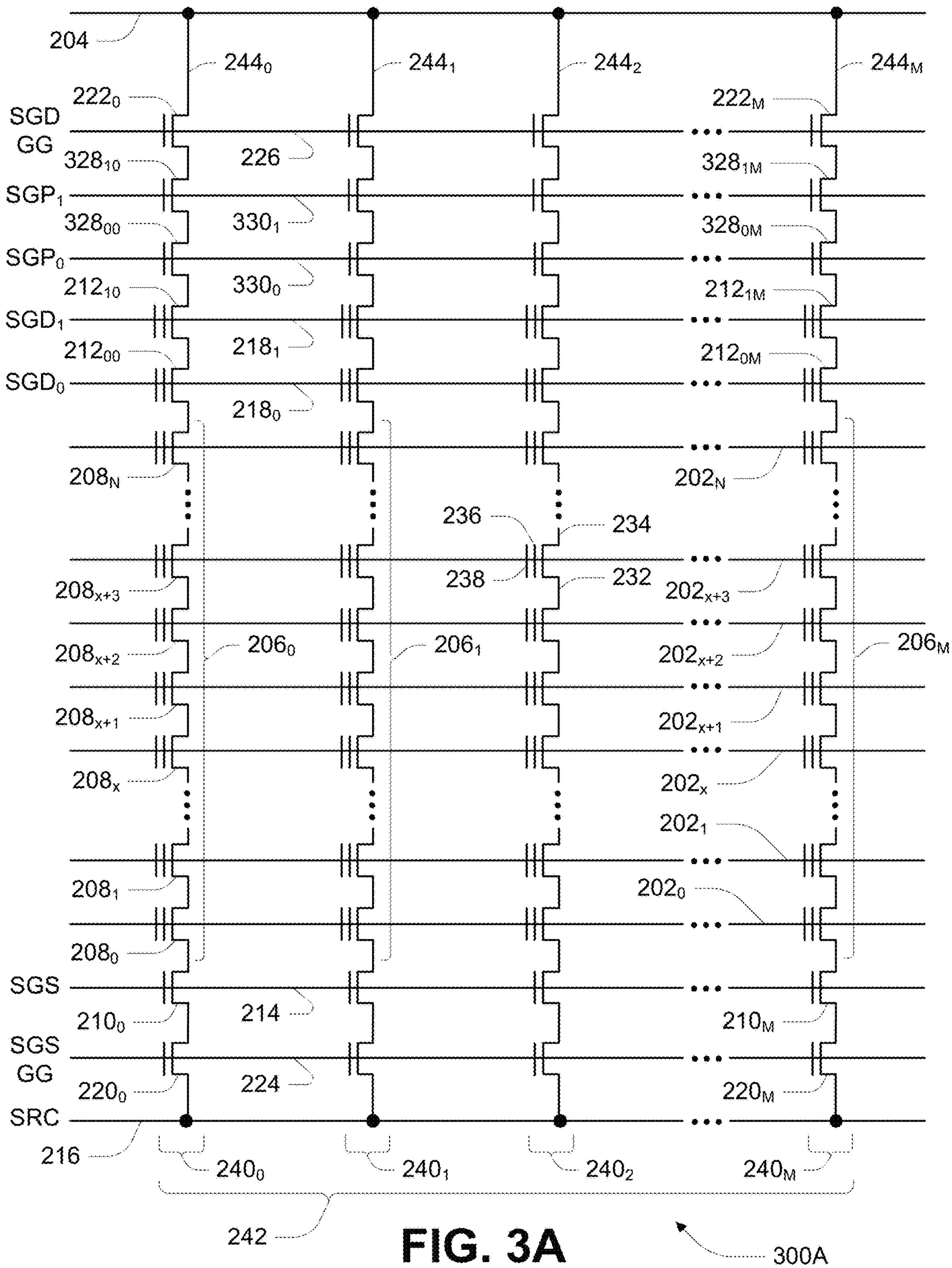
FIGS. 3A-3C are schematics of portions of an array of memory cells in accordance with embodiments as could be used in a memory of the type described with reference to FIG. 1.

FIG. 3A is a schematic of a portion of an array of memory cells 300A, such as a NAND array of memory cells, as could be used in a memory of the type described with reference to FIG. 1, e.g., as a portion of array of memory cells 104. The array of memory cells 300A includes access lines (e.g., word lines) $\mathbf{202}_0$ to $\mathbf{202}_N$, and a data line (e.g., bit line) 204. The access lines 202 might be connected to global access lines (e.g., global word lines), not shown in FIG. 3A, in a many-to-one relationship. For some embodiments, the array of memory cells 300A might be formed over a semiconductor that, for example, might be conductively doped to have a conductivity type, such as a p-type conductivity, e.g., to form a p-well, or an n-type conductivity, e.g., to form an n-well.

The array of memory cells 300A might be arranged in rows (each corresponding to an access line 202) and columns (each corresponding to a data line 204). Each column might include a string of series-connected memory cells (e.g., non-volatile memory cells), such as one of NAND strings $\mathbf{206}_0$ to $\mathbf{206}_M$. Each NAND string 206 might be connected (e.g., selectively connected) to a common source (SRC) 216 and might include memory cells $\mathbf{208}_0$ to $\mathbf{208}_N$. The memory cells 208 might represent non-volatile memory cells for storage of data. Some of the memory cells 208 might represent dummy memory cells, e.g., memory cells not intended to store user data. Dummy memory cells are typically not accessible to a user of the memory, and are typically incorporated into the NAND string 206 for operational advantages, as are well understood.

The memory cells 208 of each NAND string 206 might be connected in series between a select gate 210 (e.g., a transistor), such as one of the select gates $\mathbf{210}_0$ to $\mathbf{210}_M$ (e.g., that might be source select transistors, commonly referred to as select gate source), and two or more select gates 212 (e.g., transistors), such as one of the select gates $\mathbf{212}_{00}$ to $\mathbf{212}_{0M}$ or $\mathbf{212}_{10}$-$\mathbf{212}_{1M}$ (e.g., that might be drain select transistors, commonly referred to as select gate drain). Select gates $\mathbf{210}_0$ to $\mathbf{210}_M$ might be commonly connected to a select line 214, such as a source select line (SGS). Select gates $\mathbf{212}_{00}$ to $\mathbf{212}_{0M}$ might be commonly connected to a select line $\mathbf{218}_0$, such as a drain select line ($SGD_0$). Select gates $\mathbf{212}_{10}$ to $\mathbf{212}_{1M}$ might be commonly connected to a select line $\mathbf{218}_1$, such as a drain select line ($SGD_1$). The select gates 212 might utilize a structure similar to (e.g., the same as) the memory cells 208. Although depicted as traditional transistors, the select gates 210 might also utilize a structure similar to (e.g., the same as) the memory cells 208. The select gates 210 and 212 might each represent a plurality of select gates connected in series, with each select gate in series configured to receive a same or independent control signal. A control gate of each select gate 210 might be connected to select line 214. A control gate of each select gate 212 might be connected to a respective select line 218.

The select gates 210 for each NAND string 206 might be connected in series between its memory cells 208 and an optional GIDL (gate-induced drain leakage) generator gate 220 (e.g., a transistor), such as one of the GIDL generator (GG) gates $\mathbf{220}_0$ to $\mathbf{220}_M$. The GG gates $\mathbf{220}_0$ to $\mathbf{220}_M$ might be referred to as source GG gates. The source GG gates $\mathbf{220}_0$ to $\mathbf{220}_M$ might each be connected (e.g., directly connected) to the source 216, and selectively connected to their respective NAND strings $\mathbf{206}_0$ to $\mathbf{206}_M$. Alternatively, a select gate 210 and its GG gate 220 might represent a single gate, e.g., connected (e.g., directly connected) to the source 216, and connected (e.g., directly connected) to a respective NAND string 206. The select gates 212 of each NAND string 206 might be connected in series between its memory cells 208 and pre-configured select gates 328 such as one of the pre-configured select gates $\mathbf{328}_{00}$ to $\mathbf{328}_{0M}$ and a corresponding one of the pre-configured select gates $\mathbf{328}_{10}$ to $\mathbf{328}_{1M}$. Pre-configured select gates $\mathbf{328}_{00}$ to $\mathbf{328}_{0M}$ might be commonly connected to a select line $\mathbf{330}_0$, such as a select line $SGP_0$. Pre-configured select gates $\mathbf{328}_{10}$ to $\mathbf{328}_{1M}$ might be commonly connected to a select line $\mathbf{330}_1$, such as a select line $SGP_1$. Although depicted as traditional transistors, the pre-configured select gates 328 might utilize a structure similar to (e.g., the same as) the memory cells 208. In addition, fewer or more pre-configured select gates 328 might be utilized in series. For example, where two pre-configured select gates 328 in series might be sufficient for embodiments where M is less than or equal to three, additional pre-configured select gates 328 in series might be utilized for embodiments where M is greater than three. Similarly, where two select gates 212 in series might be sufficient for embodiments where M is less than or equal to three, fewer or more select gates 212 in series might be utilized in various embodiments.

A sub-block of memory cells 240, e.g., sub-blocks of memory cells $\mathbf{240}_0$-$\mathbf{240}_M$, might each include one or more NAND strings 206 having their select gates 212 connected to a same select line 218. A block of memory cells 242 might include each sub-block of memory cells 240 sharing a same set of access lines 202. Each sub-block of memory cells 240 might have one or more respective channel material structures 244, with each channel material structure 244 forming a channel of the select gate 210, the select gate 212, and each memory cell 208 of its respective NAND string 206. For example, the channel material structure $\mathbf{244}_0$ might form a channel for the GG gate $\mathbf{220}_0$, the select gate $\mathbf{210}_0$, the select gate $\mathbf{212}_{00}$, the select gate $\mathbf{212}_{10}$, the pre-configured select gate $\mathbf{328}_{00}$, the pre-configured select gate $\mathbf{328}_{10}$, the GG gate $\mathbf{222}_0$, and each memory cell $\mathbf{208}_0$-$\mathbf{208}_N$ of the NAND string $\mathbf{206}_0$.

Each pre-configured select gate 328 might be configured, e.g., at a time of fabrication, to be either activated or deactivated in response to a control signal having a particular voltage level, e.g., they might be fabricated to have one of two different threshold voltages. Note that this results from a material difference between two pre-configured select gates 328 at a time of fabrication, and is independent of differences in threshold voltage that could result from programming operations performed after fabrication. As will be described in more detail infra, each pre-configured select gate 328 having a control gate connected to a same select line 330 might have either a first threshold voltage (Vt) or a second threshold voltage different than (e.g., lower than) the first threshold voltage. For example, transistors (e.g., select gates 210 and 212, pre-configured select gate 328, GG gates 220 and 222, and memory cells 208) formed along a channel material structure 244 might have a nominal threshold voltage that could be altered by selectively changing a concentration of a dopant impurity in the channel region. For example, doping of the channel region during fabrication might be used to alter, e.g., increase, the threshold voltage of selected pre-configured select gates 328. This doping might be used to form a channel region of a pre-configured select gate 328 to have either a first concentration of the impurity, or a second concentration of the impurity, lower than the first concentration of the impurity, at the time of fabrication. Note that the second concentration of the impurity could be devoid of the dopant impurity, e.g., un-doped. The resulting difference in threshold voltages might facilitate selective programming of select gates 212 selectively connected to a same data line 204 as described infra.

The pre-configured select gates 328 for each NAND string 206 might be connected in series between its select gates 212 and an optional GG gate 222 (e.g., a transistor), such as one of the GG gates $\mathbf{222}_0$ to $\mathbf{222}_M$. The GG gates $\mathbf{222}_0$ to $\mathbf{222}_M$ might be referred to as drain GG gates. The drain GG gates $\mathbf{222}_0$ to $\mathbf{222}_M$ might be connected (e.g., directly connected) to the data line 204, and selectively connected to their respective NAND strings $\mathbf{206}_0$ to $\mathbf{206}_M$. Alternatively, a pre-configured select gate 328 and its GG gate 222 might represent a single gate, e.g., connected (e.g., directly connected) to the data line 204, and connected (e.g., directly connected) to a respective select gate 212.

GG gates $\mathbf{220}_0$ to $\mathbf{220}_M$ might be commonly connected to a control line 224, such as an SGS_GG control line, and GG gates $\mathbf{222}_0$ to $\mathbf{222}_M$ might be commonly connected to a control line 226, such as an SGD_GG control line. Although depicted as traditional transistors, the GG gates 220 and 222 might utilize a structure similar to (e.g., the same as) the memory cells 208. The GG gates 220 and 222 might represent a plurality of GG gates connected in series, with each GG gate in series configured to receive a same or independent control signal. The GG gates 220 and 222 might be provided to assist in the generation of GIDL current into a channel region of their corresponding NAND string 206 during an erase operation, for example, as is well understood in the art.

A source of each GG gate 220 might be connected to common source 216. The drain of each GG gate 220 might be connected to a select gate 210 of the corresponding NAND string 206. For example, the drain of GG gate $\mathbf{220}_0$ might be connected to the source of select gate $\mathbf{210}_0$ of the corresponding NAND string $\mathbf{206}_0$. Therefore, in cooperation, each select gate 210 and GG gate 220 for a corresponding NAND string 206 might be configured to selectively connect that NAND string 206 to common source 216. A control gate of each GG gate 220 might be connected to control line 224.

The drain of each GG gate 222 might be connected to the data line 204 for the corresponding NAND string 206. The source of each GG gate 222 might be connected to a pre-configured select gate 328 of the corresponding NAND string 206. For example, the source of GG gate $\mathbf{222}_0$ might be connected to pre-configured select gate $\mathbf{328}_{10}$ of the corresponding NAND string $\mathbf{206}_0$. Therefore, in cooperation, each select gate 212, pre-configured select gate 328 and GG gate 222 for a corresponding NAND string 206 might be configured to selectively connect that NAND string 206 to the data line 204.

The array of memory cells 300A in FIG. 3A might be a quasi-two-dimensional array of memory cells and might have a generally planar structure, e.g., where the common source 216, NAND strings 206 and data lines 204 extend in substantially parallel planes. Alternatively, the array of memory cells 300A in FIG. 3A might be a three-dimensional array of memory cells, e.g., where NAND strings 206 might extend substantially perpendicular to a plane containing the common source 216 and to a plane containing the data lines 204 that might be substantially parallel to the plane containing the common source 216.

Typical construction of memory cells 208 includes a data-storage structure 236 (e.g., a floating gate, charge trap, or other structure configured to store charge) that can determine a data state of the memory cell (e.g., through changes in threshold voltage), and a control gate 238, as shown in FIG. 3A. The data-storage structure 236 might include both conductive and dielectric structures while the control gate 238 is generally formed of one or more conductive materials. In some cases, memory cells 208 might further have a defined source/drain (e.g., source) 232 and a defined source/drain (e.g., drain) 234. Memory cells 208 have their control gates 238 connected to (and in some cases form) an access line 202.

A column of the memory cells 208 might be a NAND string 206 or a plurality of NAND strings 206 selectively connected to a given data line 204. A row of the memory cells 208 might be memory cells 208 commonly connected to a given access line 202. A row of memory cells 208 can, but need not, include all memory cells 208 commonly connected to a given access line 202. Rows of memory cells 208 might often be divided into one or more groups of physical pages of memory cells 208, and physical pages of memory cells 208 often include every other memory cell 208 commonly connected to a given access line 202. Other groupings of memory cells 208 commonly connected to a given access line 202 might also define a physical page of memory cells 208. For certain memory devices, all memory cells commonly connected to a given access line 202 might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells 242 might include those memory cells that are configured to be erased together, such as all memory cells connected to access lines $\mathbf{202}_0$-$\mathbf{202}_N$ (e.g., all NAND strings 206 sharing a common set of access lines 202). Unless expressly distinguished, any reference to a page of memory cells herein refers to the memory cells of a logical page of memory cells.

Figure 3B:
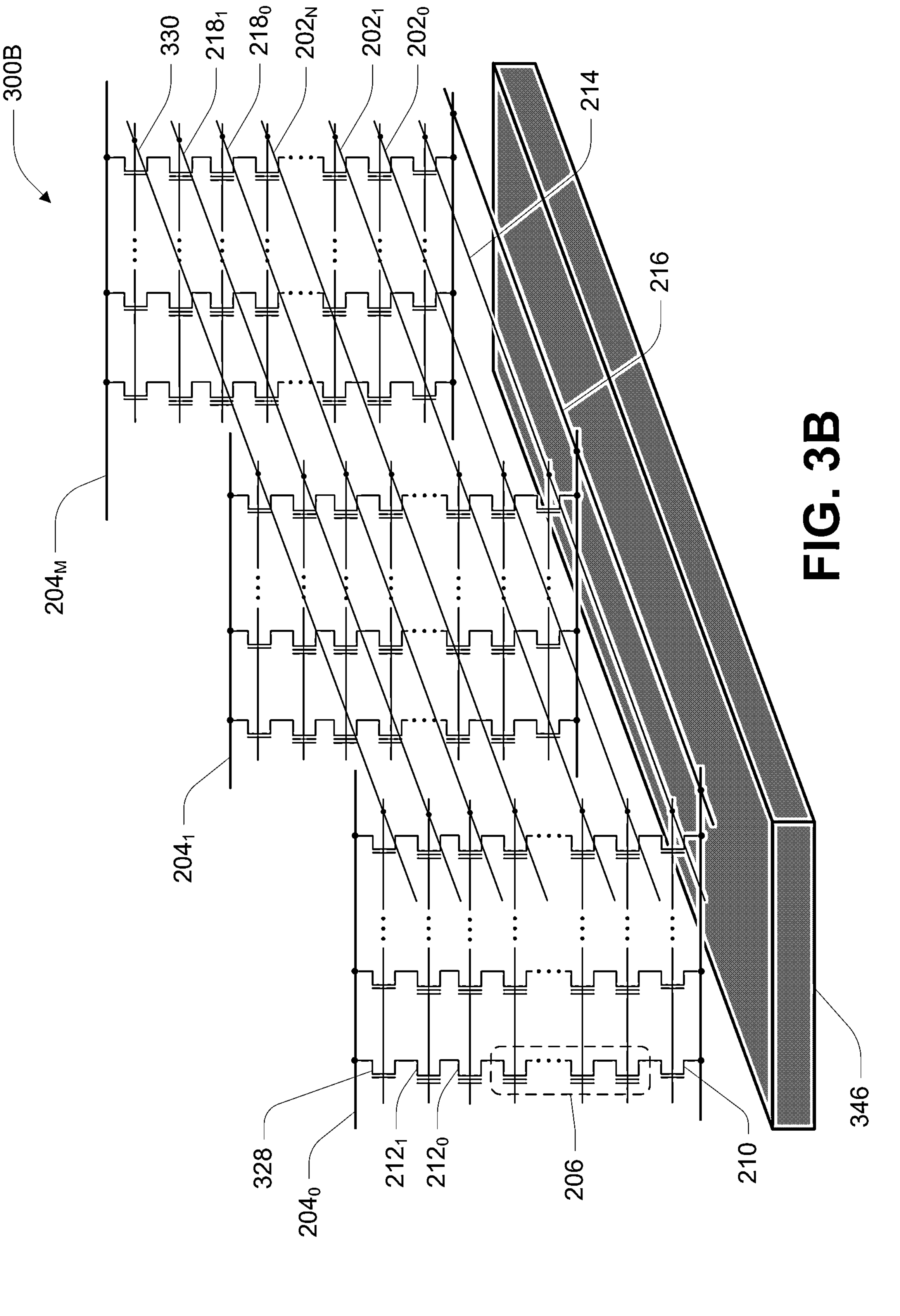

FIG. 3B is another schematic of a portion of an array of memory cells 300B as could be used in a memory of the type described with reference to FIG. 1, e.g., as a portion of array of memory cells 104. Like numbered elements in FIG. 3B correspond to the description as provided with respect to FIG. 3A. FIG. 3B provides additional detail of one example of a three-dimensional NAND array of memory cells structure. The three-dimensional NAND array of memory cells 300B might incorporate vertical structures which might include semiconductor pillars where a portion of a pillar might act as a body and a channel region of the memory cells of NAND strings 206, e.g., the channel material structure 244. The NAND strings 206 might be each selectively connected to a data line $\mathbf{204}_0$-$\mathbf{204}_M$ by respective select gates $\mathbf{212}_0$ and $\mathbf{212}_1$ and to a common source 216 by a respective select gate 210. For clarity, GG gates 220 and 222, as well as some pre-configured select gates 328, are not depicted in FIG. 3B.

Multiple NAND strings 206 might be selectively connected to the same data line 204. In the example of FIG. 3B, subsets of NAND strings 206 can be connected to their respective data lines 204 by biasing the select lines $\mathbf{218}_0$ and $\mathbf{218}_1$ to selectively activate particular select gates 212 each between a NAND string 206 and a data line 204. The select gates 210 can be activated by biasing the select line 214. Each access line 202 might be connected to multiple rows of memory cells of the array of memory cells 300B. Rows of memory cells that are commonly connected to each other by a particular access line 202 might collectively be referred to as tiers.

The three-dimensional NAND array of memory cells 300B might be formed over peripheral circuitry 346. The peripheral circuitry 346 might represent a variety of circuitry for accessing the array of memory cells 300B. The peripheral circuitry 346 might include complementary circuit elements. For example, the peripheral circuitry 346 might include both n-channel and p-channel transistors formed on a same semiconductor substrate, a process commonly referred to as CMOS, or complementary metal-oxide-semiconductors. Although CMOS often no longer utilizes a strict metal-oxide-semiconductor construction due to advancements in integrated circuit fabrication and design, the CMOS designation remains as a matter of convenience.

Figure 3C:
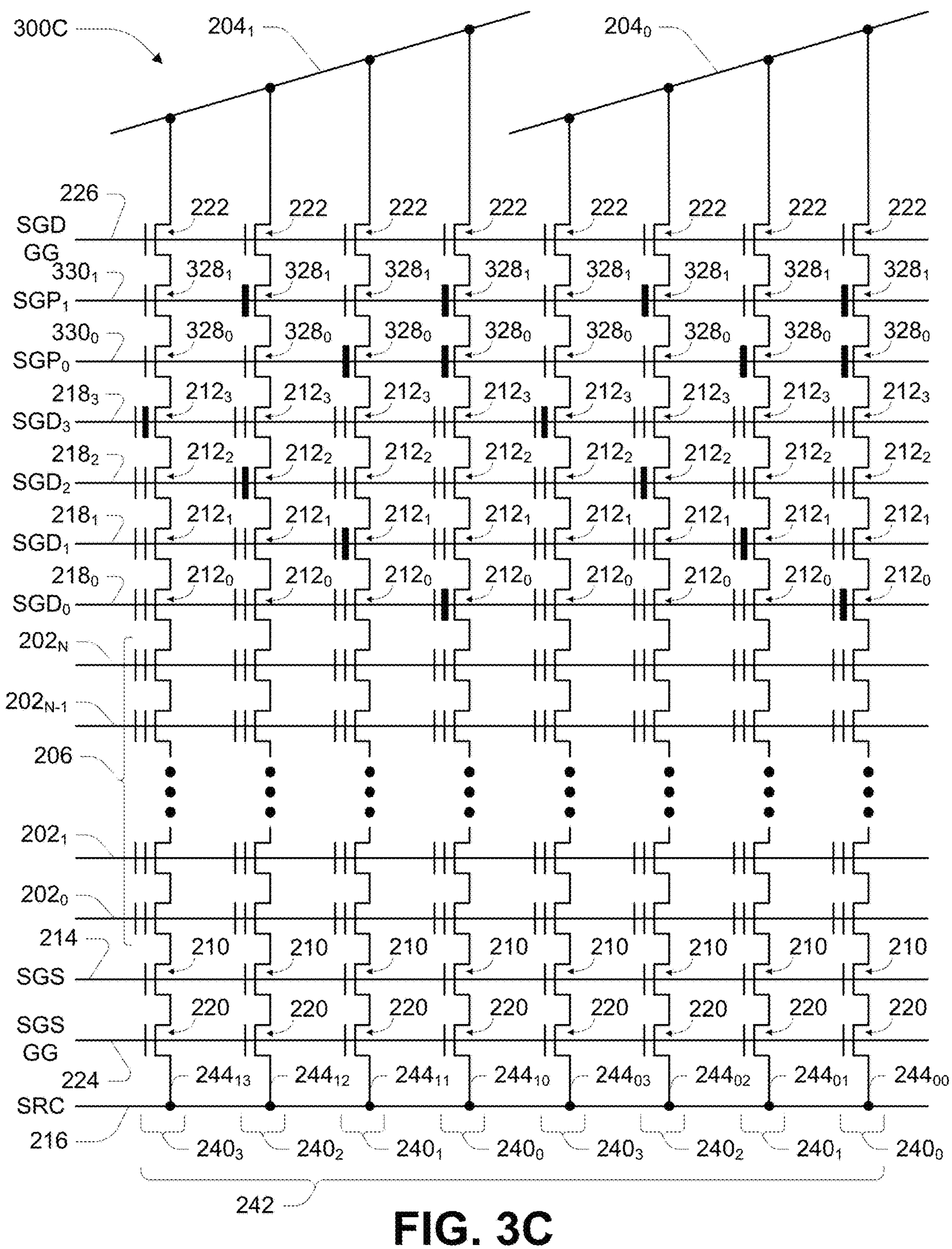

FIG. 3C is another schematic of a portion of an array of memory cells 300C as could be used in a memory of the type described with reference to FIG. 1, e.g., as a portion of array of memory cells 104. Like numbered elements in FIG. 3C correspond to the description as provided with respect to FIG. 3A. FIG. 3C provides detail of one example of an array structure having more than two sub-blocks of memory cells 240.

In the array of memory cells 300C of FIG. 3C, NAND strings 206 of four different sub-blocks of memory cells $\mathbf{240}_0$-$\mathbf{240}_3$ are each selectively connected to one of the data lines $\mathbf{204}_0$-$\mathbf{204}_1$. For example, the NAND strings 206 corresponding to channel material structures $\mathbf{244}_{00}$-$\mathbf{244}_{03}$ might each be selectively connected to the data line $\mathbf{204}_0$ through a respective set of select gates $\mathbf{212}_0$-$\mathbf{212}_3$, a respective set of pre-configured select gates $\mathbf{328}_0$-$\mathbf{328}_1$, and a respective GG gate 222. Similarly, the NAND strings 206 corresponding to channel material structures $\mathbf{244}_{10}$-$\mathbf{244}_{13}$ might each be selectively connected to the data line $\mathbf{204}_1$ through a respective set of select gates $\mathbf{212}_0$-$\mathbf{212}_3$, a respective set of pre-configured select gates $\mathbf{328}_0$-$\mathbf{328}_1$, and a respective GG gate 222.

In general, an array structure for a given block of memory cells 242 might include a number of select gates 212 between each NAND string 206 and a data line 204 that is equal to or greater than a number of sub-blocks of memory cells 240 of that block of memory cells 242. In addition, an array structure for a given block of memory cells 242 might include a number of pre-configured select gates 328 that is an integer value X such that 2ˆX is equal to or greater than the number of sub-blocks of memory cells 240 of that block of memory cells 242. For example, if there are two sub-blocks of memory cells 240 in a block of memory cells 242, the number of pre-configured select gates 328 might be 1 (or more) as 2ˆ1 is equal to 2. Similarly, if there are four sub-blocks of memory cells 240 in a block of memory cells 242, the number of pre-configured select gates 328 might be 2 (or more) as 2ˆ2 is equal to 4. Although numbers of sub-blocks of memory cells 240 being some power of 2 generally might be preferred, embodiments can be adapted to a number of sub-blocks of memory cells 240 being other than some power of 2. For example, if there are three sub-blocks of memory cells 240 in a block of memory cells 242, the number of pre-configured select gates 328 might be 2 (or more) as 2ˆ2 is greater than 3.

To connect a NAND string 206 for one sub-block of memory cells 240 to its data line 204 without connecting NAND strings 206 of other sub-blocks of memory cells 240 to that data line 204, the select gates 212 might be programmed to be either activated or deactivated in response to a control signal having a particular voltage level, e.g., they might be programmed to have one of two different threshold voltages. As will be described in more detail infra, each select gate 212 having a control gate connected to a same select line 218 might have either a first threshold voltage (Vt) or a second threshold voltage different than (e.g., lower than) the first threshold voltage. For example, for the select gates 212 having control gates connected to a given select line 218, those select gates 212 corresponding to one of the sub-blocks of memory cells 240 might be programmed to have a positive threshold voltage while the remaining select gates 212 having control gates connected to that select line 218 (e.g., corresponding to the remaining sub-blocks of memory cells 240) might remain unprogrammed and have a negative threshold voltage. Alternatively, for the select gates 212 having control gates connected to a given select line 218, those select gates 212 corresponding to one of the sub-blocks of memory cells 240 might be programmed to have a particular threshold voltage while the remaining select gates 212 having control gates connected to that select line 218 (e.g., corresponding to the remaining sub-blocks of memory cells 240) might be programmed and have a different, lower, threshold voltage. This configuration will be described by example with reference to the array of memory cells 300C.

In the array of memory cells 300C, the select gates $\mathbf{212}_3$ connected to the select line $\mathbf{218}_3$ and corresponding to the sub-block of memory cells $\mathbf{240}_3$ might be programmed to have threshold voltages higher that each remaining select gate $\mathbf{212}_3$ connected to the select line $\mathbf{218}_3$ and corresponding to the sub-blocks of memory cells $\mathbf{240}_0$-$\mathbf{240}_2$. This is indicated by the thick black data storage structures of the select gates $\mathbf{212}_3$ corresponding to the channel material structures $\mathbf{244}_{13}$ and $\mathbf{244}_{03}$. In a like manner, the select gates $\mathbf{212}_2$ connected to the select line $\mathbf{218}_2$ and corresponding to the sub-block of memory cells $\mathbf{240}_2$ might be programmed to have threshold voltages higher that each remaining select gate $\mathbf{212}_2$ connected to the select line $\mathbf{218}_2$ and corresponding to the sub-blocks of memory cells $\mathbf{240}_0$, $\mathbf{240}_1$ and $\mathbf{240}_3$; the select gates $\mathbf{212}_1$ connected to the select line $\mathbf{218}_1$ and corresponding to the sub-block of memory cells $\mathbf{240}_1$ might be programmed to have threshold voltages higher that each remaining select gate $\mathbf{212}_1$ connected to the select line $\mathbf{218}_1$ and corresponding to the sub-blocks of memory cells $\mathbf{240}_0$, $\mathbf{240}_2$ and $\mathbf{240}_3$; and the select gates $\mathbf{212}_0$ connected to the select line $\mathbf{218}_0$ and corresponding to the sub-block of memory cells $\mathbf{240}_0$ might be programmed to have threshold voltages higher that each remaining select gate $\mathbf{212}_0$ connected to the select line $\mathbf{218}_0$ and corresponding to the sub-blocks of memory cells $\mathbf{240}_1$-$\mathbf{240}_3$.

Programming of select gates 212 might utilize an iterative process of applying a programming pulse to a programmable transistor and verifying if that transistor has reached a desired threshold voltage in response to that programming pulse, and repeating that iterative process until that transistor passes the verification. Alternatively, programming of select gates 212 might utilize a single programming pulse having a voltage level configured to increase the threshold voltage above some particular voltage level, e.g., above a voltage level to be used to activate an unprogrammed select gate 212 and deactivate a programmed select gate 212. A voltage level of a programming pulse sufficient to increase the threshold voltage of any select gate 212 above the particular voltage level might, for example, be determined experimentally, empirically or through simulation.

If the select gates $\mathbf{212}_3$ corresponding to the sub-block of memory cells $\mathbf{240}_3$, the select gates $\mathbf{212}_2$ corresponding to the sub-block of memory cells 240$_2$, the select gates 212$_1$ corresponding to the sub-block of memory cells 240$_1$, and the select gates 212$_0$ corresponding to the sub-block of memory cells 240$_0$, are programmed to have positive threshold voltages, e.g., 3V, and the remaining select gates 212 have negative threshold voltages, e.g., −1V, a control signal of 5V applied to the select line 218$_3$ and control signals of 0V applied to the select lines 218$_0$, 218$_1$ and 218$_2$ could be used to connect the NAND strings 206 of the sub-block of memory cells 240$_3$ to the data lines 204$_0$ and 204$_1$, and to isolate the NAND strings 206 of the sub-blocks of memory cells 240$_0$, 240$_1$ and 240$_2$ from the data lines 204$_0$ and 204$_1$. Similarly, a control signal of 5V applied to the select line 218$_2$ and control signals of 0V applied to the select lines 218$_0$, 218$_1$ and 218$_3$ could be used to connect the NAND strings 206 of the sub-block of memory cells 240$_2$ to the data lines 204$_0$ and 204$_1$, and to isolate the NAND strings 206 of the sub-blocks of memory cells 240$_0$, 240$_1$ and 240$_3$ from the data lines 204$_0$ and 204$_1$. Likewise, a control signal of 5V applied to the select line 218$_1$ and control signals of 0V applied to the select lines 218$_0$, 218$_2$ and 218$_3$ could be used to connect the NAND strings 206 of the sub-block of memory cells 240$_1$ to the data lines 204$_0$ and 204$_1$, and to isolate the NAND strings 206 of the sub-blocks of memory cells 240$_0$, 240$_2$ and 240$_3$ from the data lines 204$_0$ and 204$_1$. Furthermore, a control signal of 5V applied to the select line 218$_0$ and control signals of 0V applied to the select lines 218$_1$, 218$_2$ and 218$_3$ could be used to connect the NAND strings 206 of the sub-block of memory cells 240$_0$ to the data lines 204$_0$ and 204$_1$, and to isolate the NAND strings 206 of the sub-blocks of memory cells 240$_1$, 240$_2$ and 240$_3$ from the data lines 204$_0$ and 204$_1$.

Selective programming of the select gates 212 might be facilitated by the pre-configured select gates 328. For example, the pre-configured select gates 328 corresponding to each sub-block of memory cells 240 might have a respective binary permutation of two (e.g., high and low) threshold voltages. For example, assigning the high and low threshold voltages as corresponding to binary values 1 and 0, respectively, a set of pre-configured select gates 328$_0$ and 328$_1$ can have one of four different binary permutations, e.g., 00 (e.g., low-low), 01 (e.g., low-high), 10 (e.g., high-low), and 11 (e.g., high-high). High threshold voltages are indicated by the thick black control gates of the pre-configured select gates 328. In the example of FIG. 3C, the pre-configured select gates 328$_0$ and 328$_1$ corresponding to the sub-block of memory cells 240$_0$ both have high (e.g., positive) threshold voltages, the pre-configured select gates 328$_0$ and 328$_1$ corresponding to the sub-block of memory cells 240$_1$ have high (e.g., positive) and low (e.g., negative) threshold voltages, respectively, the pre-configured select gates 328$_0$ and 328$_1$ corresponding to the sub-block of memory cells 240$_2$ have low (e.g., negative) and high (e.g., positive) threshold voltages, respectively, and the pre-configured select gates 328$_0$ and 328$_1$ corresponding to the sub-block of memory cells 240$_3$ both have low (e.g., negative) threshold voltages. The binary permutations of two threshold voltages of the pre-configured select gates 328 for each sub-block of memory cells 240 are mutually exclusive, e.g., the binary permutation of two threshold voltages for one sub-block of memory cells 240 of a block of memory cells 242 is different than the binary permutation of two threshold voltages for each remaining sub-block of memory cells 240 of that block of memory cells 242.

Note that determining a binary permutation of two threshold voltages, as used herein, looks to each transistor individually as to its possible threshold voltages when assigning a binary value to that transistor. Consider the example where the binary value 1 is assigned to the higher of two possible threshold voltages for a transistor, and the binary value 0 is assigned to the lower of two possible threshold voltages for that transistor. If a pre-configured select gate 328$_0$ could be assigned a first threshold voltage or a second threshold voltage higher than the first threshold voltage, and a pre-configured select gate 328$_1$ could be assigned a third threshold voltage or a fourth threshold voltage higher than the third threshold voltage, the pre-configured select gate 328$_0$ would be assigned the binary value 0 if it was assigned the first threshold voltage and would be assigned the binary value 1 if it was assigned the second threshold voltage, and the pre-configured select gate 328$_1$ would be assigned the binary value 0 if it was assigned the third threshold voltage and would be assigned the binary value 1 if it was assigned the fourth threshold voltage, regardless of whether the first threshold voltage and the third threshold voltage were equal, and regardless of whether the second threshold voltage and the fourth threshold voltage were equal. Thus, for a set of transistors, the threshold voltage for each transistor relative to its two possible states (e.g., low or high for that transistor) is controlling in determining the binary permutation of two threshold voltages for that set of transistors, regardless of the actual values of the possible threshold voltages for each of the transistors.

To program the select gates 212$_3$ corresponding to the sub-block of memory cells 240$_3$, the select gates 210 might be deactivated, the GG gates 222 might be activated, and control signals might be applied to the select lines 330$_0$ and 330$_1$ that are configured to activate those pre-configured select gates 328 having the low threshold voltage, and to deactivate those pre-configured select gates 328 having the high threshold voltage. A reference potential, e.g., $V_{SS}$, ground or 0V, might be applied to the data lines 204. In this manner, the select gates 212$_3$ corresponding to the sub-block of memory cells 240$_3$, might be connected to their respective data line 204 and be enabled for programming, while the select gates 212$_3$ corresponding to the remaining sub-blocks of memory cells 240$_0$, 240$_1$ and 240$_2$ might be isolated from their respective data lines 204 and prohibited from programming by having the channel potential boosted to reduce a potential difference between the select line 218$_3$ and the channel. As such, by applying a programming voltage signal to the select line 218$_3$ sufficient to increase the threshold voltages of the select gates 212$_3$ corresponding to the sub-block of memory cells 240$_3$, and applying voltage signals to remaining select lines 218$_0$, 218$_1$ and 218$_2$, as well as to the access lines 202$_0$-202$_N$, that are configured to inhibit an increase in threshold voltage of the other select gates 212$_0$, 212$_1$ and 212$_2$, and the memory cells 208, the select gates 212$_3$ corresponding to the sub-block of memory cells 240$_3$ might be programmed to have the high threshold voltage without programming other select gates 212$_3$.

To program the select gates 212$_2$ corresponding to the sub-block of memory cells 240$_2$, the select gates 210 might be deactivated, and the GG gates 222 might be activated. A control signal might be applied to the select line 330$_0$ that is configured to activate those pre-configured select gates 328 having the low threshold voltage, and to deactivate those pre-configured select gates 328 having the high threshold voltage. A control signal might be applied to the select line 330$_1$ that is configured to activate pre-configured select gates 328 having the low threshold voltage and to activate pre-configured select gates 328 having the high threshold voltage. A control signal might be applied to the select line 218$_3$ that is configured to activate those select gates 212$_3$ having the low threshold voltage, and to deactivate those select gates $212_3$ having the high threshold voltage. A reference potential, e.g., $V_{SS}$, ground or 0V, might be applied to the data lines 204. In this manner, the select gates $212_2$ corresponding to the sub-block of memory cells $240_2$, might be connected to their respective data line 204 and be enabled for programming, while the select gates $212_2$ corresponding to the remaining sub-blocks of memory cells $240_0$, $240_1$ and $240_3$ might be isolated from their respective data lines 204 and prohibited from programming. Note that although the pre-configured select gates 328 corresponding to the sub-block of memory cells $240_3$ would be activated, the deactivation of the select gates $212_3$ corresponding to the sub-block of memory cells $240_3$ might serve to isolate their corresponding select gates $212_2$ from a data line 204. As such, by applying a programming voltage signal to the select line $218_2$ sufficient to increase the threshold voltages of the select gates $212_2$ corresponding to the sub-block of memory cells $240_2$, and applying voltage signals to remaining select lines $218_0$, $218_1$ and $218_3$, as well as to the access lines $202_0$-$202_N$, that are configured to inhibit an increase in threshold voltage of the other select gates $212_0$, $212_1$ and $212_3$, and the memory cells 208, the select gates $212_2$ corresponding to the sub-block of memory cells $240_2$ might be programmed to have the high threshold voltage without programming other select gates $212_2$.

To program the select gates $212_1$ corresponding to the sub-block of memory cells $240_1$, the select gates 210 might be deactivated, and the GG gates 222 might be activated. A control signal might be applied to the select line $330_0$ that is configured to activate pre-configured select gates 328 having the low threshold voltage and to activate pre-configured select gates 328 having the high threshold voltage. A control signal might be applied to the select line $330_1$ that is configured to activate those pre-configured select gates 328 having the low threshold voltage, and to deactivate those pre-configured select gates 328 having the high threshold voltage. A control signal might be applied to the select lines $218_3$ and $218_2$ that are configured to activate those select gates $212_3$ and $212_2$, respectively, having the low threshold voltage, and to deactivate those select gates $212_3$ and $212_2$, respectively, having the high threshold voltage. A reference potential, e.g., $V_{SS}$, ground or 0V, might be applied to the data lines 204. In this manner, the select gates $212_1$ corresponding to the sub-block of memory cells $240_1$, might be connected to their respective data line 204 and be enabled for programming, while the select gates $212_1$ corresponding to the remaining sub-blocks of memory cells $240_0$, $240_2$ and $240_3$ might be isolated from their respective data lines 204 and prohibited from programming. Note that although the pre-configured select gates 328 corresponding to the sub-block of memory cells $240_3$ would both be activated, the deactivation of the select gates $212_3$ corresponding to the sub-block of memory cells $240_3$ might serve to isolate their corresponding select gates $212_1$ from a data line 204. As such, by applying a programming voltage signal to the select line $218_1$ sufficient to increase the threshold voltages of the select gates $212_1$ corresponding to the sub-block of memory cells $240_1$, and applying voltage signals to remaining select lines $218_0$, $218_2$ and $218_3$, as well as to the access lines $202_0$-$202_N$, that are configured to inhibit an increase in threshold voltage of the other select gates $212_0$, $212_2$ and $212_3$, and the memory cells 208, the select gates $212_1$ corresponding to the sub-block of memory cells $240_1$ might be programmed to have the high threshold voltage without programming other select gates $212_1$.

To program the select gates $212_0$ corresponding to the sub-block of memory cells $240_0$, the select gates 210 might be deactivated, and the GG gates 222 might be activated. A control signal might be applied to the select lines $330_0$ and $330_1$ that are configured to activate pre-configured select gates 328 having the low threshold voltage and to activate pre-configured select gates 328 having the high threshold voltage. A control signal might be applied to the select lines $218_3$, $218_2$ and $218_1$ that are configured to activate those select gates $212_3$, $212_2$ and $212_1$, respectively, having the low threshold voltage, and to deactivate those select gates $212_3$, $212_2$ and $212_1$, respectively, having the high threshold voltage. A reference potential, e.g., $V_{SS}$, ground or 0V, might be applied to the data lines 204. In this manner, the select gates $212_0$ corresponding to the sub-block of memory cells $240_0$, might be connected to their respective data line 204 and be enabled for programming, while the select gates $212_0$ corresponding to the remaining sub-blocks of memory cells $240_1$, $240_2$ and $240_3$ might be isolated from their respective data lines 204 and prohibited from programming. Note that although the pre-configured select gates 328 corresponding to the sub-block of memory cells $240_3$, $240_2$ and $240_1$ would all be activated, the deactivation of the select gates $212_3$, $212_2$ and $212_1$ corresponding to the sub-blocks of memory cells $240_3$, $240_2$ and $240_1$, respectively, might serve to isolate their corresponding select gates $212_0$ from a data line 204. As such, by applying a programming voltage signal to the select line $218_0$ sufficient to increase the threshold voltages of the select gates $212_0$ corresponding to the sub-block of memory cells $240_0$, and applying voltage signals to remaining select lines $218_1$, $218_2$ and $218_3$, as well as to the access lines $202_0$-$202_N$, that are configured to inhibit an increase in threshold voltage of the other select gates $212_1$, $212_2$ and $212_3$, and the memory cells 208, the select gates $212_0$ corresponding to the sub-block of memory cells $240_0$ might be programmed to have the high threshold voltage without programming other select gates $212_0$.

Figure 4A:
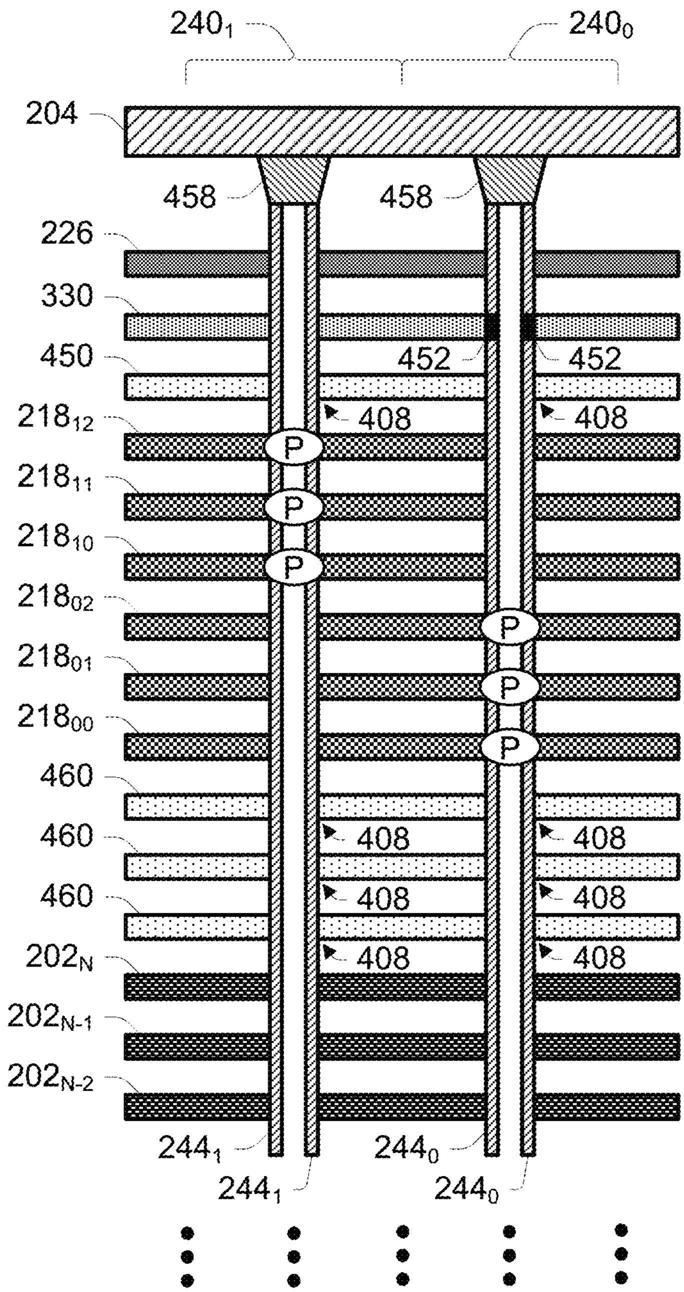
FIG. 4A depicts a conceptualized representation of a cross-sectional view of a portion of an array structure in accordance with an embodiment as could be used in a memory of the type described with reference to FIG. 1.

FIG. 4A depicts a conceptualized representation of a cross-sectional view of a portion of an array structure in accordance with an embodiment as could be used in a memory of the type described with reference to FIG. 1. Like numbered elements in FIG. 4A correspond to the description as provided with respect to FIG. 3A. FIG. 4A depicts an array structure that could be used in cases where a block of memory cells contains two sub-blocks of memory cells. The structure of FIG. 4A further depicts the inclusion of dummy select lines 450 and dummy select lines 460. Dummy select lines 450 could be used in any embodiment to optionally mitigate E-field and reduce program disturb between the transistors connected to select lines 218, and the transistors connected to adjacent select line 330. Dummy select lines 460 could be used in any embodiment to optionally mitigate E-field and reduce program disturb between the transistors connected to select lines 218, and the transistors connected to adjacent access lines 202. Transistors 408 formed at intersections of a channel material structure 244 and dummy select lines 450 and 460 might utilize a structure similar to (e.g., the same as) the memory cells 208 of FIG. 3A. Although various structures referred to in the discussion of FIG. 4A and subsequent figures might not be explicitly depicted therein, e.g., pre-configured select gates 328, their location will be apparent in context, and/or by referencing figures in which they were first introduced.

In FIG. 4A, the channel material structures $244_0$-$244_1$ are depicted to be hollow channel material structures. Alternatively, the channel material structures $244_0$-$244_1$ could be solid structures. The channel material structure $244_0$ might belong to a first sub-block of memory cells 240$_0$ of a block of memory cells, while the channel material structure 244$_1$ might belong to a second sub-block of memory cells 240$_1$ of that block of memory cells. As such, the pre-configured select gate 328 connected to the select line 330 and formed at an intersection with the channel material structure 244$_0$ might have a first threshold voltage, while the pre-configured select gate 328 connected to the select line 330 and formed at an intersection with the channel material structure 244$_1$ might have a second threshold voltage different than (e.g., lower than) the first threshold voltage. This might be accomplished by forming a doped section 452 in the channel material structure 244$_0$ to increase the threshold voltage of the corresponding transistor (e.g., pre-configured select gate 328) formed at the intersection of the select line 330 with the channel material structure 244$_0$. The doped section 452 might contain an impurity configured to increase a threshold voltage of the corresponding transistor. As an example, the impurity might comprise boron as a dopant material. Although the channel material structures 244$_0$ and 244$_1$ are depicted to be immediately adjacent one another, there may be intervening channel material structures 244 not connected to the data line 204, as will be depicted in FIG. 4D. Similarly, although FIG. 4A depicts only two sub-blocks of memory cells 240, a block of memory cells might include other numbers of sub-blocks of memory cells 240.

Following fabrication, one or more select gates 212 formed at intersections between the channel material structure 244$_1$ and the select lines 218$_{10}$-218$_{12}$ might be programmed (indicated with the label "P" at the intersection) to have a programmed threshold voltage higher than an initial (e.g., erased) threshold voltage. Subsequently, one or more select gates 212 formed at intersections between the channel material structure 244$_0$ and the select lines 218$_{00}$-218$_{02}$ might be programmed to have a programmed threshold voltage higher than an initial (e.g., erased) threshold voltage. Table 1 presents voltages for various nodes of FIG. 4A during the two stages of programming.

TABLE 1

| | Node | |
|---|---|---|
| Sub-Block | $240_1$ | $240_0$ |
| 204 | $V_{EN}$ (0 V) | $V_{EN}$ (0 V) |
| 226 | $V_{PASS}$ | $V_{PASS}$ |
| 330 | $V_{SGP\_LOW}$ | $V_{PASS}$ |
| 450 | $V_{PASS}$ | $V_{PASS}$ |
| $218_{10}$-$218_{12}$ | $V_{PGM}$ | $V_{SGD\_LOW}$ |
| $218_{00}$-$218_{02}$ | $V_{PASS}$ | $V_{PGM}$ |

It is noted that voltages to be applied to dummy select lines 460 as well as other nodes between the dummy select lines 460 and a common source, e.g., access lines 202, dummy access lines, select lines 214, control lines 224, etc., might take any approach configured to inhibit programming of those transistors. For example, all of these nodes could receive the pass voltage $V_{PASS}$ to inhibit program disturb of corresponding transistors connected to the data line 204. Alternatively, the dummy select lines 460 could receive a gradient of voltage levels configured to inhibit program disturb of corresponding transistors closest to the select lines 218, while cutting off transistors (e.g., memory cells) corresponding to the access lines 202 from the data line 204 to inhibit their programming.

As depicted in Table 1, the data line 204 might receive an enable voltage $V_{EN}$ configured to enable programming of a programmable transistor connected to the data line. As one example, the enable voltage $V_{EN}$ might be a reference potential, e.g., 0V, ground or $V_{SS}$. The SGD_GG control line 226 might receive a pass voltage $V_{PASS}$ configured to activate its corresponding transistors, e.g., the GG gates 222. The select line 330 might receive a first voltage level $V_{SGP\_LOW}$ configured to deactivate pre-configured select gate 328 having the first threshold voltage, and to activate pre-configured select gate 328 having the second threshold voltage lower than the first threshold voltage. As such, the first voltage level $V_{SGP\_LOW}$ might activate pre-configured select gate 328 at the intersection of the select line 330 and the channel material structure 244$_1$, and deactivate pre-configured select gate 328 at the intersection of the select line 330 and the channel material structure 244$_0$. The dummy select line 450 might receive the pass voltage $V_{PASS}$ configured to activate all of its corresponding transistors. In this manner, select gates 212 at intersections of the select lines 218 and the channel material structure 244$_1$ might be connected to the data line 204 and enabled for programming, while the select gates 212 at intersections of the select lines 218 and the channel material structure 244$_0$ might be isolated from the data line 204 and inhibited from programming. As such, upon application of a programming voltage VPGM (e.g., a voltage level configured to increase a threshold voltage of a programmable transistor enabled for programming) to the select lines 218$_{10}$-218$_{12}$, those transistors corresponding to the channel material structure 244$_1$ might be programmed to have a higher threshold voltage, while those transistors corresponding to the channel material structure 244$_0$ might be inhibited from programming and remain at their initial, e.g., erased, threshold voltage.

Following the programming of the select gates 212 corresponding to the select lines 218$_{10}$-218$_{12}$, select gates 212 corresponding to the select lines 218$_{00}$-218$_{02}$ might be programmed. In particular, the data line 204 might receive the enable voltage $V_{EN}$. The SGD_GG control line 226 might receive the pass voltage $V_{PASS}$ configured to activate its corresponding transistors, e.g., the GG gates 222. The select line 330 might receive the pass voltage $V_{PASS}$ configured to activate all of its corresponding pre-configured select gates 328, regardless of their threshold voltages. The dummy select line 450 might receive the pass voltage $V_{PASS}$ configured to activate all of its corresponding transistors. The select lines 218$_{10}$-218$_{12}$ might receive a voltage $V_{SGD\_LOW}$ configured to deactivate the select gates 212 having the higher threshold voltage and to activate the select gates 212 having the lower threshold voltage. In this manner, select gates 212 at intersections of the select lines 218$_{00}$-218$_{02}$ and the channel material structure 244$_0$ might be connected to the data line 204 and enabled for programming, while the select gates 212 at intersections of the select lines 218$_{00}$-218$_{02}$ and the channel material structure 244$_1$ might be isolated from the data line 204 and inhibited from programming. As such, upon application of the programming voltage VPGM to the select lines 218$_{00}$-218$_{02}$, those transistors corresponding to the channel material structure 244$_0$ might be programmed to have the higher threshold voltage, while those transistors corresponding to the channel material structure 244$_1$ might be inhibited from programming and remain at their initial, e.g., erased, threshold voltage.

As one example, the first threshold voltage of the pre-configured select gates 328 might be 3V while the second threshold voltage of the pre-configured select gates 328 might be −1V. To continue the example, the programmed threshold voltage of the select gates 212 might be 4V and the initial threshold voltage might be −1V. In this example, $V_{SGP\_LOW}$ and $V_{SGD\_LOW}$ might be 1V, $V_{PASS}$ might be 7V, and VPGM might be 18V. Alternatively, all select gates 212 at the intersections of the select lines 218 and the channel material structures 244$_0$-244$_1$ might be programmed to a positive threshold voltage, e.g., 2V, as their initial threshold voltage prior to programming of the select gates 212 by sub-blocks of memory cells as described. In such an embodiment, $V_{SGD\_LOW}$ might be increased to 3V, for example.

Programming of select gates 212 might utilize an iterative process of applying a programming pulse to a programmable transistor and verifying if that transistor has reached a desired threshold voltage in response to that programming pulse, and repeating that iterative process until that transistor passes the verification. Alternatively, programming of select gates 212 might utilize a single programming pulse having a voltage level configured to increase the threshold voltage above some particular voltage level, e.g., above a voltage level to be used to activate an unprogrammed select gate 212 and deactivate a programmed select gate 212. A voltage level of a programming pulse sufficient to increase the threshold voltage of any select gate 212 above the particular voltage level might, for example, be determined experimentally, empirically or through simulation. When programming using an iterative process, select gates 212 might be programmed sequentially as is typical, e.g., applying increasing programming voltage levels to select line 218$_{10}$ until passing a verify operation, then applying increasing programming voltage levels to select line 218$_{11}$ until passing a verify operation, then applying increasing programming voltage levels to select line 218$_{12}$ until passing a verify operation. Alternatively, programming select gates 212 using an iterative process might be performed concurrently, e.g., applying increasing programming voltage levels to select lines 218$_{10}$, 218$_{11}$, and 218$_{12}$ concurrently until passing a verify operation while a verify voltage is applied to each of the select lines 218$_{10}$, 218$_{11}$, and 218$_{12}$, indicating that each of the select gates 212 has a threshold voltage above the verify voltage.

Figure 4B:
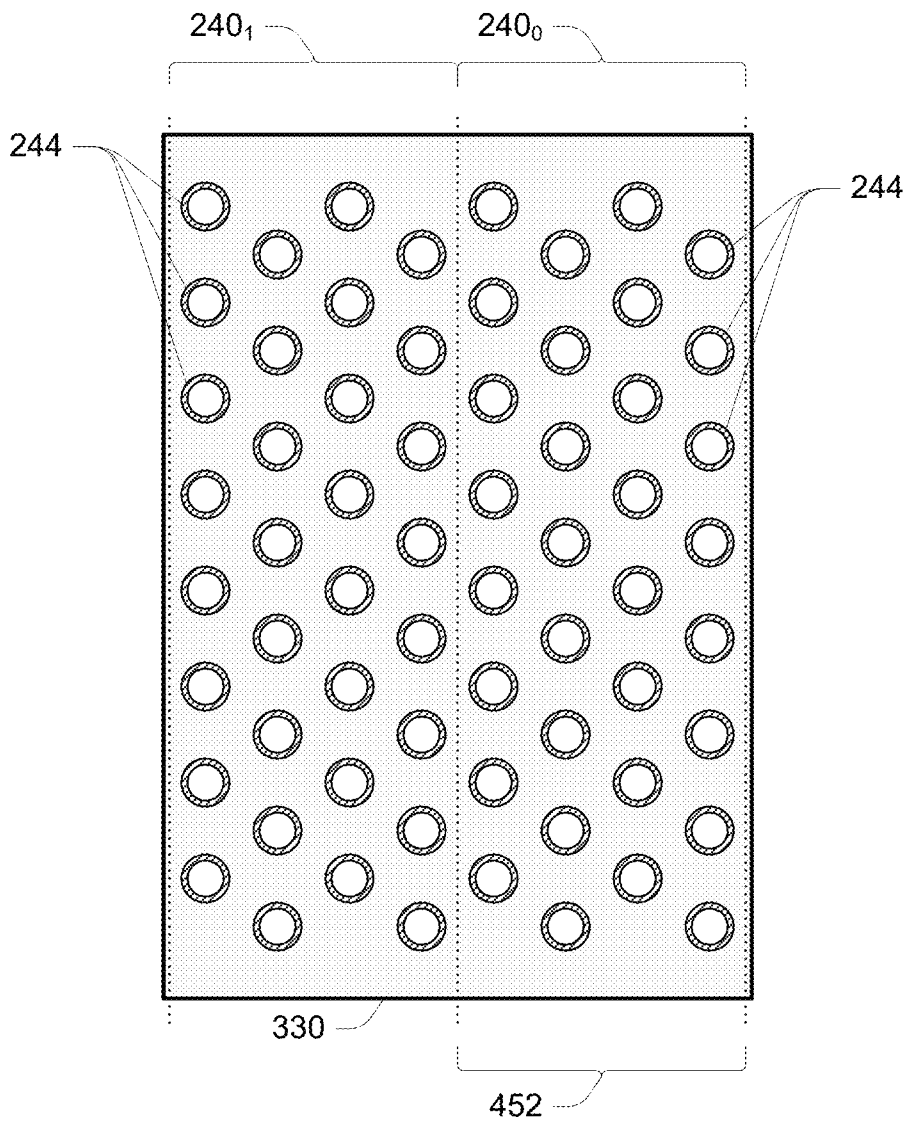
FIGS. 4B-4C depict representations of top views of a section of an array of memory cells including a structure of a type similar to that depicted in FIG. 4A.
Figure 4C:
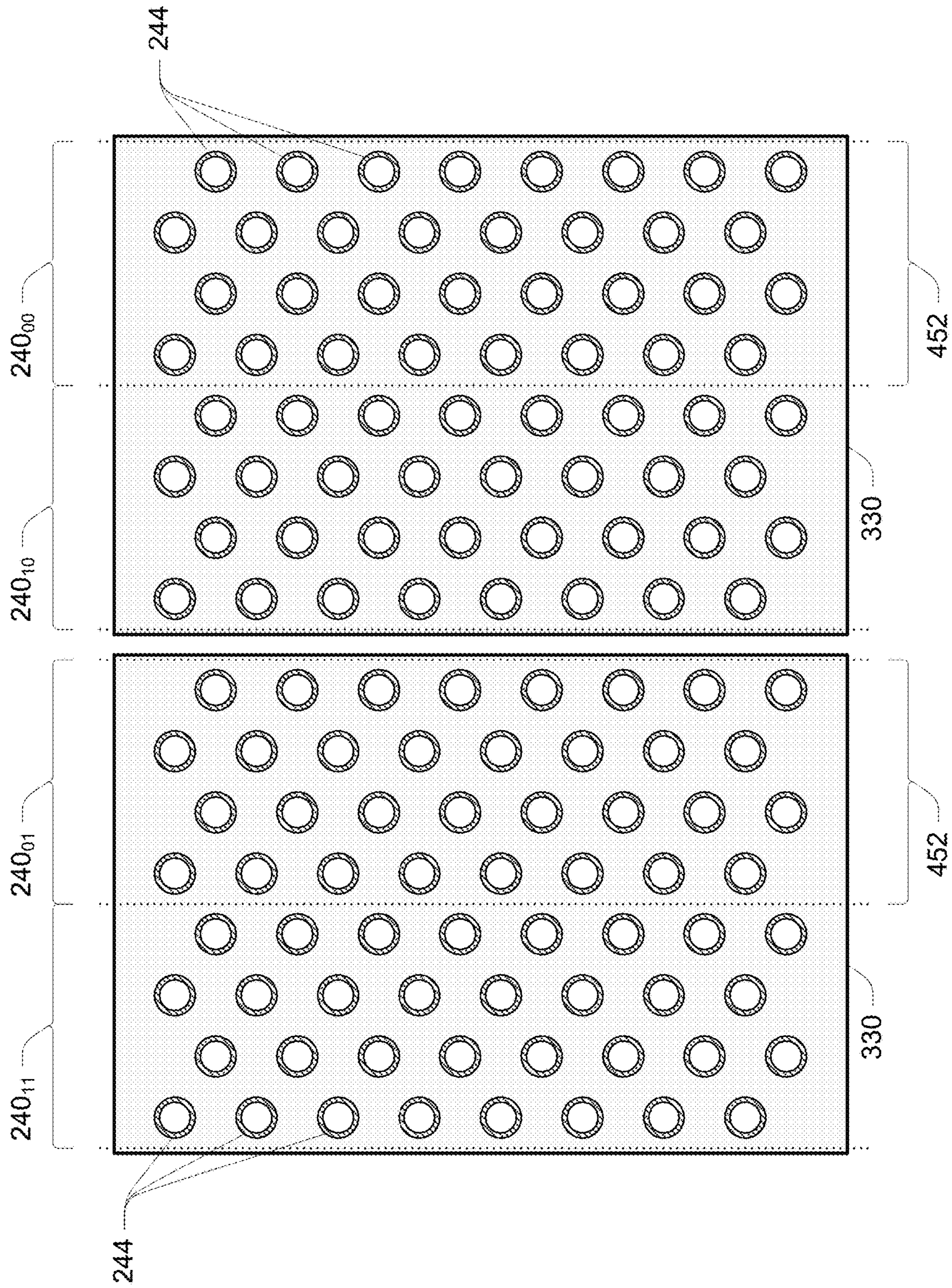

FIGS. 4B-4C depict representations of top views of a section of an array of memory cells including a structure of a type similar to that depicted in FIG. 4A. FIG. 4B might depict a block of memory cells containing two sub-blocks of memory cells 240, e.g., sub-blocks of memory cells 240$_0$-240$_1$, where the two sub-blocks of memory cells 240$_0$-240$_1$ might use a structure of a type similar to that depicted in FIG. 4A. FIG. 4B might depict a distribution of channel material structures 244 throughout the select line 330. In FIG. 4B, each channel material structure 244 of the sub-block of memory cells 240$_0$ might contain a respective doped section 452 as depicted in FIG. 4A.

FIG. 4C might depict a block of memory cells containing four sub-blocks of memory cells 240, e.g., sub-blocks of memory cells 240$_{00}$-240$_{01}$ and 240$_{10}$-240$_{11}$, where the two sub-blocks of memory cells 240$_{00}$-240$_{01}$ might use a structure of a type similar to that depicted in FIG. 4A and the two sub-blocks of memory cells 240$_{10}$-240$_{11}$ might use a structure of a type similar to that depicted in FIG. 4A, but the two sub-blocks of memory cells 240$_{00}$-240$_{01}$ are separated, e.g., by dielectric, from the two sub-blocks of memory cells 240$_{10}$-240$_{11}$. FIG. 4C might further depict a distribution of channel material structures 244 throughout the select lines 330. In FIG. 4C, each channel material structure 244 of the sub-block of memory cells 240$_{00}$ and each channel material structure 244 of the sub-block of memory cells 240$_{01}$ might contain a respective doped section 452 as depicted in FIG. 4A.

Figure 4D:
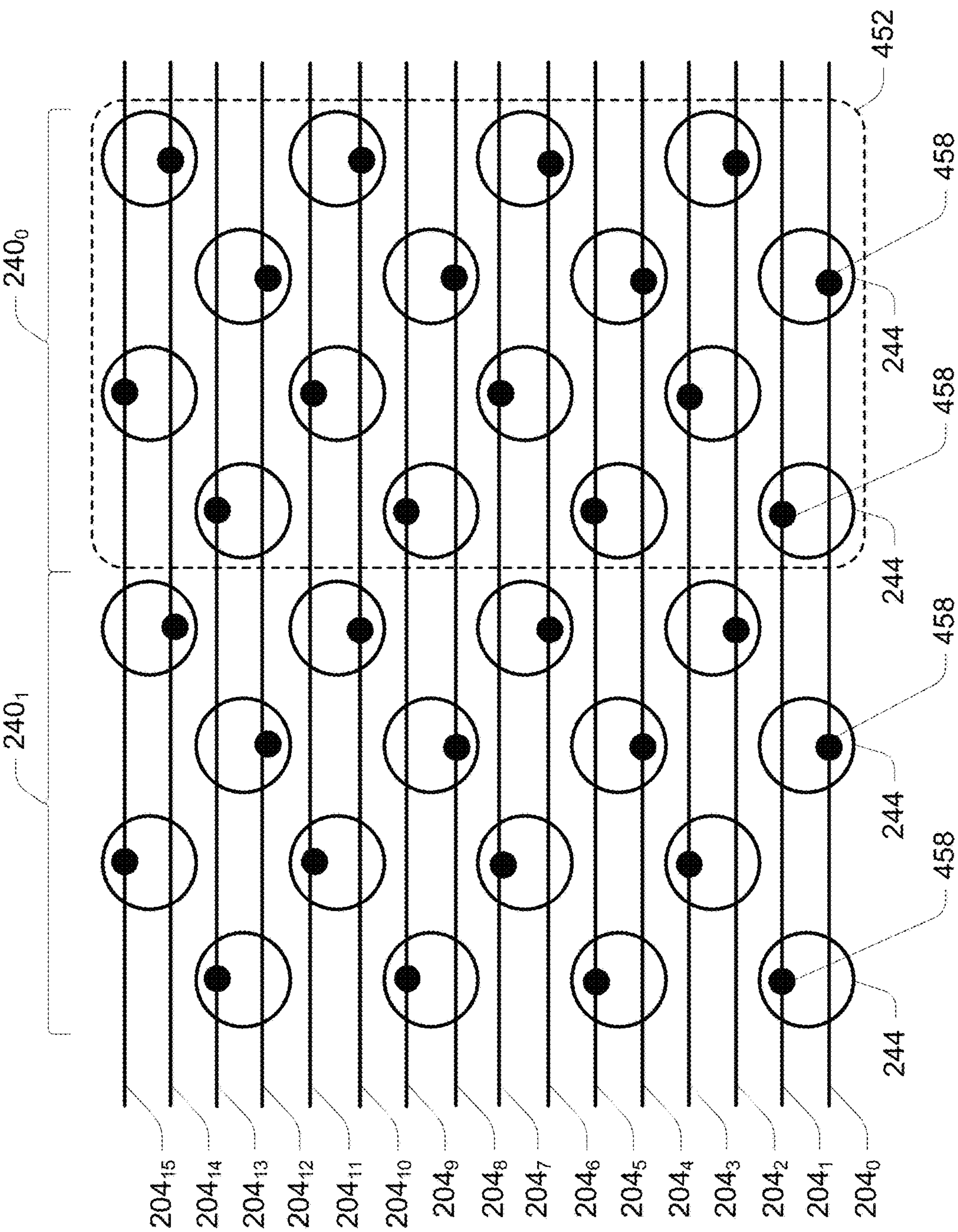
FIG. 4D depicts a conceptualized representation of a top view of two sub-blocks of memory cells of an array of memory cells including a structure of a type similar to that depicted in FIG. 4A and depicting an orientation of data lines.

FIG. 4D depicts a conceptualized representation of a top view of two sub-blocks of memory cells of an array of memory cells including a structure of a type similar to that depicted in FIG. 4A and depicting an orientation of data lines 204. With reference to FIG. 4A, the channel material structures 244 connected to the data line 204$_0$ through their respective contacts 458 might correspond to the channel material structures 244$_0$ and 244$_1$ of FIG. 4A. Although there is an intervening channel material structure 244 depicted that is part of the sub-block of memory cells 240$_0$, it is not connected to the data line 204$_0$, but instead connected to the data line 204$_1$. In general, each sub-block of memory cells 240 might have only one channel material structure 244 connected to any one data line 204.

Figure 5A:
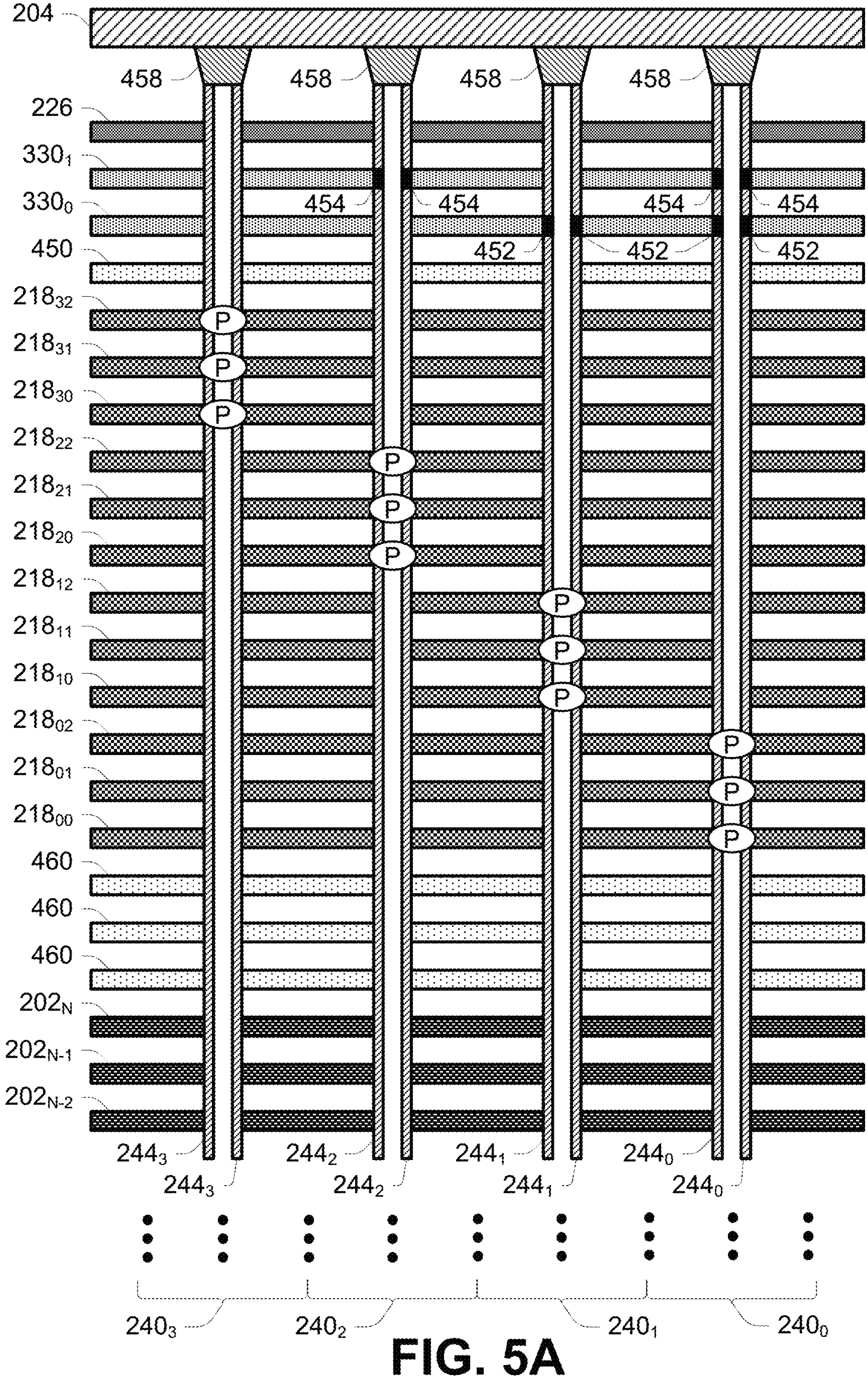
FIG. 5A depicts a conceptualized representation of a cross-sectional view of a portion of an array structure in accordance with an embodiment as could be used in a memory of the type described with reference to FIG. 1.

FIG. 5A depicts a conceptualized representation of a cross-sectional view of a portion of an array structure in accordance with an embodiment as could be used in a memory of the type described with reference to FIG. 1. Like numbered elements in FIG. 5A correspond to the description as provided with respect to FIG. 4A. FIG. 5A depicts an array structure that could be used in cases where a block of memory cells contains four sub-blocks of memory cells. In the example of FIG. 5A, multiple select lines 330, e.g., select lines 330$_0$-330$_1$, might be used in the programming the select lines 218. The structure of FIG. 5A further depicts the inclusion of dummy select lines 450 and dummy select lines 460. Dummy select lines 450 could be used in any embodiment to optionally mitigate E-field and reduce program disturb between the transistors connected to select lines 218, and the transistors connected to adjacent select line 330. Dummy select lines 460 could be used in any embodiment to optionally mitigate E-field and reduce program disturb between the transistors connected to select lines 218, and the transistors connected to adjacent access lines 202.

In FIG. 5A, the channel material structures 244$_0$-244$_3$ are depicted to be hollow channel material structures. Alternatively, the channel material structures 244$_0$-244$_3$ could be solid structures (not depicted in FIG. 5A). The channel material structure 244$_0$ might belong to a first sub-block of memory cells 240$_0$ of a block of memory cells, the channel material structure 244$_1$ might belong to a second sub-block of memory cells 240$_1$ of that block of memory cells, the channel material structure 244$_2$ might belong to a third sub-block of memory cells 240$_2$ of that block of memory cells, and the channel material structure 244$_3$ might belong to a fourth sub-block of memory cells 240$_3$ of that block of memory cells. As such, the pre-configured select gates 328 connected to the select line 330$_0$ and formed at intersections with the channel material structures 244$_0$-244$_1$ might have a first threshold voltage, while the pre-configured select gates 328 connected to the select line 330$_0$ and formed at intersections with the channel material structures 244$_2$-244$_3$ might have a second threshold voltage different than (e.g., lower than) the first threshold voltage. In addition, the pre-configured select gates 328 connected to the select line 330$_1$ and formed at intersections with the channel material structures 244$_0$ and 244$_2$ might have the first threshold voltage, while the pre-configured select gates 328 connected to the select line 330$_1$ and formed at intersections with the channel material structures 244$_1$ and 244$_3$ might have the second threshold voltage. This might be accomplished by forming first doped sections 452 in the channel material structures 244$_0$-244$_1$ to increase the threshold voltages of the corresponding transistors (e.g., pre-configured select gates 328) formed at intersections of the select line 330$_0$ with the channel material structures 244$_0$-244$_1$, and by forming second doped sections 454 in the channel material structures $244_0$ and $244_2$ to increase the threshold voltages of the corresponding transistors (e.g., pre-configured select gates 328) formed at intersections of the select line $330_1$ with the channel material structures $244_0$ and $244_2$. Although the channel material structures $244_0$-$244_3$ are depicted to be immediately adjacent one another, there may be intervening channel material structures 244 not connected to the data line 204.

Note that the selection of which channel material structures 244 receive a first doped section 452 and which channel material structures 244 receive a second doped section 454 can be altered. In general, each channel material structure 244 belonging to a particular sub-block of memory cells 240 should have a same configuration of threshold voltages of its pre-configured select gates 328. For example, a pre-configured select gate 328 having the first threshold voltage might be considered as a logical 1, and a pre-configured select gate 328 having the second threshold voltage might be considered as a logical 0. As such, the pre-configured select gates 328 corresponding to a same sub-block of memory cells 240 might correspond to a respective binary permutation of the possible binary permutations of two threshold voltages, e.g., 00, 01, 10 and 11 in the example of FIG. 5A having two select lines 330, where 0 represents the lower threshold voltage and 1 represents the higher threshold voltage. Their arrangement among the sub-blocks of memory cells 240 might otherwise be irrelevant.

Following fabrication, one or more select gates 212 formed at intersections of the channel material structure $244_3$ and the select lines $218_{30}$-$218_{32}$ might be programmed (indicated with the label "P" at the intersection) to have a programmed threshold voltage higher than an initial (e.g., erased) threshold voltage as a first stage of programming the select gates 212. In a second stage of programming, one or more select gates 212 formed at intersections of the channel material structure $244_2$ and the select lines $218_{20}$-$218_{22}$ might be programmed to have a programmed threshold voltage higher than an initial (e.g., erased) threshold voltage. In a third stage of programming, one or more select gates 212 formed at intersections between the channel material structure $244_1$ and the select lines $218_{10}$-$218_{12}$ might be programmed to have a programmed threshold voltage higher than an initial (e.g., erased) threshold voltage. In a fourth stage of programming, one or more select gates 212 (not depicted in FIG. 5A) formed at intersections between the channel material structure $244_0$ and the select lines $218_{00}$-$218_{02}$ might be programmed to have a programmed threshold voltage higher than an initial (e.g., erased) threshold voltage. Table 2 presents voltages for various nodes of FIG. 5A during the four stages of programming.

TABLE 2

| | Node | | | |
|---|---|---|---|---|
| Sub-Block | $240_3$ | $240_2$ | $240_1$ | $240_0$ |
| 204 | $V_{EN}$ (0 V) | $V_{EN}$ (0 V) | $V_{EN}$ (0 V) | $V_{EN}$ (0 V) |
| 226 | $V_{PASS}$ | $V_{PASS}$ | $V_{PASS}$ | $V_{PASS}$ |
| $330_1$ | $V_{SGP\_LOW}$ | $V_{PASS}$ | $V_{SGP\_LOW}$ | $V_{PASS}$ |
| $330_0$ | $V_{SGP\_LOW}$ | $V_{SGP\_LOW}$ | $V_{PASS}$ | $V_{PASS}$ |
| 450 | $V_{PASS}$ | $V_{PASS}$ | $V_{PASS}$ | $V_{PASS}$ |
| $218_{30}$-$218_{32}$ | $V_{PGM}$ | $V_{SGD\_LOW}$ | $V_{SGD\_LOW}$ | $V_{SGD\_LOW}$ |
| $218_{20}$-$218_{22}$ | $V_{PASS}$ | $V_{PGM}$ | $V_{SGD\_LOW}$ | $V_{SGD\_LOW}$ |
| $218_{10}$-$218_{12}$ | $V_{PASS}$ | $V_{PASS}$ | $V_{PGM}$ | $V_{SGD\_LOW}$ |
| $218_{00}$-$218_{02}$ | $V_{PASS}$ | $V_{PASS}$ | $V_{PASS}$ | $V_{PGM}$ |

It is noted that voltages to be applied to dummy select lines 460 as well as other nodes between the select lines 218 receiving the programming voltage VPGM and a common source, e.g., access lines 202, dummy access lines, select lines 214, control lines 224, other select lines 218, etc., might take any approach configured to inhibit programming of their corresponding transistors. For example, all of these nodes could receive the pass voltage $V_{PASS}$ to inhibit program disturb of corresponding transistors connected to the data line 204. Alternatively, these nodes could receive a gradient of voltage levels configured to inhibit program disturb of corresponding transistors closest to the select lines 218 receiving the programming voltage VPGM, while cutting off transistors (e.g., memory cells) corresponding to the access lines 202 from the data line 204 to inhibit their programming.

As depicted in Table 2, for the first stage of programming, the data line 204 might receive an enable voltage $V_{EN}$ configured to enable programming of a programmable transistor connected to the data line. As one example, the enable voltage $V_{EN}$ might be a reference potential, e.g., 0V, ground or $V_{SS}$. The SGD_GG control line 226 might receive a pass voltage $V_{PASS}$ configured to activate its corresponding transistors, e.g., the GG gates 222. The select lines $330_0$ and $330_1$ might each receive a first voltage level $V_{SGP\_LOW}$ configured to deactivate pre-configured select gates 328 having the first threshold voltage, and to activate pre-configured select gates 328 having the second threshold voltage lower than the first threshold voltage. As such, the first voltage level $V_{SGP\_LOW}$ might activate pre-configured select gates 328 at intersections of the select line $330_1$ and the channel material structures $244_1$ and $244_3$, and deactivate pre-configured select gates 328 at intersections of the select line $330_1$ and the channel material structures $244_0$ and $244_2$. Similarly, the first voltage level $V_{SGP\_LOW}$ might activate pre-configured select gates 328 at intersections of the select line $330_0$ and the channel material structures $244_2$ and $244_3$, and deactivate pre-configured select gates 328 at intersections of the select line $330_0$ and the channel material structures $244_0$ and $244_1$. The dummy select line 450 might receive the pass voltage $V_{PASS}$ configured to activate all of its corresponding transistors. In this manner, select gates 212 at intersections of the select lines 218 and the channel material structure $244_3$ might be connected to the data line 204 and enabled for programming, while the select gates 212 at intersections of the select lines 218 and the channel material structures $244_0$-$244_2$ might be isolated from the data line 204 and inhibited from programming. As such, upon application of a programming voltage VPGM (e.g., a voltage level configured to increase a threshold voltage of a programmable transistor enabled for programming) to the select lines $218_{30}$-$218_{32}$, the transistor corresponding to the channel material structure $244_3$ might be programmed to have a higher threshold voltage, while those transistors corresponding to the channel material structures $244_0$-$244_2$ might be inhibited from programming and remain at their initial, e.g., erased, threshold voltage.

Following the programming of the select gates 212 corresponding to the select lines $218_{30}$-$218_{32}$, the select gates 212 corresponding to the select lines $218_{20}$-$218_{22}$ might be programmed. In particular, the data line 204 might receive the enable voltage $V_{EN}$. The SGD_GG control line 226 might receive the pass voltage $V_{PASS}$ configured to activate its corresponding transistors, e.g., the GG gates 222. The select line $330_1$ might receive the pass voltage $V_{PASS}$ configured to activate pre-configured select gates 328 having the first threshold voltage and to activate pre-configured select gates 328 having the second threshold voltage, while the select line $330_0$ might receive the voltage level $V_{SGP\_LOW}$ configured to deactivate pre-configured select gates 328 having the first threshold voltage, and to activate pre-configured select gates 328 having the second threshold voltage lower than the first threshold voltage. As such, the pass voltage $V_{PASS}$ might activate pre-configured select gates 328 at intersections of the select line $330_1$ and the channel material structures $244_0$-$244_3$. Similarly, the first voltage level $V_{SGP\_LOW}$ might activate pre-configured select gates 328 at intersections of the select line $330_0$ and the channel material structures $244_2$ and $244_3$, and deactivate pre-configured select gates 328 at intersections of the select line $330_0$ and the channel material structures $244_0$ and $244_1$. The dummy select line 450 might receive the pass voltage $V_{PASS}$ configured to activate all of its corresponding transistors. The select lines $218_{30}$-$218_{32}$ might receive a voltage $V_{SGD\_LOW}$ configured to deactivate the select gates 212 corresponding to the channel material structure $244_3$ (e.g., having the higher threshold voltage) and to activate the select gates 212 corresponding to the channel material structures $244_0$-$244_2$ (e.g., having the lower threshold voltage). In this manner, select gates 212 at intersections of the select lines $218_{20}$-$218_{22}$ and the channel material structure $244_2$ might be connected to the data line 204 and enabled for programming, while the select gates 212 at intersections of the select lines $218_{20}$-$218_{22}$ and the channel material structures $244_0$, $244_1$ and $244_3$ might be isolated from the data line 204 and inhibited from programming. As such, upon application of the programming voltage VPGM to the select lines $218_{20}$-$218_{22}$, those transistors corresponding to the channel material structure $244_2$ might be programmed to have the higher threshold voltage, while those transistors corresponding to the channel material structures $244_0$, $244_1$ and $244_3$ might be inhibited from programming and remain at their initial, e.g., erased, threshold voltage.

Following the programming of the select gates 212 corresponding to the select lines $218_{20}$-$218_{22}$, the select gates 212 corresponding to the select lines $218_{10}$-$218_{12}$ might be programmed. In particular, the data line 204 might receive the enable voltage $V_{EN}$. The SGD_GG control line 226 might receive the pass voltage $V_{PASS}$ configured to activate its corresponding transistors, e.g., the GG gates 222. The select line $330_1$ might receive the voltage level $V_{SGP\_LOW}$ configured to deactivate pre-configured select gates 328 having the first threshold voltage, and to activate pre-configured select gates 328 having the second threshold voltage lower than the first threshold voltage, while the select line $330_0$ might receive the pass voltage $V_{PASS}$ configured to activate pre-configured select gates 328 having the first threshold voltage and to activate pre-configured select gates 328 having the second threshold voltage. As such, the voltage level $V_{SGP\_LOW}$ might activate pre-configured select gates 328 at intersections of the select line $330_1$ and the channel material structures $244_1$ and $244_3$, and deactivate pre-configured select gates 328 at intersections of the select line $330_1$ and the channel material structures $244_0$ and $244_2$. Similarly, the pass voltage $V_{PASS}$ might activate pre-configured select gates 328 at intersections of the select line $330_0$ and the channel material structures $244_0$-$244_3$. The dummy select line 450 might receive the pass voltage $V_{PASS}$ configured to activate all of its corresponding transistors. The select lines $218_{30}$-$218_{32}$ and $218_{20}$-$218_{22}$ might receive a voltage $V_{SGD\_LOW}$ configured to deactivate the select gates 212 having the higher threshold voltage and to activate the select gates 212 having the lower threshold voltage). In this manner, select gates 212 at intersections of the select lines $218_{10}$-$218_{12}$ and the channel material structure $244_1$ might be connected to the data line 204 and enabled for programming, while the select gates 212 at intersections of the select lines $218_{10}$-$218_{12}$ and the channel material structures $244_0$, $244_2$ and $244_3$ might be isolated from the data line 204 and inhibited from programming. As such, upon application of the programming voltage VPGM to the select lines $218_{10}$-$218_{12}$, those transistors corresponding to the channel material structure $244_1$ might be programmed to have the higher threshold voltage, while those transistors corresponding to the channel material structures $244_0$, $244_2$ and $244_3$ might be inhibited from programming and remain at their initial, e.g., erased, threshold voltage.

Following the programming of the select gates 212 corresponding to the select lines $218_{10}$-$218_{12}$, the select gates 212 corresponding to the select lines $218_{00}$-$218_{02}$ might be programmed. In particular, the data line 204 might receive the enable voltage $V_{EN}$. The SGD_GG control line 226 might receive the pass voltage $V_{PASS}$ configured to activate its corresponding transistors, e.g., the GG gates 222. The select lines $330_0$ and $330_1$ might each receive the pass voltage $V_{PASS}$ configured to activate pre-configured select gates 328 having the first threshold voltage and to activate pre-configured select gates 328 having the second threshold voltage. As such, the pass voltage $V_{PASS}$ might activate pre-configured select gates 328 at intersections of the select lines $330_0$ and $330_1$, and the channel material structures $244_0$-$244_3$. The dummy select line 450 might receive the pass voltage $V_{PASS}$ configured to activate all of its corresponding transistors. The select lines $218_{30}$-$218_{32}$, $218_{20}$-$218_{22}$ and $218_{10}$-$218_{12}$ might receive a voltage $V_{SGD\_LOW}$ configured to deactivate the select gates 212 having the higher threshold voltage and to activate the select gates 212 having the lower threshold voltage. In this manner, select gates 212 at intersections of the select lines $218_{00}$-$218_{02}$ and the channel material structure $244_0$ might be connected to the data line 204 and enabled for programming, while the select gates 212 at intersections of the select lines $218_{00}$-$218_{02}$ and the channel material structures $244_2$ and $244_3$ might be isolated from the data line 204 and inhibited from programming. As such, upon application of the programming voltage VPGM to the select lines $218_{00}$-$218_{02}$, those transistors corresponding to the channel material structure $244_0$ might be programmed to have the higher threshold voltage, while those transistors corresponding to the channel material structures $244_1$-$244_3$ might be inhibited from programming and remain at their initial, e.g., erased, threshold voltage.

As one example, the first threshold voltage of the pre-configured select gates 328 might be 3V while the second threshold voltage of the pre-configured select gates 328 might be −1V. To continue the example, the programmed threshold voltage of the select gates 212 might be 4V and the initial threshold voltage might be −1V. In this example, $V_{SGP\_LOW}$ and $V_{SGD\_LOW}$ might be 1V, $V_{PASS}$ might be 7V, and VPGM might be 18V. Alternatively, all select gates 212 at the intersections of the select lines 218 and the channel material structures $244_0$-$244_3$ might be programmed to a positive threshold voltage, e.g., 2V, as their initial threshold voltage prior to programming of the select gates 212 by sub-blocks of memory cells as described. In such an embodiment, $V_{SGD\_LOW}$ might be increased to 3V, for example.

Figure 5B:
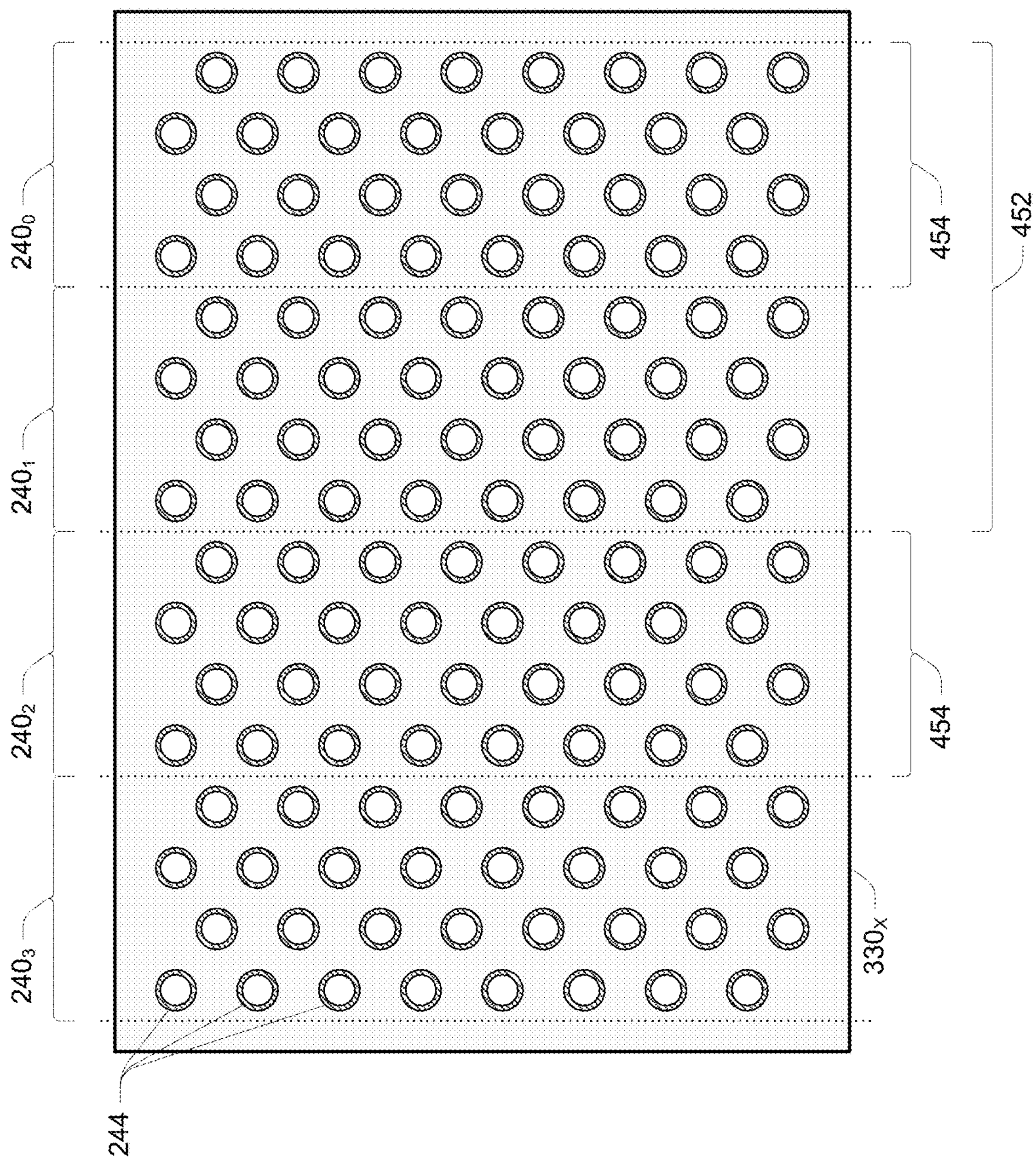
FIG. 5B depicts a representation of a top view of a section of an array of memory cells including a structure of a type similar to that depicted in FIG. 5A.

FIG. 5B depicts a representation of a top view of a section of an array of memory cells including a structure of a type similar to that depicted in FIG. 5A. FIG. 5B might depict a distribution of channel material structures 244 throughout the select line $330_X$, where select line $330_X$ might represent any one of the select lines $330_0$ or $330_1$. In FIG. 5B, each channel material structure 244 of the sub-blocks of memory cells $240_0$ and $240_1$ might contain a respective doped section 452 as depicted in FIG. 5A, and each channel material structure 244 of the sub-blocks of memory cells $240_0$ and $240_2$ might contain a respective doped section 454 as depicted in FIG. 5A.

Figure 6A:
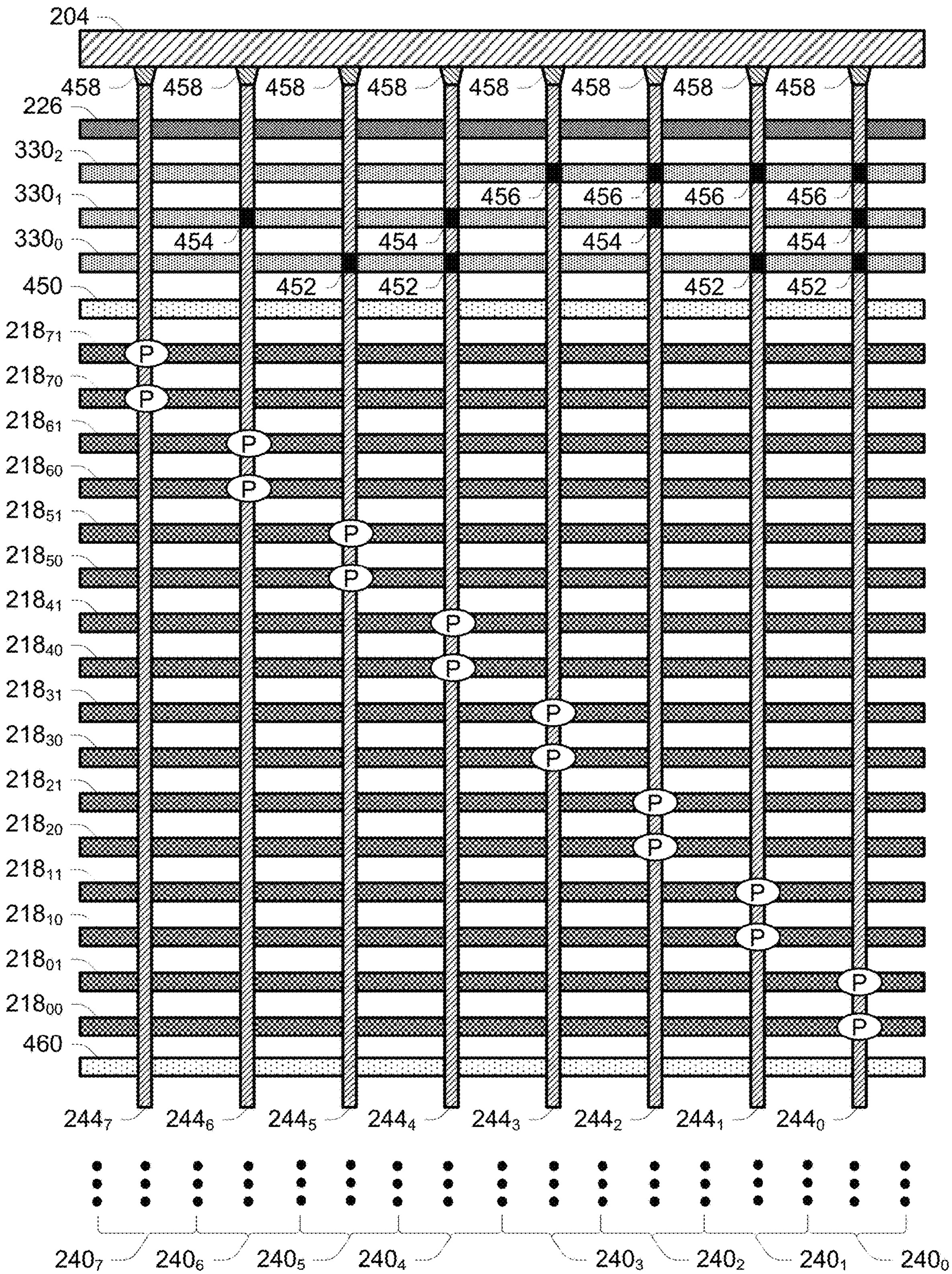
FIG. 6A depicts a conceptualized representation of a cross-sectional view of a portion of an array structure in accordance with an embodiment as could be used in a memory of the type described with reference to FIG. 1.

FIG. 6A depicts a conceptualized representation of a cross-sectional view of a portion of an array structure in accordance with an embodiment as could be used in a memory of the type described with reference to FIG. 1. Like numbered elements in FIG. 6A correspond to the description as provided with respect to FIG. 4A. FIG. 6A depicts an array structure that could be used in cases where a block of memory cells contains eight sub-blocks of memory cells. In the example of FIG. 6A, multiple select lines 330, e.g., select lines $330_0$-$330_2$, might be used in the programming the select lines 218. The structure of FIG. 6A further depicts the inclusion of dummy select lines 450 and dummy select lines 460. Dummy select lines 450 could be used in any embodiment to optionally mitigate E-field and reduce program disturb between the transistors connected to select lines 218, and the transistors connected to adjacent select line 330. Dummy select lines 460 could be used in any embodiment to optionally mitigate E-field and reduce program disturb between the transistors connected to select lines 218, and the transistors connected to adjacent access lines 202.

In FIG. 6A, the channel material structures $244_0$-$244_7$ are depicted to be solid channel material structures. Alternatively, the channel material structures $244_0$-$244_3$ could be hollow structures (not depicted in FIG. 6A). The channel material structure $244_0$ might belong to a first sub-block of memory cells $240_0$ of a block of memory cells, the channel material structure $244_1$ might belong to a second sub-block of memory cells $240_1$ of that block of memory cells, the channel material structure $244_2$ might belong to a third sub-block of memory cells $240_2$ of that block of memory cells, the channel material structure $244_3$ might belong to a fourth sub-block of memory cells $240_3$ of that block of memory cells, the channel material structure $244_4$ might belong to a fifth sub-block of memory cells $240_4$ of that block of memory cells, the channel material structure $244_5$ might belong to a sixth sub-block of memory cells $240_5$ of that block of memory cells, the channel material structure $244_6$ might belong to a seventh sub-block of memory cells $240_6$ of that block of memory cells, and the channel material structure $244_7$ might belong to an eighth sub-block of memory cells $240_7$ of that block of memory cells.

As such, the pre-configured select gates 328 connected to the select line $330_0$ and formed at intersections with the channel material structures $244_0$, $244_1$, $244_4$ and $244_5$ might have a first threshold voltage, while the pre-configured select gates 328 connected to the select line $330_0$ and formed at intersections with the channel material structures $244_2$, $244_3$, $244_6$ and $244_7$ might have a second threshold voltage different than (e.g., lower than) the first threshold voltage. In addition, the pre-configured select gates 328 connected to the select line $330_1$ and formed at intersections with the channel material structures $244_0$, $244_2$, $244_4$ and $244_6$ might have a first threshold voltage, while the pre-configured select gates 328 connected to the select line $330_1$ and formed at intersections with the channel material structures $244_1$, $244_3$, $244_5$ and $244_7$ might have a second threshold voltage different than (e.g., lower than) the first threshold voltage. Furthermore, the pre-configured select gates 328 connected to the select line $330_2$ and formed at intersections with the channel material structures $244_0$, $244_1$, $244_2$ and $244_3$ might have a first threshold voltage, while the pre-configured select gates 328 connected to the select line $330_2$ and formed at intersections with the channel material structures $244_4$, $244_5$, $244_6$ and $244_7$ might have a second threshold voltage different than (e.g., lower than) the first threshold voltage. This might be accomplished by forming first doped sections 452 in the channel material structures $244_0$, $244_1$, $244_4$ and $244_5$ to increase the threshold voltages of the corresponding transistors (e.g., pre-configured select gates 328) formed at intersections of the select line $330_0$ with the channel material structures $244_0$, $244_1$, $244_4$ and $244_5$, by forming second doped sections 454 in the channel material structures $244_0$, $244_2$, $244_4$ and $244_6$ to increase the threshold voltages of the corresponding transistors (e.g., pre-configured select gates 328) formed at intersections of the select line $330_1$ with the channel material structures $244_0$, $244_2$, $244_4$ and $244_6$, and by forming third doped sections 456 in the channel material structures $244_0$, $244_1$, $244_2$ and $244_3$ to increase the threshold voltages of the corresponding transistors (e.g., pre-configured select gates 328) formed at intersections of the select line $330_2$ with the channel material structures $244_0$, $244_1$, $244_2$ and $244_3$. Although the channel material structures $244_0$-$244_7$ are depicted to be immediately adjacent one another, there may be intervening channel material structures 244 not connected to the data line 204.

Note that the selection of which channel material structures 244 receive a first doped section 452, which channel material structures 244 receive a second doped section 454, and which channel material structures 244 receive a third doped section 456 can be altered. In general, each channel material structure 244 belonging to a particular sub-block of memory cells 240 should have a same configuration of threshold voltages of its pre-configured select gates 328. For example, a pre-configured select gate 328 having the first threshold voltage might be considered as a logical 1, and a pre-configured select gate 328 having the second threshold voltage might be considered as a logical 0. As such, the pre-configured select gates 328 corresponding to a same sub-block of memory cells 240 might correspond to a respective binary permutation of the possible binary permutations of two threshold voltages, e.g., 000 (e.g., low-low-low), 001 (e.g., low-low-high), 010 (e.g., low-high-low), 011 (e.g., low-high-high), 100 (e.g., high-low-low), 101 (e.g., high-low-high), 110 (e.g., high-high-low), and 111 (e.g., high-high-high) in the example of FIG. 6A having three select lines 330, where 0 represents the lower threshold voltage and 1 represents the higher threshold voltage. Their arrangement among the sub-blocks of memory cells 240 might otherwise be irrelevant.

Following fabrication, one or more select gates 212 formed at intersections between the channel material structure $244_7$ and the select lines $218_{70}$-$218_{71}$ might be programmed (indicated with the label "P" at the intersection) to have a programmed threshold voltage higher than an initial (e.g., erased) threshold voltage as a first stage of programming the select gates 212. In a second stage of programming, one or more select gates 212 formed at intersections between the channel material structure $244_6$ and the select lines $218_{60}$-$218_{61}$ might be programmed to have a programmed threshold voltage higher than an initial (e.g., erased) threshold voltage. In a third stage of programming, one or more select gates 212 formed at intersections between the channel material structure $244_5$ and the select lines $218_{50}$-$218_{51}$ might be programmed to have a programmed threshold voltage higher than an initial (e.g., erased) threshold voltage. In a fourth stage of programming, one or more select gates 212 formed at intersections between the channel material structure $\mathbf{244}_4$ and the select lines $\mathbf{218}_{40}$-$\mathbf{218}_{41}$ might be programmed to have a programmed threshold voltage higher than an initial (e.g., erased) threshold voltage. In a fifth stage of programming, one or more select gates 212 formed at intersections between the channel material structure $\mathbf{244}_3$ and the select lines $\mathbf{218}_{30}$-$\mathbf{218}_{31}$ might be programmed to have a programmed threshold voltage higher than an initial (e.g., erased) threshold voltage. In a sixth stage of programming, one or more select gates 212 formed at intersections between the channel material structure $\mathbf{244}_2$ and the select lines $\mathbf{218}_{20}$-$\mathbf{218}_{21}$ might be programmed to have a programmed threshold voltage higher than an initial (e.g., erased) threshold voltage. In a seventh stage of programming, one or more select gates 212 formed at intersections between the channel material structure $\mathbf{244}_1$ and the select lines $\mathbf{218}_{10}$-$\mathbf{218}_{11}$ might be programmed to have a programmed threshold voltage higher than an initial (e.g., erased) threshold voltage. In an eighth stage of programming, one or more select gates 212 (not depicted in FIG. 6A) formed at intersections between the channel material structure $\mathbf{244}_0$ and the select lines $\mathbf{218}_{00}$-$\mathbf{218}_{01}$ might be programmed to have a programmed threshold voltage higher than an initial (e.g., erased) threshold voltage. Table 3 presents voltages for various nodes of FIG. 6A during the four stages of programming.

TABLE 3

| Sub-Block | Node | | | |
|---|---|---|---|---|
| | $240_7$ | $240_6$ | $240_5$ | $240_4$ |
| 204 | $V_{EN}$ (0 V) | $V_{EN}$ (0 V) | $V_{EN}$ (0 V) | $V_{EN}$ (0 V) |
| 226 | $V_{PASS}$ | $V_{PASS}$ | $V_{PASS}$ | $V_{PASS}$ |
| $330_2$ | $V_{SGP\_LOW}$ | $V_{SGP\_LOW}$ | $V_{SGP\_LOW}$ | $V_{SGP\_LOW}$ |
| $330_1$ | $V_{SGP\_LOW}$ | $V_{PASS}$ | $V_{SGP\_LOW}$ | $V_{PASS}$ |
| $330_0$ | $V_{SGP\_LOW}$ | $V_{SGP\_LOW}$ | $V_{PASS}$ | $V_{PASS}$ |
| 450 | $V_{PASS}$ | $V_{PASS}$ | $V_{PASS}$ | $V_{PASS}$ |
| $218_{70}$-$218_{71}$ | $V_{PGM}$ | $V_{SGD\_LOW}$ | $V_{SGD\_LOW}$ | $V_{SGD\_LOW}$ |
| $218_{60}$-$218_{61}$ | $V_{PASS}$ | $V_{PGM}$ | $V_{SGD\_LOW}$ | $V_{SGD\_LOW}$ |
| $218_{50}$-$218_{51}$ | $V_{PASS}$ | $V_{PASS}$ | $V_{PGM}$ | $V_{SGD\_LOW}$ |
| $218_{40}$-$218_{41}$ | $V_{PASS}$ | $V_{PASS}$ | $V_{PASS}$ | $V_{PGM}$ |
| $218_{30}$-$218_{31}$ | $V_{PASS}$ | $V_{PASS}$ | $V_{PASS}$ | $V_{PASS}$ |
| $218_{20}$-$218_{21}$ | $V_{PASS}$ | $V_{PGM}$ | $V_{PASS}$ | $V_{PASS}$ |
| $218_{10}$-$218_{11}$ | $V_{PASS}$ | $V_{PASS}$ | $V_{PASS}$ | $V_{PASS}$ |
| $218_{00}$-$218_{01}$ | $V_{PASS}$ | $V_{PASS}$ | $V_{PASS}$ | $V_{PASS}$ |

| Sub-Block | Node | | | |
|---|---|---|---|---|
| | $240_3$ | $240_2$ | $240_1$ | $240_0$ |
| 204 | $V_{EN}$ (0 V) | $V_{EN}$ (0 V) | $V_{EN}$ (0 V) | $V_{EN}$ (0 V) |
| 226 | $V_{PASS}$ | $V_{PASS}$ | $V_{PASS}$ | $V_{PASS}$ |
| $330_2$ | $V_{PASS}$ | $V_{PASS}$ | $V_{PASS}$ | $V_{PASS}$ |
| $330_1$ | $V_{SGP\_LOW}$ | $V_{PASS}$ | $V_{SGP\_LOW}$ | $V_{PASS}$ |
| $330_0$ | $V_{SGP\_LOW}$ | $V_{SGP\_LOW}$ | $V_{PASS}$ | $V_{PASS}$ |
| 450 | $V_{PASS}$ | $V_{PASS}$ | $V_{PASS}$ | $V_{PASS}$ |
| $218_{70}$-$218_{71}$ | $V_{SGD\_LOW}$ | $V_{SGD\_LOW}$ | $V_{SGD\_LOW}$ | $V_{SGD\_LOW}$ |
| $218_{60}$-$218_{61}$ | $V_{SGD\_LOW}$ | $V_{SGD\_LOW}$ | $V_{SGD\_LOW}$ | $V_{SGD\_LOW}$ |
| $218_{50}$-$218_{51}$ | $V_{SGD\_LOW}$ | $V_{SGD\_LOW}$ | $V_{SGD\_LOW}$ | $V_{SGD\_LOW}$ |
| $218_{40}$-$218_{41}$ | $V_{SGD\_LOW}$ | $V_{SGD\_LOW}$ | $V_{SGD\_LOW}$ | $V_{SGD\_LOW}$ |
| $218_{30}$-$218_{31}$ | $V_{PGM}$ | $V_{SGD\_LOW}$ | $V_{SGD\_LOW}$ | $V_{SGD\_LOW}$ |
| $218_{20}$-$218_{21}$ | $V_{PASS}$ | $V_{PGM}$ | $V_{SGD\_LOW}$ | $V_{SGD\_LOW}$ |
| $218_{10}$-$218_{11}$ | $V_{PASS}$ | $V_{PASS}$ | $V_{PGM}$ | $V_{SGD\_LOW}$ |
| $218_{00}$-$218_{01}$ | $V_{PASS}$ | $V_{PASS}$ | $V_{PASS}$ | $V_{PGM}$ |

It is noted that voltages to be applied to dummy select lines 460 as well as other nodes between the select lines 218 receiving the programming voltage VPGM and a common source, e.g., access lines 202, dummy access lines, select lines 214, control lines 224, other select lines 218, etc., might take any approach configured to inhibit programming of their corresponding transistors. For example, all of these nodes could receive the pass voltage $V_{PASS}$ to inhibit program disturb of corresponding transistors connected to the data line 204. Alternatively, these nodes could receive a gradient of voltage levels configured to inhibit program disturb of corresponding transistors closest to the select lines 218 receiving the programming voltage VPGM, while cutting off transistors (e.g., memory cells) corresponding to the access lines 202 from the data line 204 to inhibit their programming.

As depicted in Table 3, for the first stage of programming, the data line 204 might receive an enable voltage $V_{EN}$ configured to enable programming of a programmable transistor connected to the data line. As one example, the enable voltage $V_{EN}$ might be a reference potential, e.g., 0V, ground or $V_{SS}$. The SGD_GG control line 226 might receive a pass voltage $V_{PASS}$ configured to activate its corresponding transistors, e.g., the GG gates 222. The select lines $\mathbf{330}_0$, $\mathbf{330}_1$ and $\mathbf{330}_2$ might each receive a first voltage level $V_{SGP\_LOW}$ configured to deactivate pre-configured select gates 328 having the first threshold voltage, and to activate pre-configured select gates 328 having the second threshold voltage lower than the first threshold voltage. As such, the first voltage level $V_{SGP\_LOW}$ might activate pre-configured select gates 328 at intersections of the select line $\mathbf{330}_2$ and the channel material structures $\mathbf{244}_4$-$\mathbf{244}_7$, and deactivate pre-configured select gates 328 at intersections of the select line $\mathbf{330}_{12}$ and the channel material structures $\mathbf{244}_0$-$\mathbf{244}_3$. Similarly, the first voltage level $V_{SGP\_LOW}$ might activate pre-configured select gates 328 at intersections of the select line $\mathbf{330}_1$ and the channel material structures $\mathbf{244}_1$, $\mathbf{244}_3$, $\mathbf{244}_5$ and $\mathbf{244}_7$, and deactivate pre-configured select gates 328 at intersections of the select line $\mathbf{330}_1$ and the channel material structures $\mathbf{244}_0$, $\mathbf{244}_2$, $\mathbf{244}_4$ and $\mathbf{244}_6$. Furthermore, the first voltage level $V_{SGP\_LOW}$ might activate pre-configured select gates 328 at intersections of the select line $\mathbf{330}_0$ and the channel material structures $\mathbf{244}_2$, $\mathbf{244}_3$, $\mathbf{244}_6$ and $\mathbf{244}_7$, and deactivate pre-configured select gates 328 at intersections of the select line $\mathbf{330}_0$ and the channel material structures $\mathbf{244}_0$, $\mathbf{244}_1$, $\mathbf{244}_4$ and $\mathbf{244}_5$. The dummy select line 450 might receive the pass voltage $V_{PASS}$ configured to activate all of its corresponding transistors.

In this manner, select gates 212 at intersections of the select lines 218 and the channel material structure $\mathbf{244}_7$ might be connected to the data line 204 and enabled for programming, while the select gates 212 at intersections of the select lines 218 and the channel material structures $\mathbf{244}_0$-$\mathbf{244}_6$ might be isolated from the data line 204 and inhibited from programming. As such, upon application of a programming voltage VPGM (e.g., a voltage level configured to increase a threshold voltage of a programmable transistor enabled for programming) to the select lines $\mathbf{218}_{70}$-$\mathbf{218}_{71}$, the transistors corresponding to the channel material structure $\mathbf{244}_7$ might be programmed to have a higher threshold voltage, while those transistors corresponding to the channel material structures $\mathbf{244}_0$-$\mathbf{244}_6$ might be inhibited from programming and remain at their initial, e.g., erased, threshold voltage.

Following the programming of the select gates 212 corresponding to the select lines $\mathbf{218}_{70}$-$\mathbf{218}_{71}$, the select gates 212 corresponding to the select lines $\mathbf{218}_{60}$-$\mathbf{218}_{61}$ might be programmed. In particular, the data line 204 might receive the enable voltage $V_{EN}$. The SGD_GG control line 226 might receive the pass voltage $V_{PASS}$ configured to activate its corresponding transistors, e.g., the GG gates 222. The select lines $\mathbf{330}_0$ and $\mathbf{330}_2$ might receive the voltage level $V_{SGP\_LOW}$ configured to deactivate pre-configured select gates 328 having the first threshold voltage, and to activate pre-configured select gates 328 having the second threshold voltage lower than the first threshold voltage, and select line 330$_1$ might receive the pass voltage $V_{PASS}$ configured to activate pre-configured select gates 328 having the first threshold voltage or the second threshold voltage. As such, the pass voltage $V_{PASS}$ might activate pre-configured select gates 328 at intersections of the select line 330$_1$ and the channel material structures 244$_0$-244$_7$. Similarly, the voltage level $V_{SGP\_LOW}$ might activate pre-configured select gates 328 at intersections of the select line 330$_0$ and the channel material structures 244$_2$, 244$_3$, 244$_6$ and 244$_7$, and deactivate pre-configured select gates 328 at intersections of the select line 330$_0$ and the channel material structures 244$_0$, 244$_1$, 244$_4$ and 244$_5$. Furthermore, the voltage level $V_{SGP\_LOW}$ might activate pre-configured select gates 328 at intersections of the select line 330$_2$ and the channel material structures 244$_4$-244$_7$, and deactivate pre-configured select gates 328 at intersections of the select line 330$_2$ and the channel material structures 244$_0$-244$_3$. The dummy select line 450 might receive the pass voltage $V_{PASS}$ configured to activate all of its corresponding transistors. The select lines 218$_{70}$-218$_{71}$ might receive a voltage level $V_{SGD\_LOW}$ configured to deactivate the select gates 212 corresponding to the channel material structure 244$_7$ having the higher threshold voltage, and to activate the select gates 212 corresponding to the channel material structures 244$_0$-244$_6$ having the lower threshold voltage. In this manner, select gates 212 at intersections of the select lines 218$_{60}$-218$_{61}$ and the channel material structure 244$_6$ might be connected to the data line 204 and enabled for programming, while the select gates 212 at intersections of the select lines 218$_{60}$-218$_{61}$ and the channel material structures 244$_0$-244$_5$ and 244$_7$ might be isolated from the data line 204 and inhibited from programming. As such, upon application of the programming voltage VPGM to the select lines 218$_{60}$-218$_{61}$, those transistors corresponding to the channel material structure 244$_6$ might be programmed to have the higher threshold voltage, while those transistors corresponding to the channel material structures 244$_0$-244$_5$ and 244$_7$ might be inhibited from programming and remain at their initial, e.g., erased, threshold voltage.

Following the programming of the select gates 212 corresponding to the select lines 218$_{60}$-218$_{61}$, the select gates 212 corresponding to the select lines 218$_{50}$-218$_{51}$ might be programmed. In particular, the data line 204 might receive the enable voltage $V_{EN}$. The SGD_GG control line 226 might receive the pass voltage $V_{PASS}$ configured to activate its corresponding transistors, e.g., the GG gates 222. The select lines 330$_1$ and 330$_2$ might receive the voltage level $V_{SGP\_LOW}$ configured to deactivate pre-configured select gates 328 having the first threshold voltage, and to activate pre-configured select gates 328 having the second threshold voltage lower than the first threshold voltage, while the select line 330$_0$ might receive the pass voltage $V_{PASS}$ configured to activate pre-configured select gates 328 having the first threshold voltage or the second threshold voltage. As such, the voltage level $V_{SGP\_LOW}$ might activate pre-configured select gates 328 at intersections of the select line 330$_2$ and the channel material structures 244$_4$-244$_7$, and deactivate pre-configured select gates 328 at intersections of the select line 330$_2$ and the channel material structures 244$_0$-244$_3$. Similarly, the voltage level $V_{SGP\_LOW}$ might activate pre-configured select gates 328 at intersections of the select line 330$_1$ and the channel material structures 244$_1$, 244$_3$, 244$_5$ and 244$_7$, and deactivate pre-configured select gates 328 at intersections of the select line 330$_1$ and the channel material structures 244$_0$, 244$_2$, 244$_4$ and 244$_6$. Furthermore, the pass voltage $V_{PASS}$ might activate pre-configured select gates 328 at intersections of the select line 330$_0$ and the channel material structures 244$_0$-244$_7$. The dummy select line 450 might receive the pass voltage $V_{PASS}$ configured to activate all of its corresponding transistors. The select lines 218$_{70}$-218$_{71}$ and 218$_{60}$-218$_{61}$ might receive a voltage $V_{SGD\_LOW}$ configured to deactivate the select gates 212 having the higher threshold voltage and to activate the select gates 212 having the lower threshold voltage. In this manner, select gates 212 at intersections of the select lines 218$_{50}$-218$_{51}$ and the channel material structure 244$_5$ might be connected to the data line 204 and enabled for programming, while the select gates 212 at intersections of the select lines 218$_{50}$-218$_{51}$ and the channel material structures 244$_0$-244$_4$, 244$_6$, and 244$_7$ might be isolated from the data line 204 and inhibited from programming. As such, upon application of the programming voltage VPGM to the select lines 218$_{50}$-218$_{51}$, those transistors corresponding to the channel material structure 244$_5$ might be programmed to have the higher threshold voltage, while those transistors corresponding to the channel material structures 244$_0$-244$_4$, 244$_6$, and 244$_7$ might be inhibited from programming and remain at their initial, e.g., erased, threshold voltage.

Following the programming of the select gates 212 corresponding to the select lines 218$_{50}$-218$_{51}$, the select gates 212 corresponding to the select lines 218$_{40}$-218$_{41}$ might be programmed. In particular, the data line 204 might receive the enable voltage $V_{EN}$. The SGD_GG control line 226 might receive the pass voltage $V_{PASS}$ configured to activate its corresponding transistors, e.g., the GG gates 222. The select lines 330$_0$ and 330$_1$ might each receive the pass voltage $V_{PASS}$ configured to activate pre-configured select gates 328 having the first threshold voltage or the second threshold voltage, and the select line 330$_2$ might receive the voltage level $V_{SGP\_LOW}$ configured to deactivate pre-configured select gates 328 having the first threshold voltage, and to activate pre-configured select gates 328 having the second threshold voltage lower than the first threshold voltage. As such, the pass voltage $V_{PASS}$ might activate pre-configured select gates 328 at intersections of the select lines 330$_0$ and 330$_1$, and the channel material structures 244$_0$-244$_7$. Similarly, the voltage level $V_{SGP\_LOW}$ might activate pre-configured select gates 328 at intersections of the select line 330$_2$ and the channel material structures 244$_4$-244$_7$, and deactivate pre-configured select gates 328 at intersections of the select line 330$_2$ and the channel material structures 244$_0$-244$_3$. The dummy select line 450 might receive the pass voltage $V_{PASS}$ configured to activate all of its corresponding transistors. The select lines 218$_{70}$-218$_{71}$, 218$_{60}$-218$_{61}$ and 218$_{50}$-218$_{51}$ might receive a voltage $V_{SGD\_LOW}$ configured to deactivate the select gates 212 having the higher threshold voltage and to activate the select gates 212 having the lower threshold voltage. In this manner, select gates 212 at intersections of the select lines 218$_{40}$-218$_{41}$ and the channel material structure 244$_4$ might be connected to the data line 204 and enabled for programming, while the select gates 212 at intersections of the select lines 218$_{40}$-218$_{41}$ and the channel material structures 244$_0$-244$_3$ and 244$_5$-244$_7$ might be isolated from the data line 204 and inhibited from programming. As such, upon application of the programming voltage VPGM to the select lines 218$_{40}$-218$_{41}$, those transistors corresponding to the channel material structure 244$_4$ might be programmed to have the higher threshold voltage, while those transistors corresponding to the channel material structures 244$_0$-244$_3$ and 244$_5$-244$_7$ might be inhibited from programming and remain at their initial, e.g., erased, threshold voltage.

Following the programming of the select gates 212 corresponding to the select lines $\mathbf{218}_{40}$-$\mathbf{218}_{41}$, the select gates 212 corresponding to the select lines $\mathbf{218}_{30}$-$\mathbf{218}_{31}$ might be programmed. In particular, the data line 204 might receive the enable voltage $V_{EN}$. The SGD_GG control line 226 might receive the pass voltage $V_{PASS}$ configured to activate its corresponding transistors, e.g., the GG gates 222. The select line $\mathbf{330}_2$ might receive the pass voltage $V_{PASS}$ configured to activate pre-configured select gates 328 having the first threshold voltage or the second threshold voltage, and the select lines $\mathbf{330}_0$ and $\mathbf{330}_1$ might receive the voltage level $V_{SGP\_LOW}$ configured to deactivate pre-configured select gates 328 having the first threshold voltage, and to activate pre-configured select gates 328 having the second threshold voltage lower than the first threshold voltage. As such, the pass voltage $V_{PASS}$ might activate pre-configured select gates 328 at intersections of the select line $\mathbf{330}_2$ and the channel material structures $\mathbf{244}_0$-$\mathbf{244}_7$. Similarly, the voltage level $V_{SGP\_LOW}$ might activate pre-configured select gates 328 at intersections of the select line $\mathbf{330}_1$ and the channel material structures $\mathbf{244}_1$, $\mathbf{244}_3$, $\mathbf{244}_5$ and $\mathbf{244}_7$, and deactivate pre-configured select gates 328 at intersections of the select line $\mathbf{330}_1$ and the channel material structures $\mathbf{244}_0$, $\mathbf{244}_2$, $\mathbf{244}_4$ and $\mathbf{244}_6$. Furthermore, the voltage level $V_{SGP\_LOW}$ might activate pre-configured select gates 328 at intersections of the select line $\mathbf{330}_0$ and the channel material structures $\mathbf{244}_2$, $\mathbf{244}_3$, $\mathbf{244}_6$ and $\mathbf{244}_7$, and deactivate pre-configured select gates 328 at intersections of the select line $\mathbf{330}_0$ and the channel material structures $\mathbf{244}_0$, $\mathbf{244}_1$, $\mathbf{244}_4$ and $\mathbf{244}_5$. The dummy select line 450 might receive the pass voltage $V_{PASS}$ configured to activate all of its corresponding transistors. The select lines $\mathbf{218}_{70}$-$\mathbf{218}_{71}$, $\mathbf{218}_{60}$-$\mathbf{218}_{61}$, $\mathbf{218}_{50}$-$\mathbf{218}_{51}$ and $\mathbf{218}_{40}$-$\mathbf{218}_{41}$ might receive a voltage $V_{SGD\_LOW}$ configured to deactivate the select gates 212 having the higher threshold voltage and to activate the select gates 212 having the lower threshold voltage. In this manner, select gates 212 at intersections of the select lines $\mathbf{218}_{30}$-$\mathbf{218}_{31}$ and the channel material structure $\mathbf{244}_4$ might be connected to the data line 204 and enabled for programming, while the select gates 212 at intersections of the select lines $\mathbf{218}_{30}$-$\mathbf{218}_{31}$ and the channel material structures $\mathbf{244}_0$-$\mathbf{244}_2$ and $\mathbf{244}_4$-$\mathbf{244}_7$ might be isolated from the data line 204 and inhibited from programming. As such, upon application of the programming voltage VPGM to the select lines $\mathbf{218}_{30}$-$\mathbf{218}_{31}$, those transistors corresponding to the channel material structure $\mathbf{244}_3$ might be programmed to have the higher threshold voltage, while those transistors corresponding to the channel material structures $\mathbf{244}_0$-$\mathbf{244}_2$ and $\mathbf{244}_4$-$\mathbf{244}_7$ might be inhibited from programming and remain at their initial, e.g., erased, threshold voltage.

Following the programming of the select gates 212 corresponding to the select lines $\mathbf{218}_{30}$-$\mathbf{218}_{31}$, the select gates 212 corresponding to the select lines $\mathbf{218}_{20}$-$\mathbf{218}_{21}$ might be programmed. In particular, the data line 204 might receive the enable voltage $V_{EN}$. The SGD_GG control line 226 might receive the pass voltage $V_{PASS}$ configured to activate its corresponding transistors, e.g., the GG gates 222. The select lines $\mathbf{330}_1$ and $\mathbf{330}_2$ might receive the pass voltage $V_{PASS}$ configured to activate pre-configured select gates 328 having the first threshold voltage or the second threshold voltage, and the select line $\mathbf{330}_0$ might receive the voltage level $V_{SGP\_LOW}$ configured to deactivate pre-configured select gates 328 having the first threshold voltage, and to activate pre-configured select gates 328 having the second threshold voltage lower than the first threshold voltage. As such, the pass voltage $V_{PASS}$ might activate pre-configured select gates 328 at intersections of the select lines $\mathbf{330}_1$ and $\mathbf{330}_2$, and the channel material structures $\mathbf{244}_0$-$\mathbf{244}_7$. Similarly, the voltage level $V_{SGP\_LOW}$ might deactivate pre-configured select gates 328 at intersections of the select line $\mathbf{330}_0$ and the channel material structures $\mathbf{244}_0$, $\mathbf{244}_1$, $\mathbf{244}_4$ and $\mathbf{244}_5$, and activate pre-configured select gates 328 at intersections of the select line $\mathbf{330}_0$ and the channel material structures $\mathbf{244}_2$, $\mathbf{244}_3$, $\mathbf{244}_6$ and $\mathbf{244}_7$. The dummy select line 450 might receive the pass voltage $V_{PASS}$ configured to activate all of its corresponding transistors. The select lines $\mathbf{218}_{70}$-$\mathbf{218}_{71}$, $\mathbf{218}_{60}$-$\mathbf{218}_{61}$, $\mathbf{218}_{50}$-$\mathbf{218}_{51}$, $\mathbf{218}_{40}$-$\mathbf{218}_{41}$ and $\mathbf{218}_{30}$-$\mathbf{218}_{31}$ might receive a voltage $V_{SGD\_LOW}$ configured to deactivate the select gates 212 having the higher threshold voltage and to activate the select gates 212 having the lower threshold voltage. In this manner, select gates 212 at intersections of the select lines $\mathbf{218}_{20}$-$\mathbf{218}_{21}$ and the channel material structure $\mathbf{244}_2$ might be connected to the data line 204 and enabled for programming, while the select gates 212 at intersections of the select lines $\mathbf{218}_{20}$-$\mathbf{218}_{21}$ and the channel material structures $\mathbf{244}_0$, $\mathbf{244}_1$ and $\mathbf{244}_3$-$\mathbf{244}_7$ might be isolated from the data line 204 and inhibited from programming. As such, upon application of the programming voltage VPGM to the select lines $\mathbf{218}_{20}$-$\mathbf{218}_{21}$, those transistors corresponding to the channel material structure $\mathbf{244}_4$ might be programmed to have the higher threshold voltage, while those transistors corresponding to the channel material structures $\mathbf{244}_0$, $\mathbf{244}_1$ and $\mathbf{244}_3$-$\mathbf{244}_7$ might be inhibited from programming and remain at their initial, e.g., erased, threshold voltage.

Following the programming of the select gates 212 corresponding to the select lines $\mathbf{218}_{20}$-$\mathbf{218}_{21}$, the select gates 212 corresponding to the select lines $\mathbf{218}_{10}$-$\mathbf{218}_{11}$ might be programmed. In particular, the data line 204 might receive the enable voltage $V_{EN}$. The SGD_GG control line 226 might receive the pass voltage $V_{PASS}$ configured to activate its corresponding transistors, e.g., the GG gates 222. The select lines $\mathbf{330}_0$ and $\mathbf{330}_2$ might receive the pass voltage $V_{PASS}$ configured to activate pre-configured select gates 328 having the first threshold voltage or the second threshold voltage, and the select line $\mathbf{330}_1$ might receive the voltage level $V_{SGP\_LOW}$ configured to deactivate pre-configured select gates 328 having the first threshold voltage, and to activate pre-configured select gates 328 having the second threshold voltage lower than the first threshold voltage. As such, the pass voltage $V_{PASS}$ might activate pre-configured select gates 328 at intersections of the select lines $\mathbf{330}_0$ and $\mathbf{330}_2$, and the channel material structures $\mathbf{244}_0$-$\mathbf{244}_7$. Similarly, the voltage level $V_{SGP\_LOW}$ might activate pre-configured select gates 328 at intersections of the select line $\mathbf{330}_1$ and the channel material structures $\mathbf{244}_1$, $\mathbf{244}_3$, $\mathbf{244}_5$ and $\mathbf{244}_7$, and deactivate pre-configured select gates 328 at intersections of the select line $\mathbf{330}_1$ and the channel material structures $\mathbf{244}_0$, $\mathbf{244}_2$, $\mathbf{244}_4$ and $\mathbf{244}_6$. The dummy select line 450 might receive the pass voltage $V_{PASS}$ configured to activate all of its corresponding transistors. The select lines $\mathbf{218}_{70}$-$\mathbf{218}_{71}$, $\mathbf{218}_{60}$-$\mathbf{218}_{61}$, $\mathbf{218}_{50}$-$\mathbf{218}_{51}$, $\mathbf{218}_{40}$-$\mathbf{218}_{41}$, $\mathbf{218}_{30}$-$\mathbf{218}_{31}$ and $\mathbf{218}_{20}$-$\mathbf{218}_{21}$ might receive a voltage $V_{SGP\_LOW}$ configured to deactivate the select gates 212 having the higher threshold voltage and to activate the select gates 212 having the lower threshold voltage. In this manner, select gates 212 at intersections of the select lines $\mathbf{218}_{10}$-$\mathbf{218}_{11}$ and the channel material structure $\mathbf{244}_1$ might be connected to the data line 204 and enabled for programming, while the select gates 212 at intersections of the select lines $\mathbf{218}_{10}$-$\mathbf{218}_{11}$ and the channel material structures $\mathbf{244}_0$ and $\mathbf{244}_2$-$\mathbf{244}_7$ might be isolated from the data line 204 and inhibited from programming. As such, upon application of the programming voltage VPGM to the select lines $\mathbf{218}_{10}$-$\mathbf{218}_{11}$, those transistors corresponding to the channel material structure $244_1$ might be programmed to have the higher threshold voltage, while those transistors corresponding to the channel material structures $244_0$ and $244_2$-$244_7$ might be inhibited from programming and remain at their initial, e.g., erased, threshold voltage.

Following the programming of the select gates 212 corresponding to the select lines $218_{10}$-$218_{11}$, the select gates 212 corresponding to the select lines $218_{00}$-$218_{01}$ might be programmed. In particular, the data line 204 might receive the enable voltage $V_{EN}$. The SGD_GG control line 226 might receive the pass voltage $V_{PASS}$ configured to activate its corresponding transistors, e.g., the GG gates 222. The select lines $330_0$-$330_2$ might receive the pass voltage $V_{PASS}$ configured to activate pre-configured select gates 328 having the first threshold voltage or the second threshold voltage. As such, the pass voltage $V_{PASS}$ might activate pre-configured select gates 328 at intersections of the select lines $330_0$-$330_2$ and the channel material structures $244_0$-$244_7$. The dummy select line 450 might receive the pass voltage $V_{PASS}$ configured to activate all of its corresponding transistors. The select lines $218_{70}$-$218_{71}$, $218_{60}$-$218_{61}$, $218_{50}$-$218_{51}$, $218_{40}$-$218_{41}$, $218_{30}$-$218_{31}$, $218_{20}$-$218_{21}$ and $218_{10}$-$218_{11}$ might receive a voltage $V_{SGD\_LOW}$ configured to deactivate the select gates 212 having the higher threshold voltage and to activate the select gates 212 having the lower threshold voltage. In this manner, select gates 212 at intersections of the select lines $218_{00}$-$218_{01}$ and the channel material structure $244_0$ might be connected to the data line 204 and enabled for programming, while the select gates 212 at intersections of the select lines $218_{00}$-$218_{01}$ and the channel material structures $244_1$-$244_7$ might be isolated from the data line 204 and inhibited from programming. As such, upon application of the programming voltage VPGM to the select lines $218_{00}$-$218_{01}$, those transistors corresponding to the channel material structure $244_0$ might be programmed to have the higher threshold voltage, while those transistors corresponding to the channel material structures $244_1$-$244_7$ might be inhibited from programming and remain at their initial, e.g., erased, threshold voltage.

As one example, the first threshold voltage of the pre-configured select gates 328 might be 3V while the second threshold voltage of the pre-configured select gates 328 might be −1V. To continue the example, the programmed threshold voltage of the select gates 212 might be 4V and the initial threshold voltage might be −1V. In this example, $V_{SGP\_LOW}$ and $V_{SGD\_LOW}$ might be 1V, $V_{PASS}$ might be 7V, and VPGM might be 18V. Alternatively, all select gates 212 at the intersections of the select lines 218 and the channel material structures $244_0$-$244_3$ might be programmed to a positive threshold voltage, e.g., 2V, as their initial threshold voltage prior to programming of the select gates 212 by sub-blocks of memory cells as described. In such an embodiment, $V_{SGD\_LOW}$ might be increased to 3V, for example.

Figure 6B:
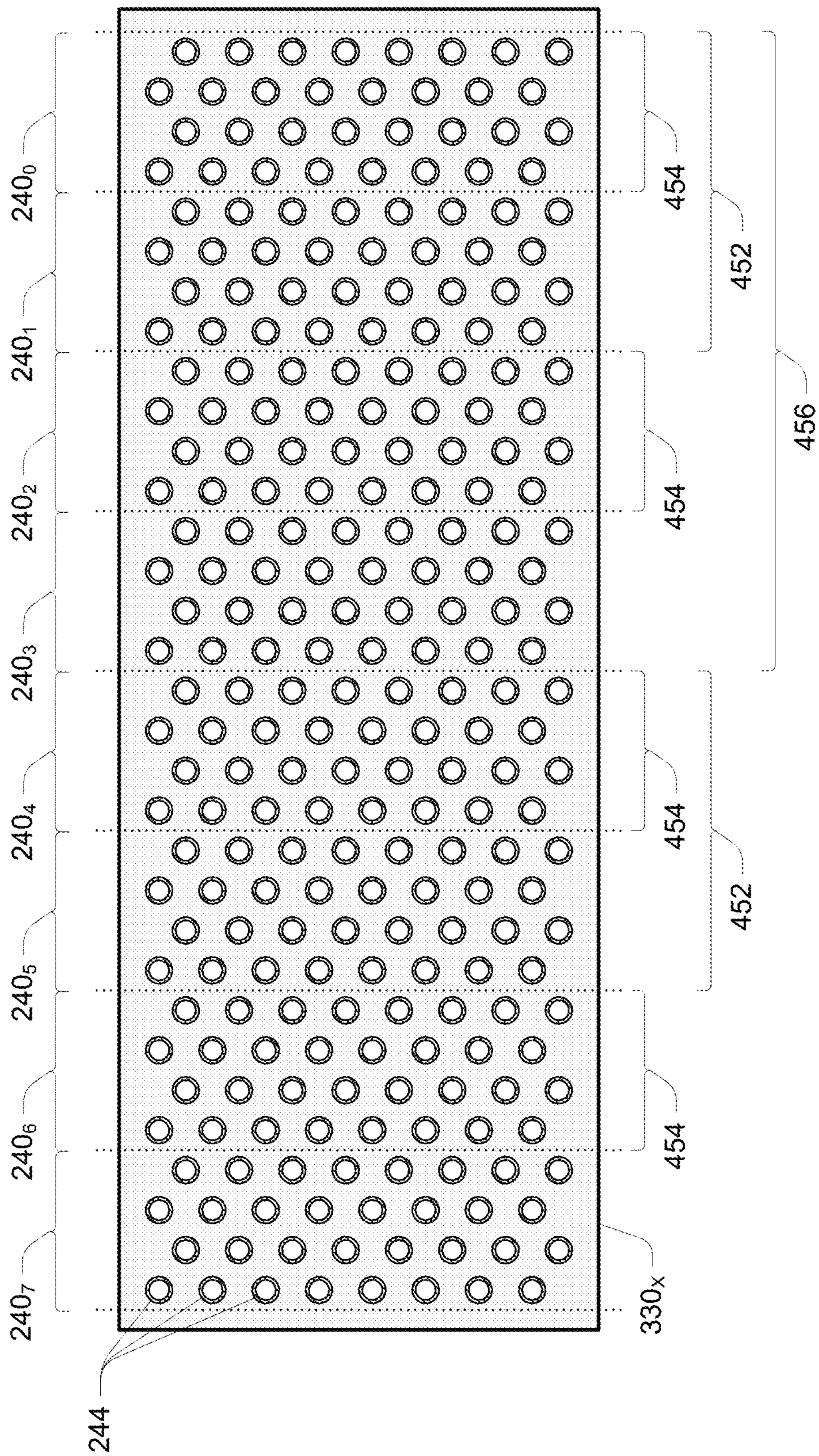
FIG. 6B depicts a representation of a top view of a section of an array of memory cells including a structure of a type similar to that depicted in FIG. 6A.

FIG. 6B depicts a representation of a top view of a section of an array of memory cells including a structure of a type similar to that depicted in FIG. 6A. FIG. 6B might depict a distribution of channel material structures 244 throughout the select lines 330, where select line $330_X$ might represent any one of the select lines $330_0$-$330_2$. In FIG. 6B, each channel material structure 244 of the sub-blocks of memory cells $240_0$, $240_1$, $240_4$ and $240_5$ might contain a respective doped section 452 as depicted in FIG. 6A, each channel material structure 244 of the sub-blocks of memory cells $240_0$, $240_2$, $240_4$ and $240_6$ might contain a respective doped section 454 as depicted in FIG. 6A, and each channel material structure 244 of the sub-blocks of memory cells $240_0$-$240_3$ might contain a respective doped section 456 as depicted in FIG. 6A.

Figure 7A:
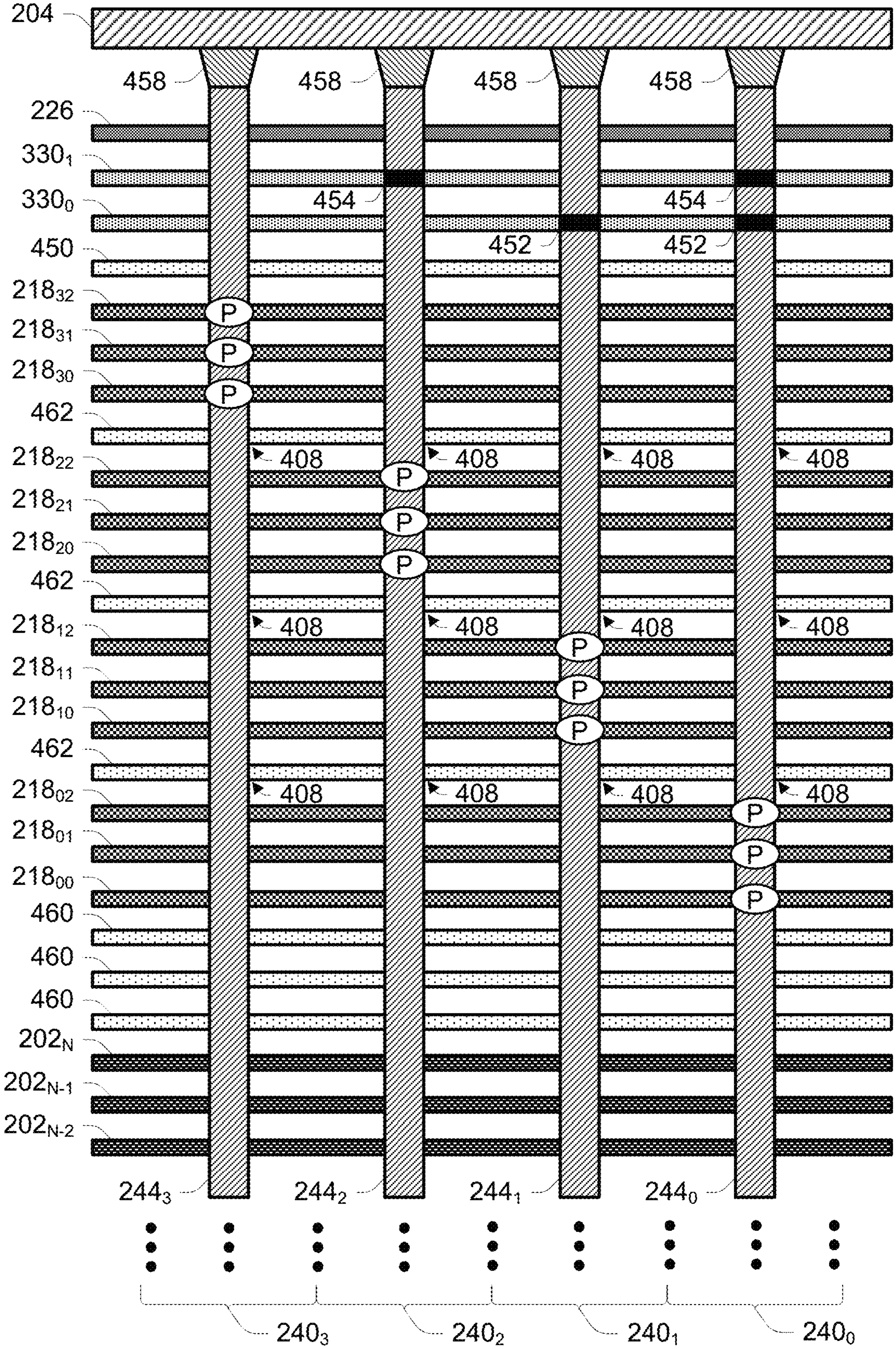
FIGS. 7A-7F depict conceptualized representations of cross-sectional views of portions of an array structure in accordance with additional embodiments as could be used in a memory of the type described with reference to FIG. 1.

FIGS. 7A-7F depict conceptualized representations of cross-sectional views of portions of an array structure in accordance with additional embodiments as could be used in a memory of the type described with reference to FIG. 1. Like numbered elements in FIGS. 7A-7F correspond to the description as provided with respect to FIG. 4A. FIG. 7A depicts an array structure that could be used in cases where a block of memory cells contains four sub-blocks of memory cells. The example of FIG. 7A differs from the structure of FIG. 5A by depicting solid channel material structures 244, and the further inclusion of dummy select lines 462 located between the select lines 218 corresponding to each of the sub-blocks of memory cells 240. Programming of select gates 212 might proceed in a manner similar to that discussed with reference to FIG. 5A. Dummy select lines 462 could be used in any embodiment to optionally mitigate E-field and reduce program disturb between the transistors connected to select lines 218 corresponding to one sub-block of memory cells 240 (e.g., select lines $218_{30}$-$218_{32}$ corresponding to the sub-block of memory cells $240_3$), and the transistors connected to select lines 218 corresponding to an adjacent sub-block of memory cells 240 (e.g., select lines $218_{20}$-$218_{22}$ corresponding to the sub-block of memory cells $240_2$). Transistors 408 formed at intersections of a dummy select line 462 and a channel material structure 244 might utilize a structure similar to (e.g., the same as) the memory cells 208 of FIG. 3A.

Figure 7B:
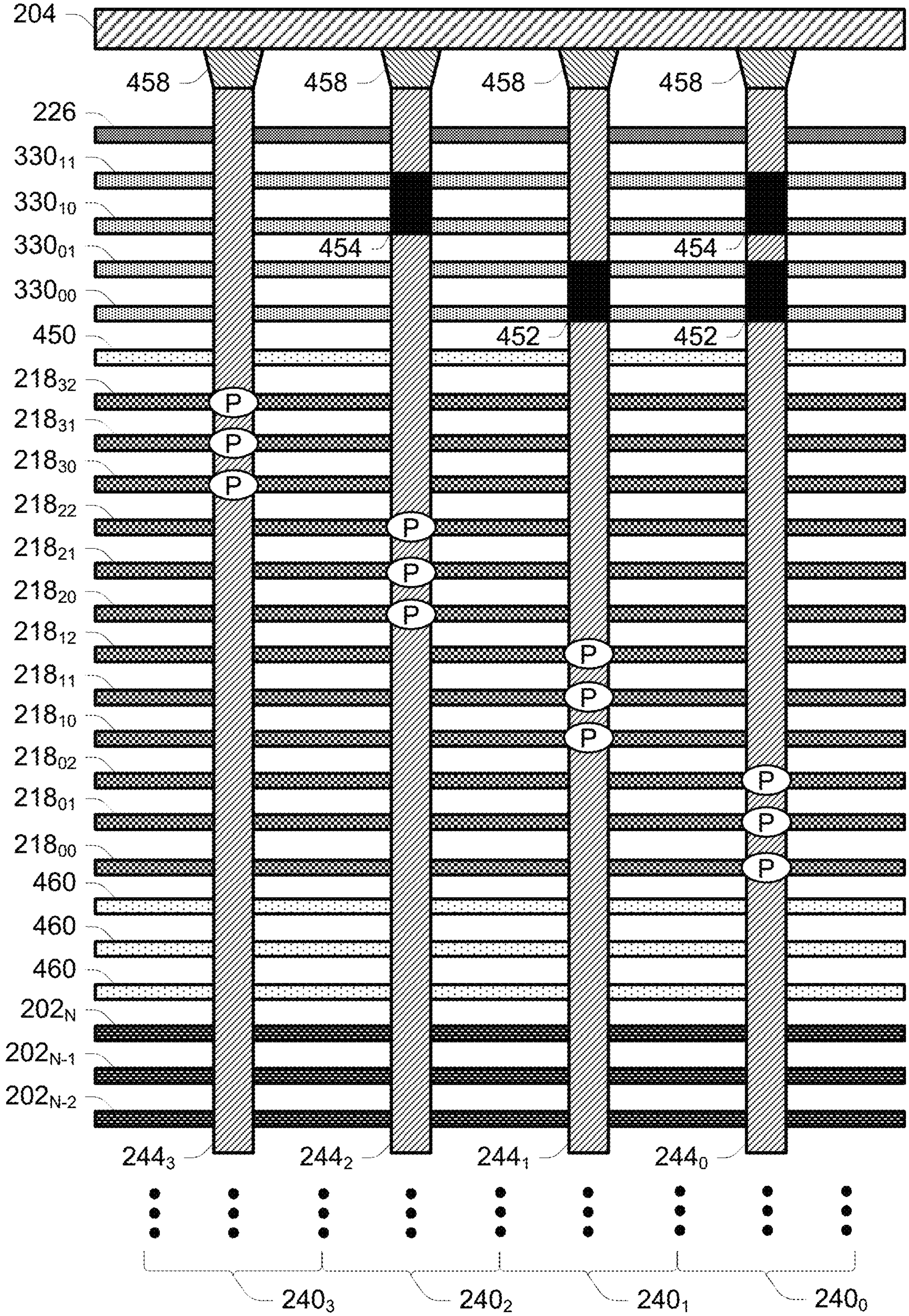

FIG. 7B depicts an array structure that could be used in cases where a block of memory cells contains four sub-blocks of memory cells. The example of FIG. 7B differs from the structure of FIG. 5A by depicting solid channel material structures 244, and the further inclusion of redundant select lines 330. Programming of select gates 212 might proceed in a manner similar to that discussed with reference to FIG. 5A, where voltage levels applied to select line $330_0$ in FIG. 5A would be applied to select lines $330_{00}$ and $330_{01}$ in FIG. 7B, and where voltage levels applied to select line $330_1$ in FIG. 5A would be applied to select lines $330_{10}$ and $330_{11}$ in FIG. 7B. Redundant select lines 330 might be used to increase levels of cut-off while inhibiting programming for some channel material structures 244. In addition, redundant select lines 330 might mitigate any failure rates resulting from inaccurate placement of the doped sections 452 or 454 in the channel material structure 244 for a given pre-configured select gate 328. For example, even if only one of the pre-configured select gates 328 formed at the intersections of the select lines $330_{00}$ and $330_{01}$ and the channel material structures $244_0$ and $244_1$ has the doped section 452 placed in the body of those pre-configured select gates 328, programming of the select gates 212 might still be possible.

In FIG. 7B, pre-configured select gates 328 formed at intersections of a particular channel material structure 244 and the select lines $330_{00}$, $330_{01}$, $330_{10}$ and $330_{11}$ might be thought of as a first set of field-effect transistors formed at intersections of the particular channel material structure 244 and the select lines $330_{00}$ and $330_{10}$, and a second set of field-effect transistors formed at intersections of the particular channel material structure 244 and the select lines $330_{01}$ and $330_{11}$, with both being fabricated to have a same binary permutation of two threshold voltages. The first set of field-effect transistors and the second set of field-effect transistors might be interleaved, as depicted in FIG. 7B.

Figure 7C:
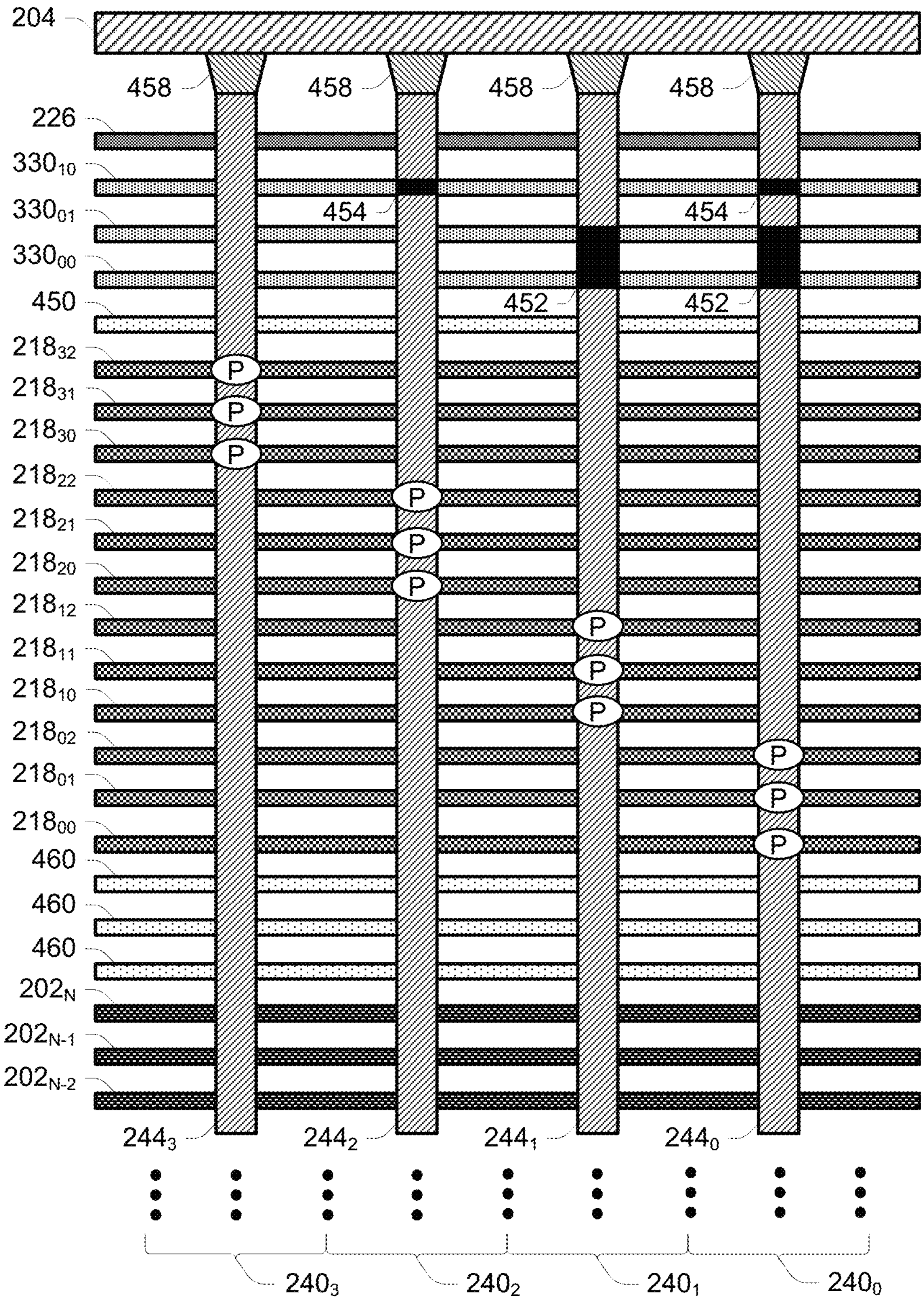

FIG. 7C depicts an array structure that could be used in cases where a block of memory cells contains four sub-blocks of memory cells. The example of FIG. 7C differs from the structure of FIG. 7B by depicting redundant select lines 330 for only one of the doped sections. Programming of select gates 212 might proceed in a manner similar to that discussed with reference to FIG. 5A, where voltage levels applied to select line $330_0$ in FIG. 5A would be applied to select lines $330_{00}$ and $330_{01}$ in FIG. 7C, and where voltage levels applied to select line $330_1$ in FIG. 5A would be applied to select line $330_{10}$ in FIG. 7C. Redundant select lines 330 might be used to increase levels of cut-off while inhibiting programming for some channel material structures 244. In addition, redundant select lines 330 might mitigate any failure rates resulting from inaccurate placement of the doped sections 452 or 454 in the channel material structure 244 for a given pre-configured select gate 328. For example, even if only one of the pre-configured select gates 328 formed at the intersections of the select lines $330_{00}$ and $330_{01}$ and the channel material structures $244_0$ and $244_1$ has the doped section 452 placed in the body of those pre-configured select gates 328, programming of the select gates 212 might still be possible.

In FIG. 7C, pre-configured select gates 328 formed at intersections of a particular channel material structure 244 and the select lines $330_{00}$, $330_{01}$ and $330_{10}$ might be thought of as a first set of field-effect transistors formed at intersections of the particular channel material structure 244 and the select lines $330_{00}$ and $330_{10}$, and a second set of field-effect transistors formed at an intersection of the particular channel material structure 244 and the select line $330_{01}$, with the second set of field-effect transistors being fabricated to have a same relative threshold voltage as one of the field-effect transistors of the first set of field-effect transistors, e.g., the pre-configured select gate 328 formed at the intersection of the particular channel material structure 244 and the select line $330_{00}$. The first set of field-effect transistors and the second set of field-effect transistors might be interleaved, as depicted in FIG. 7C.

Figure 7D:
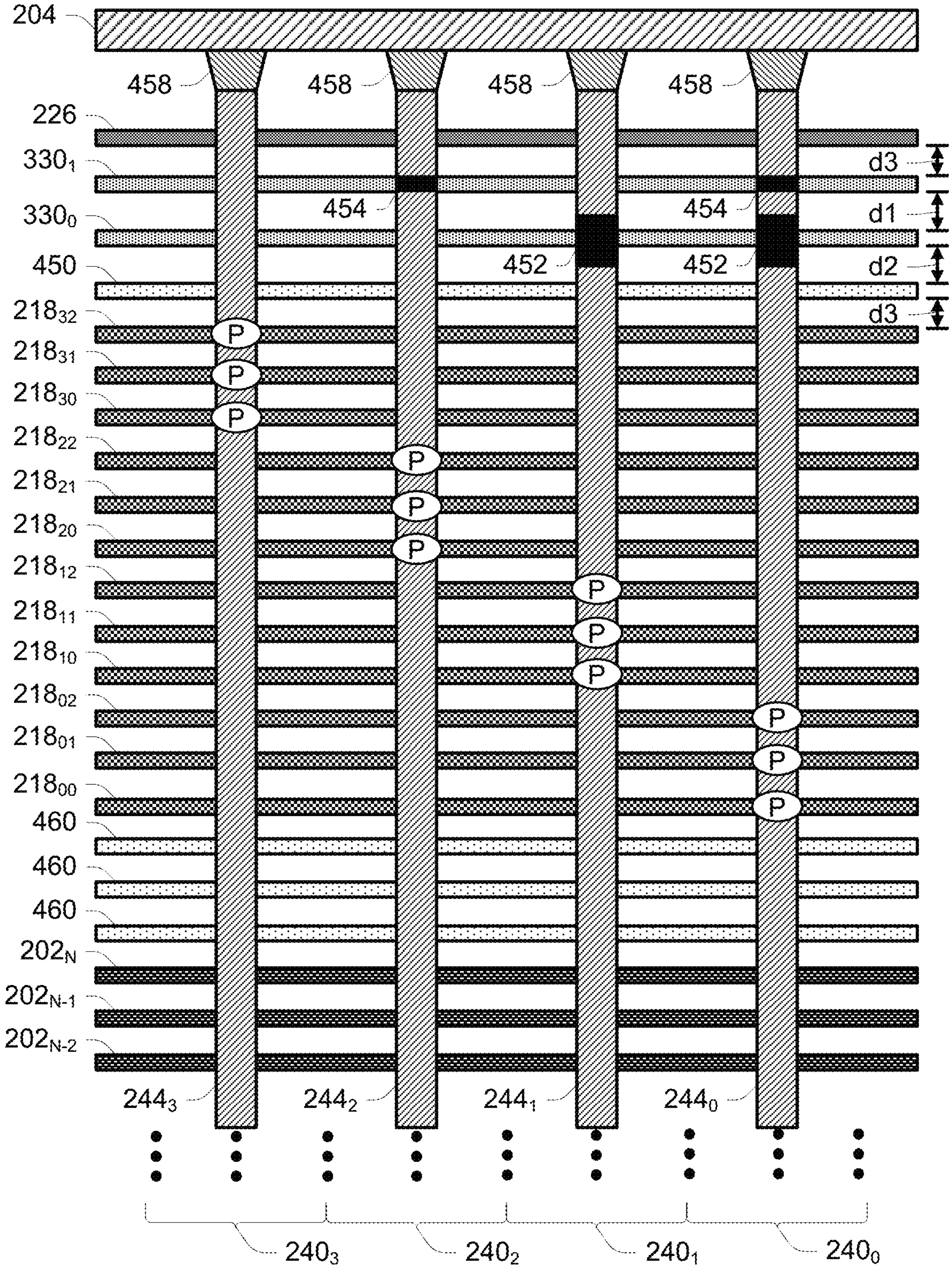

FIG. 7D depicts an array structure that could be used in cases where a block of memory cells contains four sub-blocks of memory cells. The example of FIG. 7D differs from the structure of FIG. 5A by depicting solid channel material structures 244, and the further inclusion of varied spacing around select lines 330. Programming of select gates 212 might proceed in a manner similar to that discussed with reference to FIG. 5A. FIG. 7D depicts a distance d1 between the select lines $330_0$ and $330_1$, and a distance d2 between the select line $330_0$ and the dummy select line 450. Spacing among other select lines, control lines and access lines might have a distance, e.g., distance d3, that is less than the distance d1 and/or less than the distance d2. While the distance d1 might equal the distance d2, they could be different. As doped sections are formed deeper in the channel material structures 244, their variability might increase. As such, increased spacing might mitigate failure rates resulting from the extension of a doped section 452 and/or 454 to an unintended transistor body.

Figure 7E:
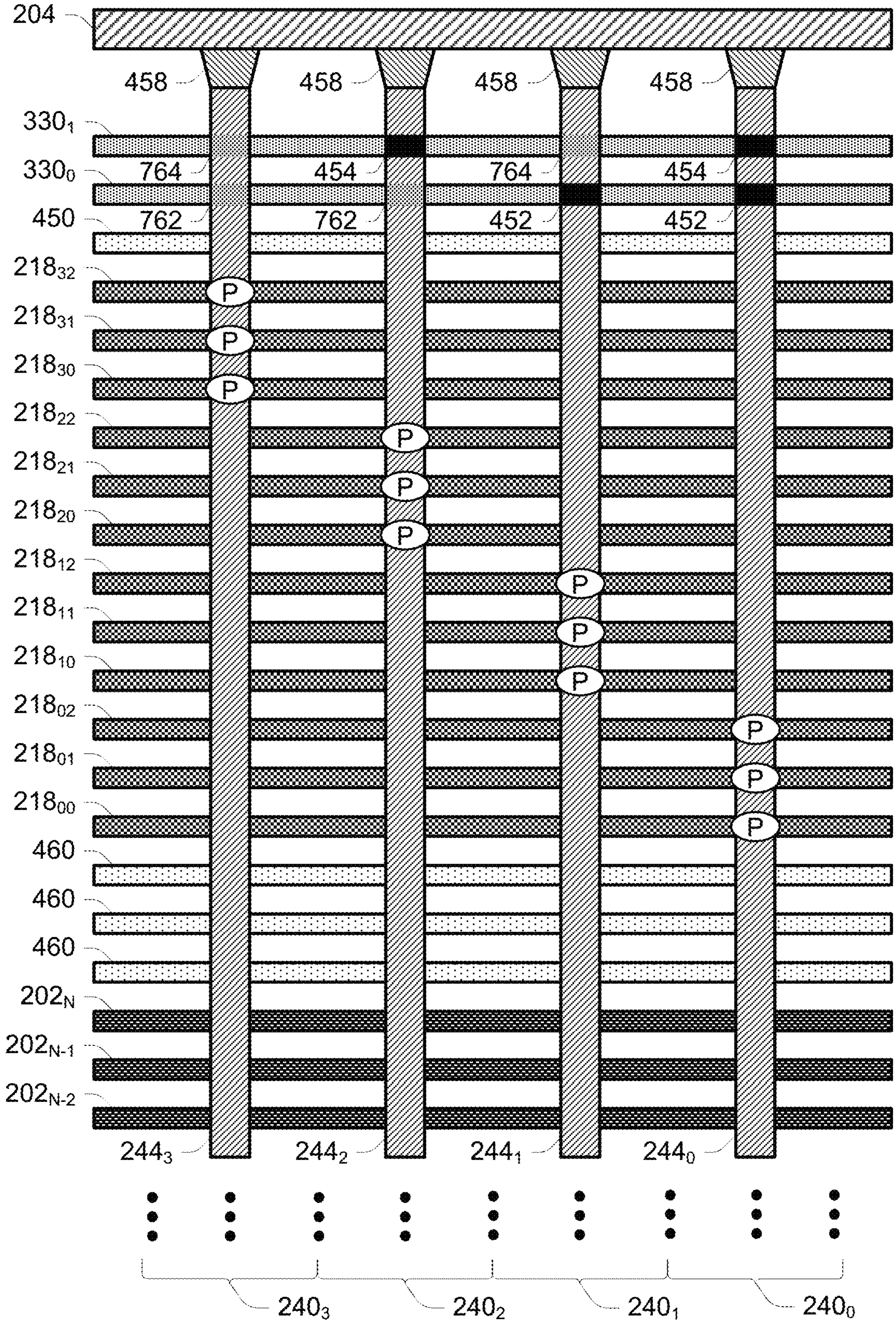

FIG. 7E depicts an array structure that could be used in cases where a block of memory cells contains four sub-blocks of memory cells. The example of FIG. 7E differs from the structure of FIG. 5A by depicting solid channel material structures 244, the further inclusion of doped sections 762 and 764, and the elimination of the GG gates 222 and their control line 226. The doped sections 762 might have a lower concentration of an impurity than the doped sections 452, and the doped sections 764 might have a lower concentration of an impurity than the doped sections 454. In this manner, pre-configured select gates 328 having a doped section 762 might have a lower threshold voltage than pre-configured select gates 328 having a doped section 452, but might also have a positive threshold voltage. Similarly, pre-configured select gates 328 having a doped section 764 might have a lower threshold voltage than pre-configured select gates 328 having a doped section 454, but might also have a positive threshold voltage. As such, the pre-configured select gates 328 might provide the functionality of a GG gate 222, particularly during erase operations. The doped sections 762 and 764 might be formed in a manner similar to that described with reference to the doped sections 452 and 454, respectively, but with complementary masks to expose the appropriate channel material structures 244 for doping. The doped sections 762 and 764 might have different, e.g., lower, impurity levels than the doped sections 452 and 454, respectively. For example, the doped sections 452 or 454 might have an impurity concentration of 2E19/cm^3, while the doped sections 762 or 764 might have an impurity concentration of 1E19/cm^3.

Figure 7F:
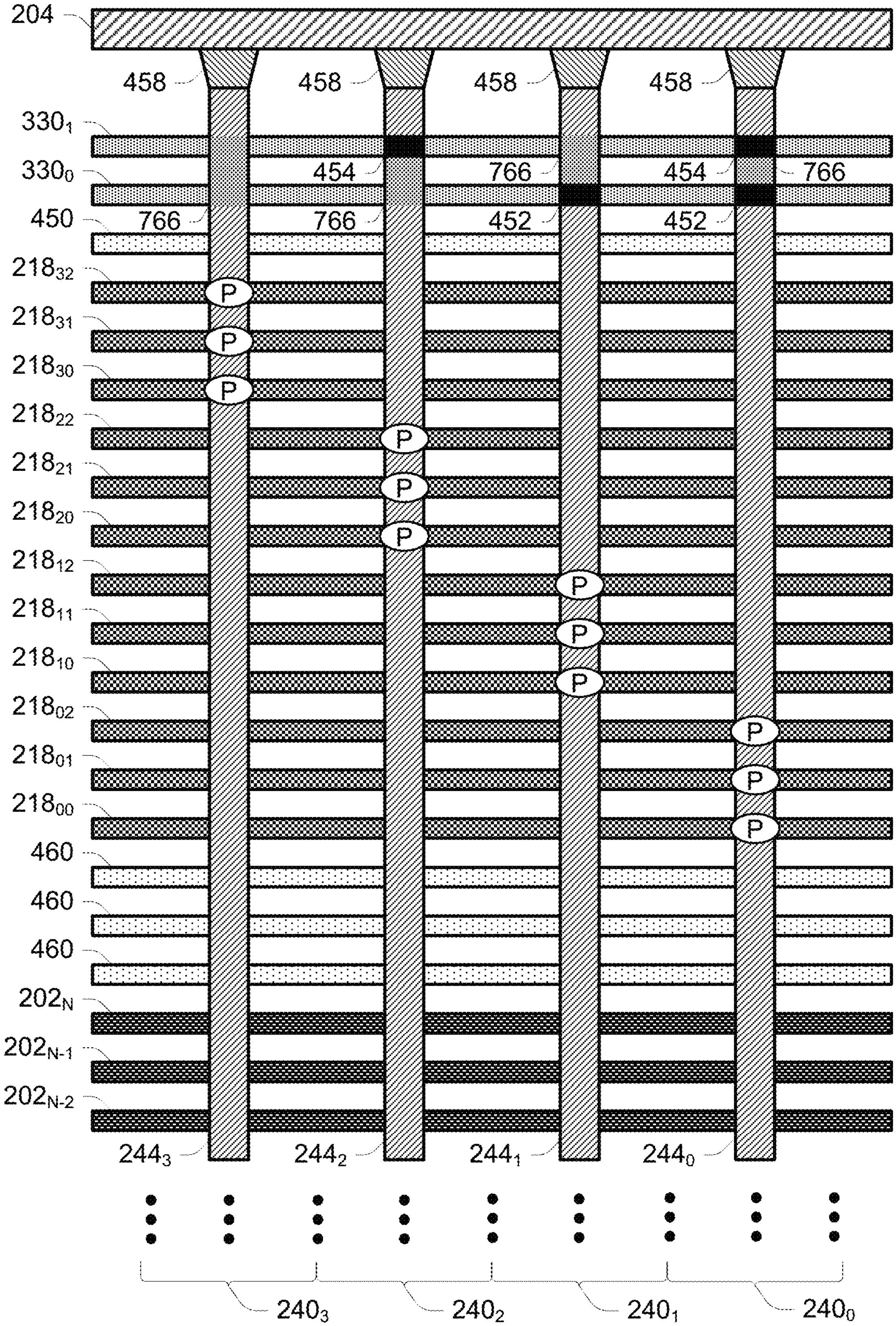

FIG. 7F depicts an array structure that could be used in cases where a block of memory cells contains four sub-blocks of memory cells. The example of FIG. 7F differs from the structure of FIG. 5A by depicting solid channel material structures 244, the further inclusion of doped sections 766, and the elimination of the GG gates 222 and their control line 226. The doped sections 766 might have a lower concentration of an impurity than the doped sections 452 and 454. The channel material structures 244 for each of the sub-blocks of memory cells 240 might contain a doped section 766 spanning across each of the select lines 330. In this manner, formation of the doped sections 766 could be formed without masking off any of the channel material structures 244. Following formation of the doped sections 452 and 454, the pre-configured select gates 328 could have threshold voltages similar to that described with reference to FIG. 7E, along with the associated benefits. The doped sections 766 might have different, e.g., lower, impurity levels than the doped sections 452 and 454. For example, the doped sections 452 or 454 might have an impurity concentration of 2E19/cm^3, while the doped sections 766 might have an impurity concentration of 1E19/cm^3.

Figure 8:
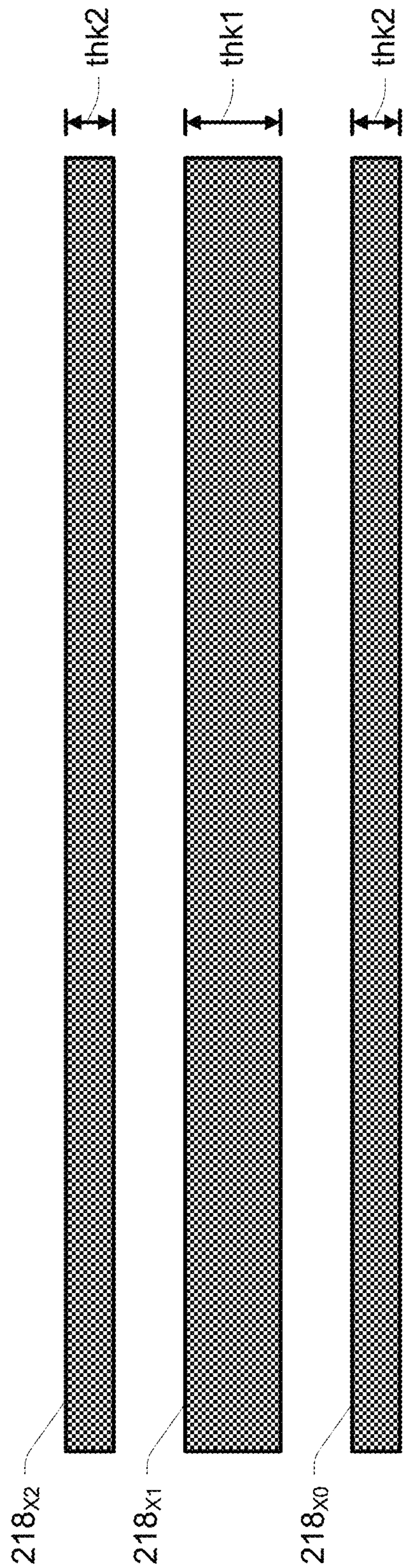
FIG. 8 depicts a use of varying select line thicknesses for use with embodiments.

FIG. 8 depicts a use of varying select line thicknesses for use with embodiments. For embodiments utilizing more than two select lines 218 for each sub-block of memory cells 240, the inner select lines 218 might be thicker than outer select lines 218. FIG. 8 depicts a grouping of three select lines 218, e.g., select lines $218_{X0}$, $218_{X1}$ and $218_{X2}$. With reference to FIG. 5A as an example, X might represent 0, 1, 2 and/or 3. As depicted, the inner select line $218_{X1}$ might have a thickness thk1 that is greater than a thickness thk2 of the outer select lines $218_{X0}$ and $218_{X2}$. A thicker inner select line 218 might enhance carrier injection during programming and reduce short channel effects, and might produce a higher threshold voltage in the inner select lines 218 than in the edge select lines 218 during programming.

FIGS. 9A-9E depict conceptualized representations of cross-sectional views of portions of an array structure in accordance with alternate embodiments as could be used in a memory of the type described with reference to FIG. 1. While prior embodiments utilized corresponding sets of select lines 218 for each sub-block of memory cells 240, this can lead to larger numbers of select lines 218 as the number of sub-blocks of memory cells 240 per block of memory cells 242 increases. Also, prior embodiments might not facilitate providing for threshold voltages of select gates 212 beyond a programmed state or an erased state, and there may be advantages to having two levels of programmed states, e.g., two different positive threshold voltages, during erase operations. To mitigate this increase in the number of select lines 218, and to facilitate programming of each select gate 212 to a desired threshold voltage, a coded binary approach might be used. FIGS. 9A-9E provide examples of such embodiments.

Figure 9A:
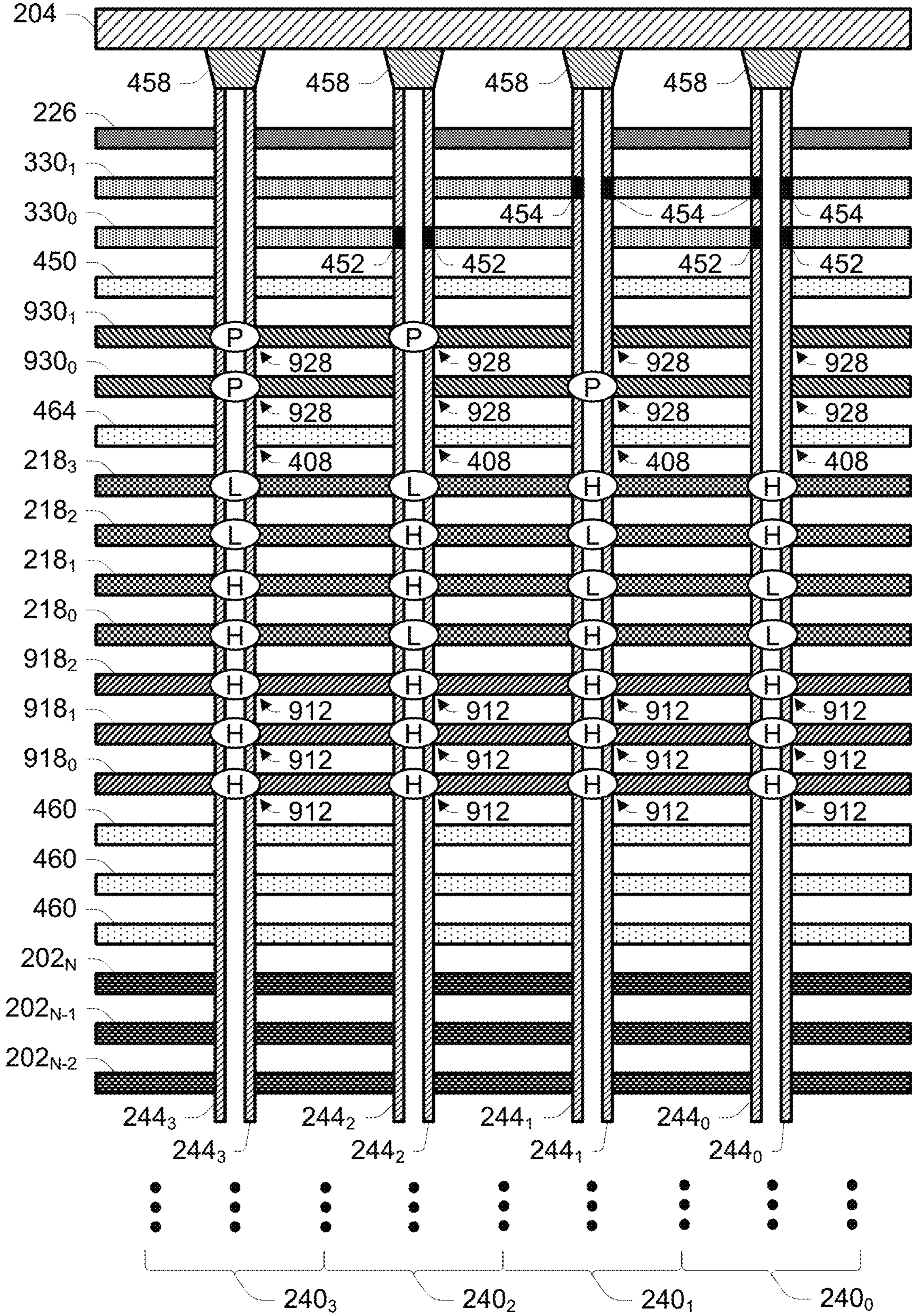
FIGS. 9A-9E depict conceptualized representations of cross-sectional views of portions of an array structure in accordance with alternate embodiments as could be used in a memory of the type described with reference to FIG. 1.

The array structure of FIG. 9A includes select lines $330_0$ and $330_1$, similar to the example of FIG. 5A. However, the array structure of FIG. 9A further includes complementary select lines $930_0$ and $930_1$. Complementary select gates 928 formed at intersections of the select lines $930_0$ and $930_1$ and the channel material structures 244 might have threshold voltages that are complementary to the threshold voltages of transistors (e.g., select gates 328) formed at intersections of the select lines $330_0$ and $330_1$ and the channel material structures 244. Dummy select line 464 could be used to optionally mitigate E-field and reduce program disturb between the transistors connected to select lines 218, and the transistors connected to adjacent select line 930. Complementary select gates (e.g., transistors) 928 formed at intersections of a channel material structure 244 and a complementary select line 930 might utilize a structure similar to (e.g., the same as) the memory cells 208 of FIG. 3A. Transistors 408 formed at intersections of a channel material structure 244 and dummy select line 464 might utilize a structure similar to (e.g., the same as) the memory cells 208 of FIG. 3A.

A transistor (e.g., pre-configured select gate 328) formed at an intersection of a select line 330 and a channel material structure 244 might have either a threshold voltage lower than a first voltage level and higher than a second voltage level, e.g., having a doped section 452 or 454, or a threshold voltage lower than the second voltage level, e.g., not having a doped section 452 or 454, or having a doped section having a lower concentration of an impurity than a doped section 452 or 454. The first instance, e.g., the higher threshold voltage, might be deemed a logical 1 while the second instance, e.g., the lower threshold voltage, might be deemed a logical 0. Similarly, a transistor (e.g., complementary select gate 928) formed at an intersection of a select line 930 and a channel material structure 244 might have either a threshold voltage lower than a third voltage level and higher than a fourth voltage level, e.g., programmed, or a threshold voltage lower than the fourth voltage level, e.g., unprogrammed. Note that while the first voltage level and the third voltage level might be equal, and the second voltage level and the fourth voltage level might be equal, there is no need for either condition to be satisfied. Like the transistors formed at intersections of a select line 330 and a channel material structure 244, a transistor formed at an intersection of a select line 930 and a channel material structure 244 might be deemed a logical 1 if it has the higher threshold voltage, e.g., programmed, and might be deemed a logical 0 if the has the lower threshold voltage, e.g., unprogrammed.

Considering the example of FIG. 9A, of the set of select lines $330_0$ and $330_1$ and the set of select lines $930_0$ and $930_1$, the select line $330_0$ might correspond to the select line $930_0$ as its complement, and the select line $330_1$ might correspond to the select line $930_1$ as its complement. As such, transistors connected to the select line $930_0$ might have complementary threshold voltages to the threshold voltages of transistors connected to its corresponding select line $330_0$, and transistors connected to the select line $930_1$ might have complementary threshold voltages to the threshold voltages of transistors connected to its corresponding select line $330_1$. As the logical states of the threshold voltages of the transistors at intersections of the select line $330_0$ and channel material structures $244_3$, $244_2$, $244_1$ and $244_0$ are 1, 0, 1 and 0, respectively, the logical states of the threshold voltages of the transistors at intersections of its corresponding select line $930_0$ and channel material structures $244_3$, $244_2$, $244_1$ and $244_0$ might be 0, 1, 0 and 1, respectively. Similarly, as the logical states of the threshold voltages of the transistors at intersections of the select line $330_1$ and channel material structures $244_3$, $244_2$, $244_1$ and $244_0$ are 1, 1, 0 and 0, respectively, the logical states of the threshold voltages of the transistors at intersections of its corresponding select line $930_1$ and channel material structures $244_3$, $244_2$, $244_1$ and $244_0$ might be 0, 0, 1 and 1, respectively. Note that a select line 330 need not correspond to a select line 930 in the same relative positioning. For example, the select line $330_0$ could instead correspond to the select line $930_1$ and the select line $330_1$ could instead correspond to the select line $930_0$ provided that the complementary nature of the threshold voltages for the corresponding select line 930 is maintained, e.g., programming transistors 928 connected to select line $930_0$ as depicted in FIG. 9A for select line $930_1$, and programming transistors 928 connected to select line $930_1$ as depicted in FIG. 9A for select line $930_0$.

The array structure of FIG. 9A might further include select lines 918, e.g., select lines $918_0$-$918_2$, that might optionally be used in any embodiment to provide additional cut-off when no sub-block of memory cells 240 of a block of memory cells is selected for an access operation, and might further provide additional cut-off in unselected sub-blocks of memory cells 240 of the block of memory cells selected for the access operation. Select gates 912 formed at intersections of a channel material structure 244 and a select line 918 might utilize a structure similar to (e.g., the same as) the memory cells 208 of FIG. 3A.

After fabrication of the pre-configured select gates 328, the complementary select gates 928 might be programmed to have complementary threshold voltages. The complementary select gates 928 at intersections of the select line $930_0$ with channel material structures $244_1$ and $244_3$ might be programmed by concurrently enabling them for programming while inhibiting transistors of the channel material structures $244_0$ and $244_2$ from programming. This might be accomplished by applying pass voltages to the control line 226, the select line $330_1$, the select line 450, and the select line $930_1$, and applying a voltage level to the select line $330_0$ configured to activate pre-configured select gates 328 having the lower threshold voltage and to deactivate pre-configured select gates 328 having the higher threshold voltage. A programming voltage might then be applied to the select line $930_0$ to program the complementary select gates 928 at intersections with the channel material structures $244_1$ and $244_3$.

The complementary select gates 928 at intersections of the select line $930_1$ with channel material structures $244_2$ and $244_3$ might be programmed by concurrently enabling them for programming while inhibiting transistors of the channel material structures $244_0$ and $244_1$ from programming. This might be accomplished by applying pass voltages to the control line 226, the select line $330_0$, and the select line 450, and applying a voltage level to the select line $330_1$ configured to activate pre-configured select gates 328 having the lower threshold voltage and to deactivate pre-configured select gates 328 having the higher threshold voltage. A programming voltage might then be applied to the select line $930_1$ to program the complementary select gates 928 at intersections with the channel material structures $244_2$ and $244_3$.

Subsequent to programming the complementary select gates 928, the select gates 212, and any optional select gates 912, might be programmed. In particular, subsequent to programming the complementary select gates 928, each channel material structure 244 might be individually enabled for programming. For example, voltage levels corresponding to the logic levels low, low, high and high for the select lines $330_1$, $330_0$, $930_1$ and $930_0$, respectively, could be used to connect select gates 212 formed at intersections of the channel material structure $244_3$ to the data line 204 while isolating select gates 212 formed at intersections of the channel material structures $244_0$, $244_1$ and $244_2$ from the data line 204; voltage levels corresponding to the logic levels low, high, high and low for the select lines $330_1$, $330_0$, $930_1$ and $930_0$, respectively, could be used to connect select gates 212 formed at intersections of the channel material structure $244_2$ to the data line 204 while isolating select gates 212 formed at intersections of the channel material structures $244_0$, $244_1$ and $244_3$ from the data line 204; voltage levels corresponding to the logic levels high, low, low and high for the select lines $330_1$, $330_0$, $930_1$ and $930_0$, respectively, could be used to connect select gates 212 formed at intersections of the channel material structure $244_1$ to the data line 204 while isolating select gates 212 formed at intersections of the channel material structures $244_0$, $244_2$ and $244_3$ from the data line 204; and voltage levels corresponding to the logic levels high, high, low and low for the select lines $330_1$, $330_0$, $930_1$ and $930_0$, respectively, could be used to connect select gates 212 formed at intersections of the channel material structure $244_0$ to the data line 204 while isolating select gates 212 formed at intersections of the channel material structures $244_1$, $244_2$ and $244_3$ from the data line 204.

The select gates 212 connected to select lines $218_0$-$218_3$ might be programmed to have threshold voltages having the same binary permutation of two threshold voltages as their corresponding pre-configured select gates 328 and complementary select gates 928 to which they are serially connected. For example, where the pre-configured select gates 328 connected to the select lines $330_1$ and $330_0$, and the complementary select gates 928 connected to the select lines $930_1$ and $930_0$, have threshold voltages corresponding to the logic levels low, low, high and high as depicted in FIG. 9A, the select gates 212 connected to the select lines $218_3$, $218_2$, $218_1$ and $218_0$, might have the logic levels low, low, high and high, respectively. As such, the select gate 212 connected to the select line $218_3$ might be programmed to have a low threshold voltage, e.g., 2V; the select gate 212 connected to the select line $218_2$ might be programmed to have the low threshold voltage; the select gate 212 connected to the select line $218_1$ might be programmed to have a high threshold voltage, e.g., 4V; and the select gate 212 connected to the select line $218_0$ might be programmed to have the high threshold voltage. Programming of select gates 212 might utilize an iterative process of applying a programming pulse to a programmable transistor and verifying if that transistor has reached a desired threshold voltage in response to that programming pulse, and repeating that iterative process until that transistor passes the verification. Note that for some embodiments, the low threshold voltage might be an initial threshold voltage, which might include remaining unprogrammed, e.g., remaining in an erased state.

Programming of threshold voltages of the select gates 212, and optional select gates 912, might proceed sequentially from a transistor closest to the common source 216, e.g., a select gate 912 connected to select line $918_0$, to a transistor closest to the data line 204, e.g., a select gate 212 connected to select line $218_3$, as is typical. Programming of threshold voltages of the select gates 212, and optional select gates 912, for one channel material structure 244 might be completed prior to the programming of threshold voltages of the select gates 212, and optional select gates 912, for a different channel material structure 244.

Following programming of the select gates 212, each sub-block of memory cells 240 can be individually selected, e.g., connected to the data line 204, by applying pass voltages to any line between the select lines 218 and the data line 204, and by applying voltage levels matching the logic levels of the programmed threshold voltages of the select gates 212 for the selected sub-block of memory cells 240. As such, programming of memory cells of a particular sub-block of memory cells 240 could proceed using an iterative process as previously described. For example, while a programming voltage is applied to the control gate of a selected memory cell of the particular sub-block of memory cells 240, pass voltages might be applied to any line between the select lines 218 and the data line 204 (e.g., control lines 226, select lines 330, dummy select lines 450/462/464, complementary select lines 930, etc.), voltage levels might be applied to the select lines 218 that correspond to the logic levels of the programmed threshold voltages of the select gates 212 to access the particular sub-block of memory cells 240 and isolate the remaining sub-blocks of memory cells 240 sharing the select lines 218, and pass voltages might be applied to any other lines (e.g., dummy select lines 460, select lines 918, access lines 202 to other memory cells, etc.) that are between the selected memory cell and the data line 204.

During a programming operation, if the data line 204 receives an inhibit voltage, e.g., a supply voltage $V_{CC}$, the select gates 912 formed at intersections of the channel material structures 244 and the select lines 918 might be deactivated as in a conventional NAND program inhibit scenario, resulting in channel boosting of the memory cells, and a resulting inhibit of programming of memory cells receiving the programming voltage. If the data line 204 receives an enable voltage, e.g., a reference potential $V_{SS}$ or ground, the select gates 912 formed at intersections of a channel material structure 244 of a selected sub-block of memory cells 240 and the select lines 918 might be activated to permit programming of its memory cell selected for the programming operation. However, the select gates 912 formed at intersections of the channel material structures 244 of the corresponding unselected sub-blocks of memory cells 240 and the select lines 918 might be deactivated. In particular, with a transistor (e.g., a select gate 212, or optionally a complementary select gate 328, and/or a complementary select gate 928) between the select gates 912 of an unselected sub-block of memory cells 240 and the data line 204 receiving a voltage level at its control gate below its threshold voltage, the potential of the channel region between the select gates 912 and the deactivated transistor might be expected to quickly rise, causing a back-bias effect to deactivate the select gates 912 of the unselected sub-blocks of memory cells 240 despite receiving a pass voltage, similar to a conventional NAND program inhibit scenario, along with the resulting channel boosting of the memory cells, and inhibiting of programming of the corresponding memory cells receiving the programming voltage. The additional cut-off afforded by the deactivated select gates 912 of the unselected sub-blocks of memory cells 240 might facilitate the use of a single transistor (e.g., a single select gate 212) being deactivated in each of the unselected sub-blocks of memory cells 240 during programming of a memory cell of a selected sub-block of memory cells 240 sharing a same data line 204.

Reading of memory cells of a particular sub-block of memory cells 240 could proceed by applying a read voltage to the access line 202 connected to a selected memory cell of the particular sub-block of memory cells 240, applying voltage levels to the select lines 218 that correspond to the logic levels of the programmed threshold voltages of the select gates 212 to access the particular sub-block of memory cells 240 and isolate the remaining sub-blocks of memory cells 240 sharing the select lines 218, and applying pass voltages to each remaining line (e.g., control lines 226, select lines 330, dummy select lines 450/460/462/464, select lines 918, complementary select lines 930, access lines 202 to other memory cells, select lines 214, control lines 224, etc.) that are between the data line 204 and the common source 216 for the particular sub-block of memory cells 240. In this manner, the existence or lack of current flow through the particular sub-block of memory cells 240, e.g., from the data line 204 to the common source 216, could indicate whether the selected memory cells is activated or deactivated, respectively, in response to the read voltage, thus providing information regarding its data state. Due to the lower potentials involved in a read operation versus a programming operation, no additional cut-off from select gates 912 would be necessary.

Figure 9B:
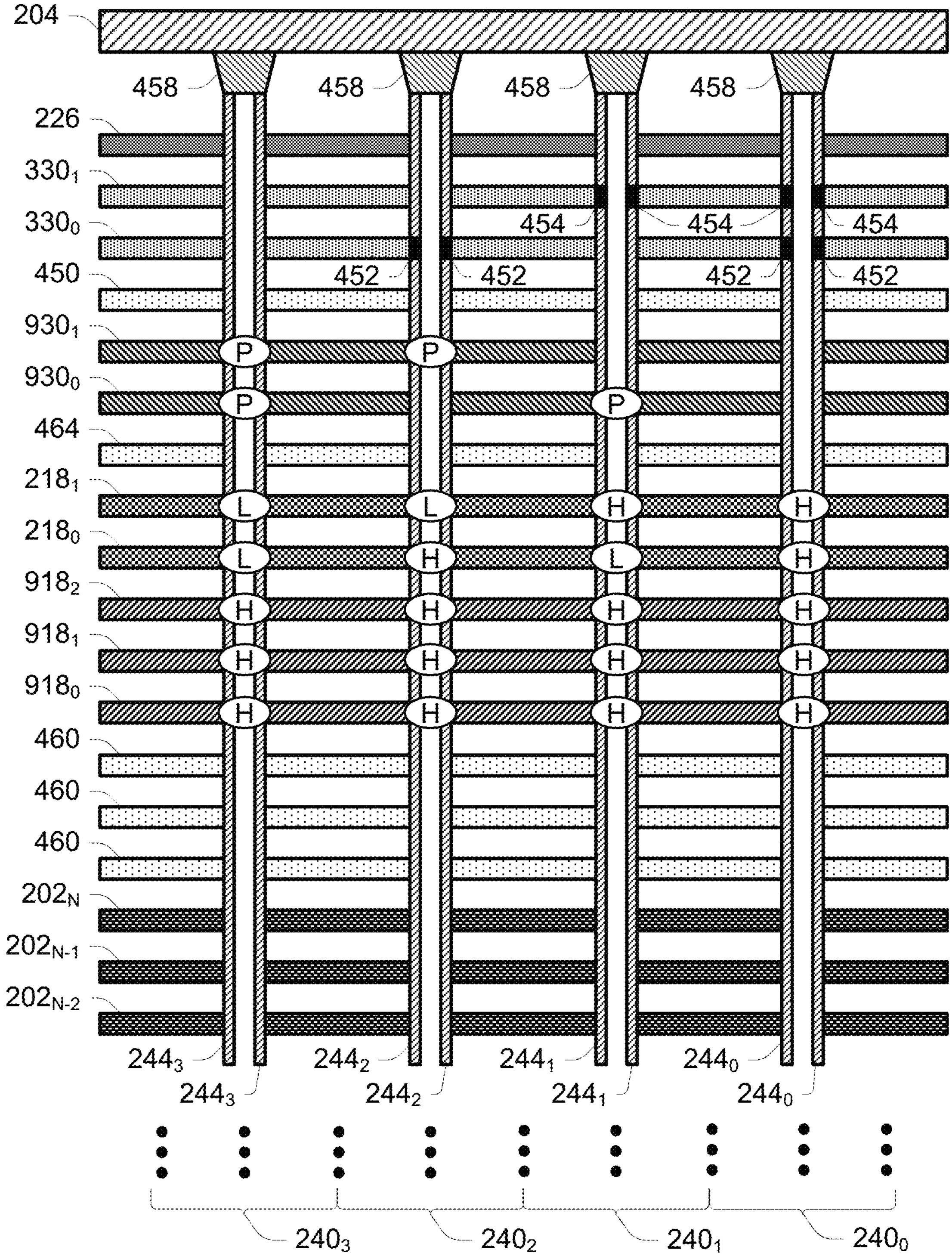

The array structure of FIG. 9B is similar to the array structure of FIG. 9A, but eliminates select gates 212 programmed to match the logic levels of the complementary select gates 328 connected to select line 930$_1$ and 930$_0$. Programming of the complementary select gates 928, and the subsequent programming of the select gates 212, and any optional select gates 912, can proceed as described with reference to FIG. 9A.

Following programming of the complementary select gates 928 and the select gates 212, each sub-block of memory cells 240 can be individually selected, e.g., connected to the data line 204, by applying pass voltages to any line between the select lines 930 and the data line 204, applying pass voltages to the dummy select lines 450 and 464, and by applying voltage levels matching the logic levels of the programmed threshold voltages of the complementary select gates 928 and select gates 212 for the selected sub-block of memory cells 240.

Figure 9C:
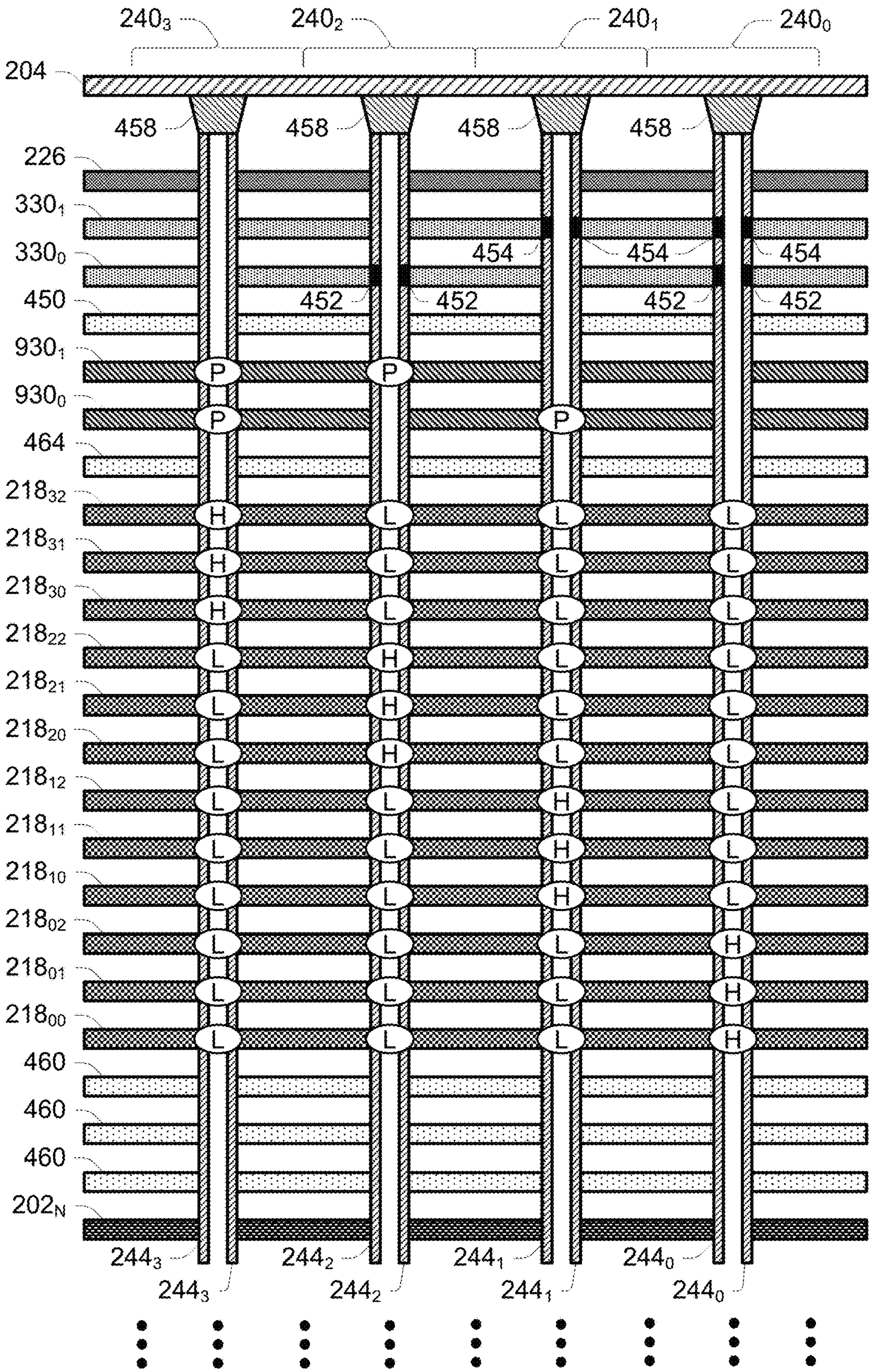

The array structure of FIG. 9C is similar to the array structure of FIG. 9A, but programs select gates 212 similar to the manner described with reference to FIG. 5A. However, instead of utilizing an initial, e.g., erased, threshold voltage as the low threshold voltage, those select gates 212 might be programmed to have a positive threshold voltage, e.g., 2V, while the select gates 212 having the high threshold voltage might be programed to have a higher positive threshold voltage, e.g., 4V. Programming of the complementary select gates 928, and the subsequent programming of the select gates 212, can proceed as described with reference to FIG. 9A. Selection of sub-blocks of memory cells 240 might be performed as described with reference to FIG. 5A.

Figure 9D:
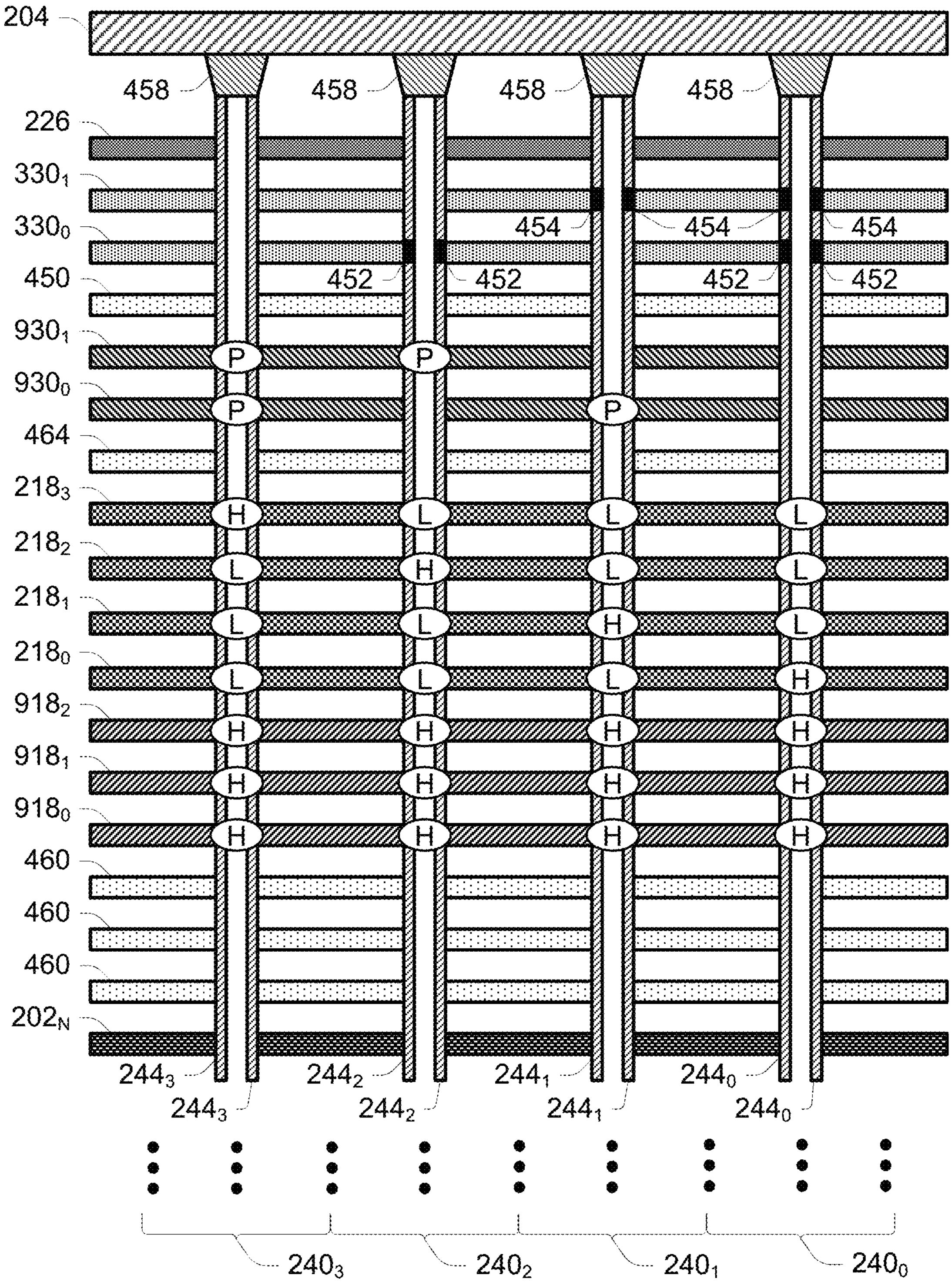

The array structure of FIG. 9D is similar to the array structure of FIG. 9A. The example of FIG. 9D programs select gates 212 similar to the manner described with reference to FIG. 5A, but only utilizes one select gate 212 having the high threshold voltage for each channel material structure 244. To provide the added cut-off provided by the multiple select gates 212 having the high threshold voltage as depicted in FIG. 5A, the example of FIG. 9D further incorporates select gates 912 connected to one or more select lines 918. Programming of the complementary select gates 928, and the subsequent programming of the select gates 212 and 912, can proceed as described with reference to FIG. 9A. Selection of sub-blocks of memory cells 240 might be performed as described with reference to FIG. 5A.

Figure 9E:
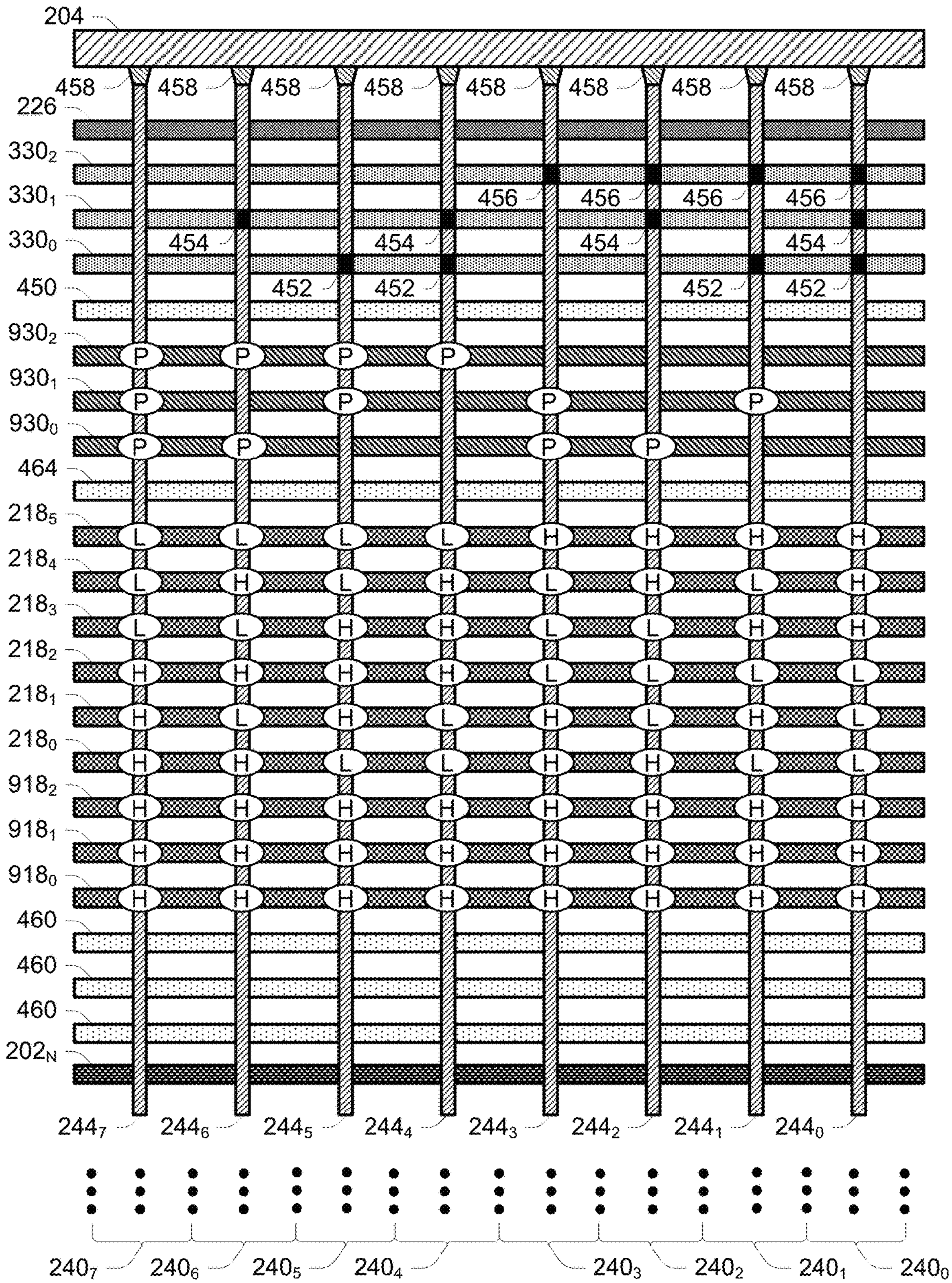

The array structure of FIG. 9E is similar to the array structure of FIG. 9A, but modified to provide for selection of eight sub-blocks of memory cells 240. The pre-configured select gates 328 might be defined as described with reference to FIG. 6A. Complementary select gates 928 connected to select line 930$_0$ might be enabled for programming by applying pass voltages to the lines between select line 930$_0$ and the data line 204 other than the select line 330$_0$. The select line 330$_0$ might then receive a voltage level configured to activate pre-configured select gates 328 of channel material structures 244$_2$, 244$_3$, 244$_6$ and 244$_7$, and to deactivate pre-configured select gates 328 of channel material structures 244$_0$, 244$_1$, 244$_4$ and 244$_5$.

Complementary select gates 928 connected to select line 930$_1$ might be enabled for programming by applying pass voltages to the lines between select line 930$_1$ and the data line 204 other than the select line 330$_1$. The select line 330$_1$ might then receive a voltage level configured to activate pre-configured select gates 328 of channel material structures 244$_1$, 244$_3$, 244$_5$ and 244$_7$, and to deactivate pre-configured select gates 328 of channel material structures 244$_0$, 244$_2$, 244$_4$ and 244$_6$.

Complementary select gates 928 connected to select line 930$_2$ might be enabled for programming by applying pass voltages to the lines between select line 930$_2$ and the data line 204 other than the select line 330$_2$. The select line 330$_2$ might then receive a voltage level configured to activate pre-configured select gates 328 of channel material structures 244$_4$, 244$_5$, 244$_6$ and 244$_7$, and to deactivate pre-configured select gates 328 of channel material structures 244$_0$, 244$_1$, 244$_2$ and 244$_3$.

Note that in the various foregoing embodiments, the channel material structures 244, and thus the strings of series-connected memory cells were depicted in specific orders laterally along their data line. However, while the depicted embodiments might minimize a number of masks utilized to fabricate the doped sections, any order of the desired binary permutations of two threshold voltages is acceptable. Thus, with reference to the embodiment of FIG. 5A as an example, if the channel material structures 244$_3$, 244$_2$, 244$_1$ and 244$_0$ are assigned numbers 4, 3, 2 and 1, respectively, they could be arranged laterally as 1234, 1324, 1423, 1432, 2134, 2314, 2413, 2431, 3124, 3214, 3412, 3421, 4123, 4213, 4312, and 4321.

FIGS. 10A-10K depict an integrated circuit structure, which might correspond to a portion of a channel material structure and associated structures of FIG. 5A, during various stages of fabrication in accordance with an embodiment. For example, FIGS. 10A-10K might depict fabrication of an upper portion of the channel material structure 244$_0$ of FIG. 5A and the transistors formed at the intersection of the GG control line 226, SGP$_1$ select line 330$_1$, SGP$_0$ select line 330$_0$, dummy select line 450, and drain select line 218$_{32}$. FIGS. 10A-10K might be used to depict fabrication of an array of memory cells in accordance with an embodiment, for example.

Figure 10A:
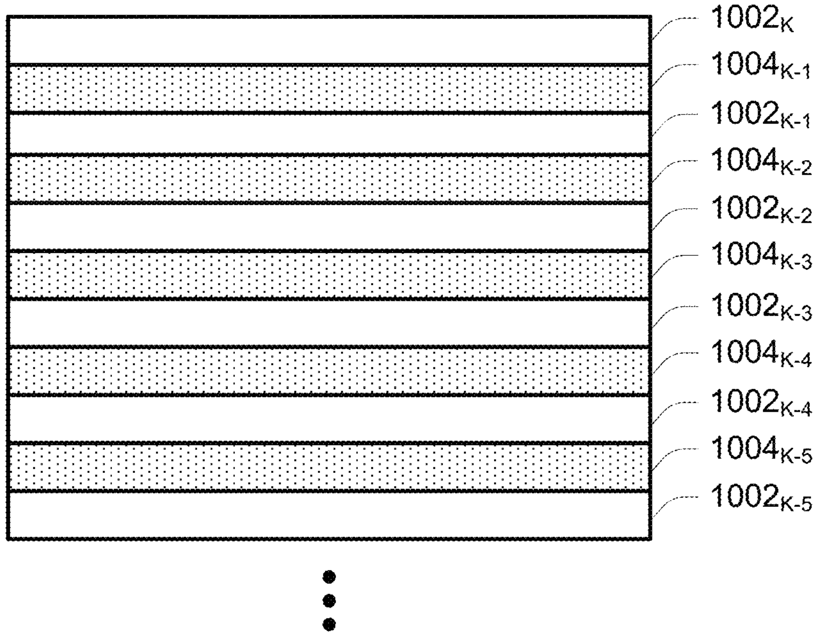
FIGS. 10A-10K depict an integrated circuit structure during various stages of fabrication in accordance with an embodiment.

In FIG. 10A, K+1 instances of a dielectric 1002 (e.g., 1002$_0$ to 1002$_K$) and K instances of a sacrificial material 1004 (e.g., 1004$_0$ to 1004$_{K-1}$) might be formed in an alternating manner. Although instances of the dielectric 1002$_0$-

$1002_{K-6}$, and instances of sacrificial material $1004_0$-$1004_{K-6}$, are not explicitly depicted in the figures, it will be understood that an instance of the dielectric $1002_0$ could be formed overlying a common source 216 (e.g., formed on a contact to the common source 216), the instance of the sacrificial material $1004_0$ could be formed on the instance of the dielectric $1002_0$, and subsequent instances of the dielectric 1002 and sacrificial material 1004 could be formed in an alternating manner as depicted in the figures.

The value K might represent the number of transistors to be formed around the channel material structure $244_0$ of FIG. 5A between a connection to a common source 216 and a data line 204. The instances of the dielectric 1002 might each contain one or more dielectric materials. The instances of dielectric 1002 might comprise, consist of, or consist essentially of an oxide, e.g., silicon dioxide ($SiO_2$), and/or might comprise, consist of, or consist essentially of a high-K dielectric material, such as aluminum oxides ($AlO_x$), hafnium oxides ($HfO_x$), hafnium aluminum oxides ($HfAlO_x$), hafnium silicon oxides ($HfSiO_x$), lanthanum oxides ($LaO_x$), tantalum oxides ($TaO_x$), zirconium oxides ($ZrO_x$), zirconium aluminum oxides ($ZrAlO_x$), or yttrium oxide ($Y_2O_3$), as well as any other dielectric material. High-K dielectrics as used herein means a material having a dielectric constant greater than that of silicon dioxide. The instances of dielectric 1002 might further comprise, consist of, or consist essentially of a spin-on dielectric material, e.g., hydrogen silsesquioxane (HSQ), hexamethyldisiloxane, octamethyltrisiloxane, etc., or a high-density-plasma (HDP) oxide. The instances of dielectric 1002 might further comprise, consist of, or consist essentially of any other dielectric material. As one example, the instances of the dielectric 1002 might contain silicon dioxide.

The instances of the sacrificial material 1004 might contain a material that can be subjected to removal without significantly affecting the material(s) of the dielectric 1002. As one example, the instances of the sacrificial material 1004 might contain silicon nitride for instances of the dielectric 1002 containing silicon dioxide. Additional instances of the dielectric 1002 and instances of the sacrificial material 1004 might be formed, depending upon the number of transistors intended to be formed, e.g., memory cells, dummy memory cells, GIDL generator gates, select gates and pre-configured select gates. While all intended instances of the dielectric 1002 and instances of the sacrificial material 1004 might be formed before proceeding to the processing of FIG. 10B, typical processing of such stacked structures might be performed in stages as the aspect ratio of a via formed through the instances of the dielectric 1002 and the instances of the sacrificial material 1004 might become too large to form the entire structure reliably as a contiguous entity.

Figure 10B:
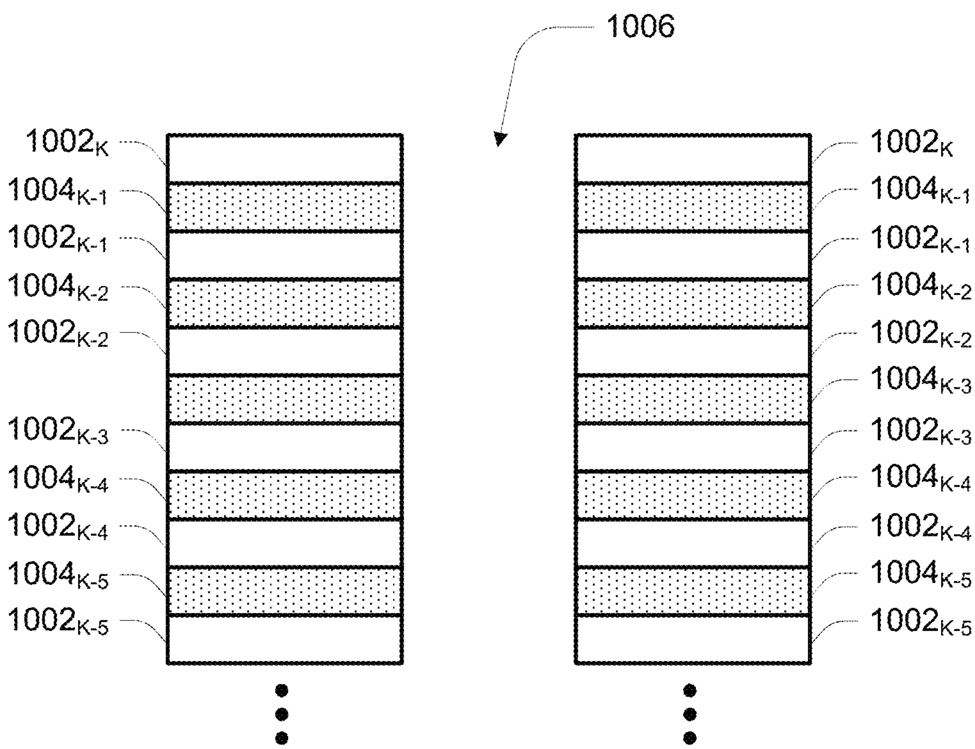

In FIG. 10B, a via 1006 might be formed through the instances of the dielectric 1002 and the instances of the sacrificial material 1004. For example, an anisotropic removal process, e.g., reactive ion etching (ME), might be used with a contact to the common source 216 (not depicted in FIG. 10B) acting as an etch stop. As such, the via 1006 might extend through all instances of the dielectric 1002 and through all instances of the sacrificial material 1004.

Figure 10C:
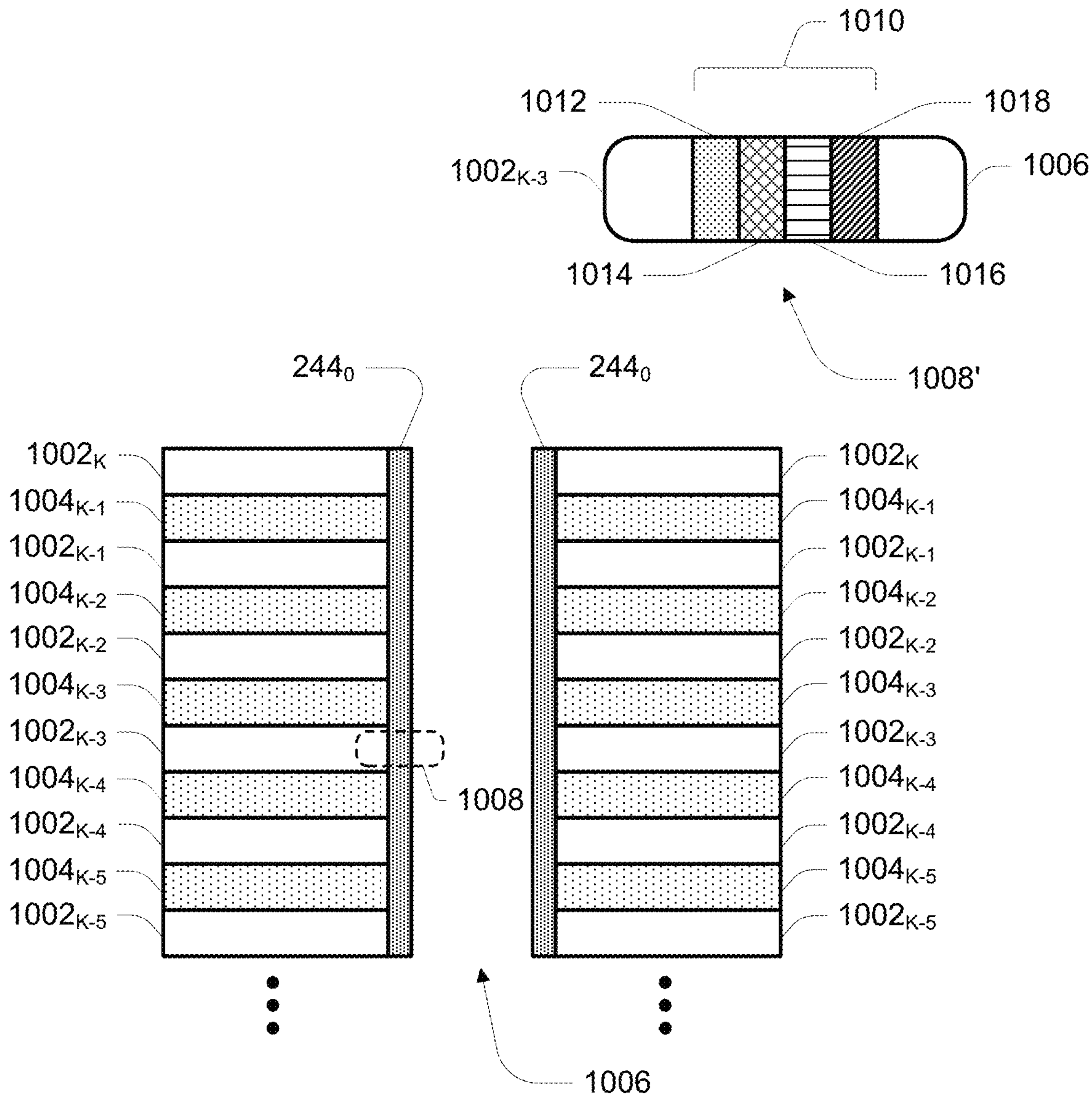

In FIG. 10C, a channel material structure $244_0$ might be formed to line the sidewalls of the via 1006, e.g., formed along the sidewalls of the instances of the dielectric 1002 and the instances of the sacrificial material 1004. The portion 1008 of the channel material structure 1010 is depicted in further detail in the expanded portion 1008'. As depicted, the channel material structure $244_0$ might include a charge-blocking material 1012 formed to line the via 1006, a charge-storage material 1014 might be formed on the charge-blocking material 1012, a dielectric (e.g., gate dielectric) 1016 might be formed on the charge-storage material 1014, and a channel material (e.g., a semiconductor or conductively-doped semiconductor) 1018 might be formed on the dielectric 1016. The charge-storage material 1014 might contain a dielectric or conductive charge-storage material. The charge-storage material 1014 might further contain both dielectric and conductive materials, e.g., conductive nano-particles in a dielectric bulk material. For charge-storage material 1014 containing a conductive material as its bulk, or as a continuous structure, resulting memory cells might typically be referred to as floating-gate memory cells. For charge-storage material 1014 containing a dielectric material as its bulk, or as a continuous structure, resulting memory cells might typically be referred to as charge-trap memory cells. For one embodiment, the charge-blocking material 1012, charge-storage material 1014 and dielectric 1016 might form an ONO structure. The channel material 1018 might be a portion of a contiguous semiconductor structure for each transistor formed around the channel material structure $244_0$, or might otherwise be electrically connected, which might include selectively electrically connected, to channels of each such transistor. The channel material 1018 might have a conductivity type, e.g., a p-type conductivity or an n-type conductivity.

The charge-blocking material 1012 might function as a charge-blocking node for future memory cells and other transistors having a same structure, and might include one or more dielectric materials, such as described with reference to the dielectric 1002. For example, the charge-blocking material 1012 might include a high-K dielectric material. The charge-storage material 1014 might function as a charge-storage node for future memory cells and other transistors having a same structure, and might include one or more conductive or dielectric materials capable of storing a charge. For example, the charge-storage material 1014 might include silicon nitride, which has charge trapping levels inside the film. The dielectric 1016 might function as a gate dielectric for future memory cells and other transistors having a same structure, and might include one or more dielectric materials such as described with reference to the dielectric 1002. The channel material 1018 might function as a channel for future memory cells and other transistors having a same structure, and might include one or more semiconductor materials.

Figure 10D:
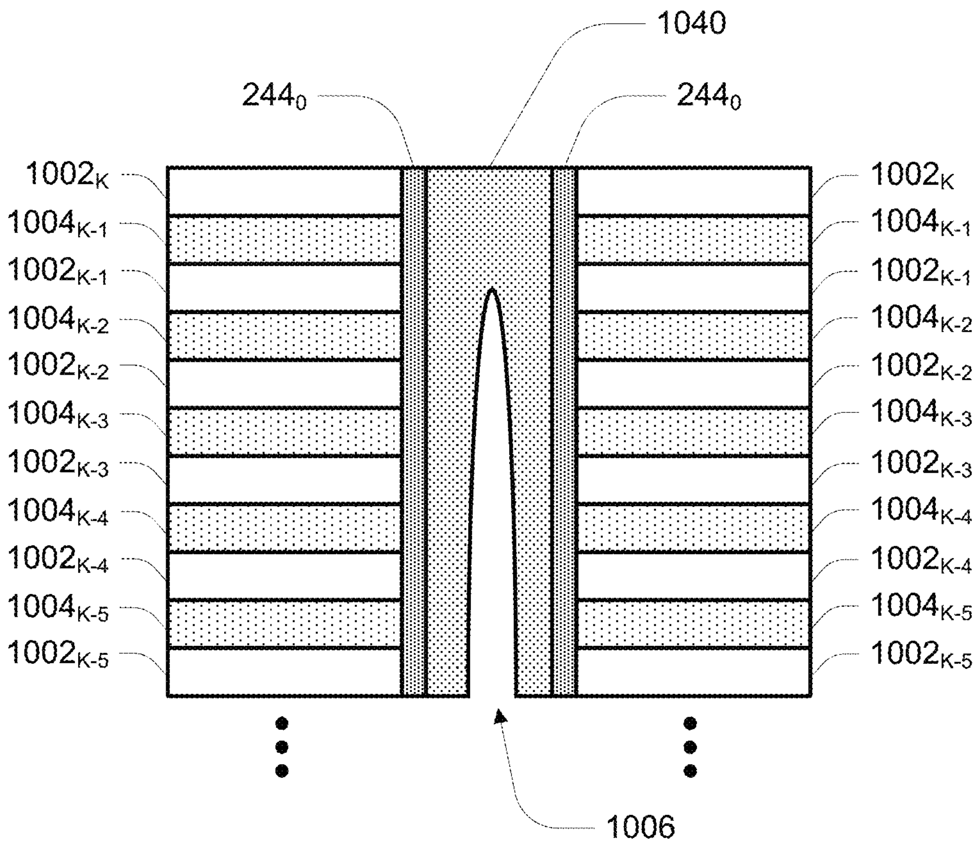

In FIG. 10D, a dielectric 1040 might be formed in the void 1006. The dielectric 1040 might contain one or more dielectric materials. The dielectric 1040 might comprise, consist of, or consist essentially of an oxide, e.g., silicon dioxide ($SiO_2$). The dielectric 1040 might further comprise, consist of, or consist essentially of a spin-on dielectric material, e.g., hydrogen silsesquioxane (HSQ), hexamethyldisiloxane, octamethyltrisiloxane, etc., or a high-density-plasma (HDP) oxide. The dielectric 1040 might further comprise, consist of, or consist essentially of any other dielectric material. The dielectric 1040 might contain one or more dielectric materials that can be selectively removed without adversely affecting the materials of the instances of dielectric 1002, the charge-blocking material 1012, the charge-storage material 1014, the dielectric 1016, and the channel material 1018. The dielectric 1040 might be deposited overlying the structure of FIG. 10C, and then removed to the level of an upper surface of the upper instance of dielectric 1002, e.g., instance of dielectric $1002_K$, such as by chemical-mechanical planarization (CMP). A portion of the void 1006 might remain after forming the dielectric 1040. The dielectric 1040 might serve to mitigate contamination of portions of channel material 1018 corresponding to memory cells or other transistors that are not the target of future conductive doping as described infra with respect to FIGS. 10I-10J.

Figure 10E:
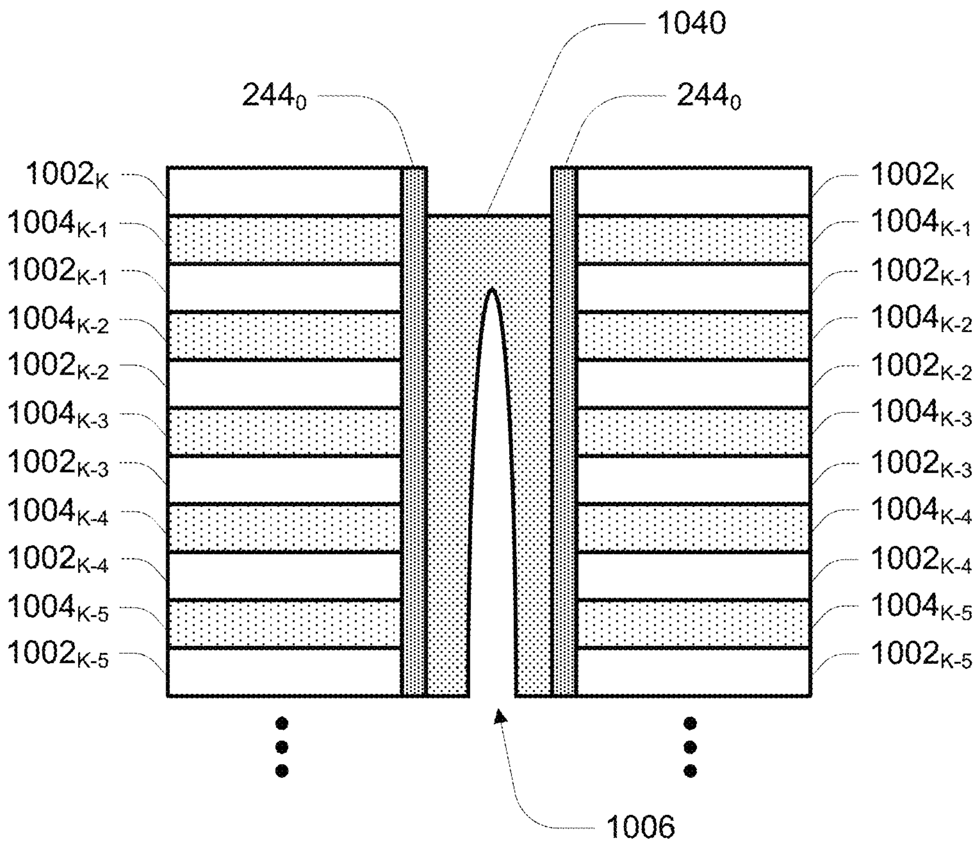
Figure 10F:
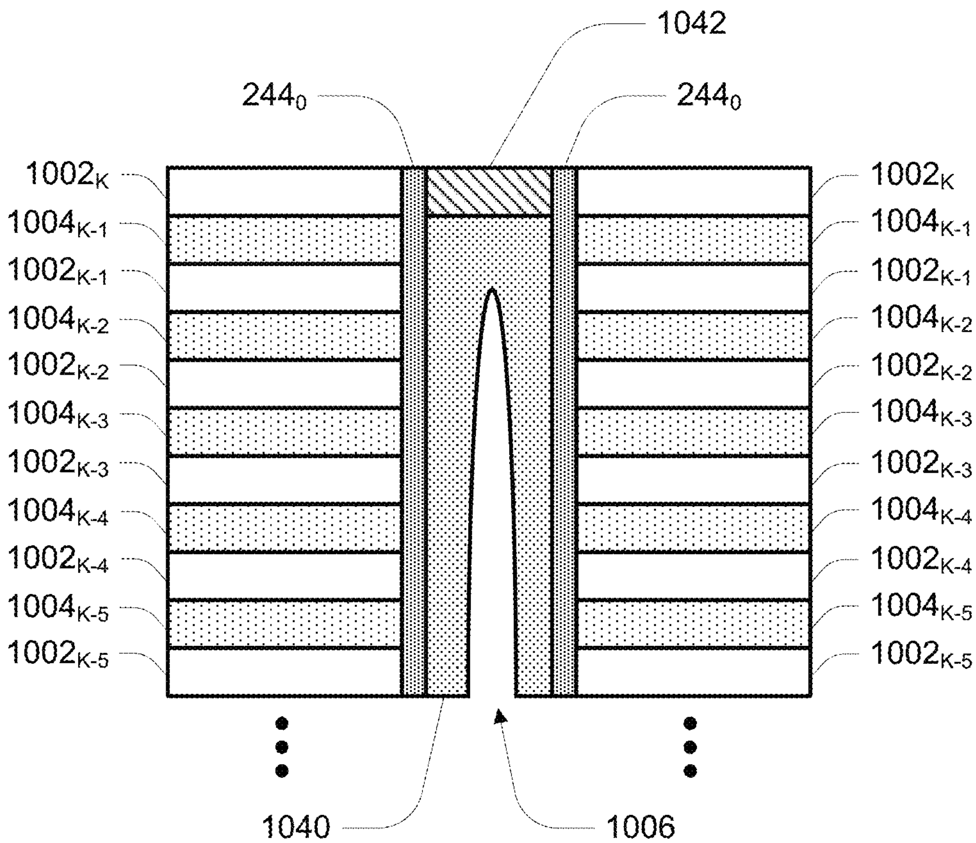

In FIG. 10E, a portion of the dielectric 1040 might be removed to recess the upper surface of the dielectric 1040. For example, the dielectric 1040 might be recessed to expose portions of the channel material structure, and its channel material 1018, to a level of the upper instance of sacrificial material 1004, e.g., instance of sacrificial material $\mathbf{1004}_{K-1}$. In FIG. 10F, a conductive plug 1042 might be formed overlying the dielectric 1040 and in contact with the channel material 1018 of the channel material structure $\mathbf{244}_0$. The conductive plug 1042 might contain one or more conductive materials, e.g., conductive materials such as described with reference to the conductor 1024. For some embodiments, the conductive plug 1042 might contain an $n^+$-type conductively-doped polysilicon.

Figure 10G:
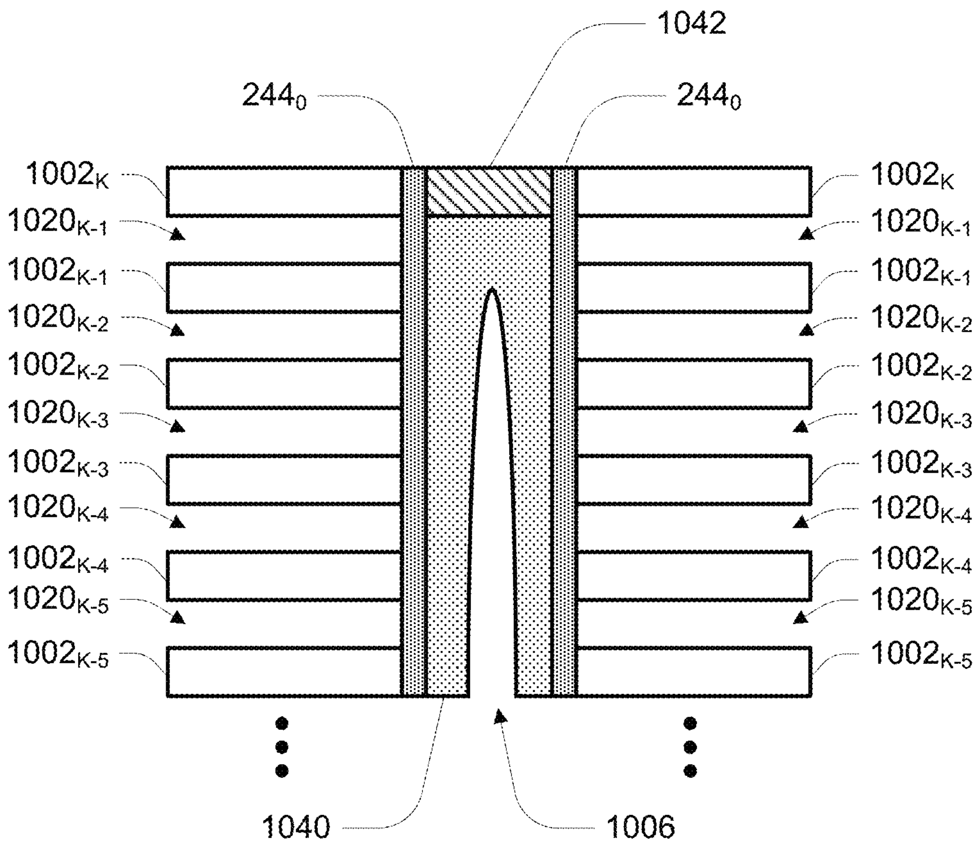
Figure 10H:
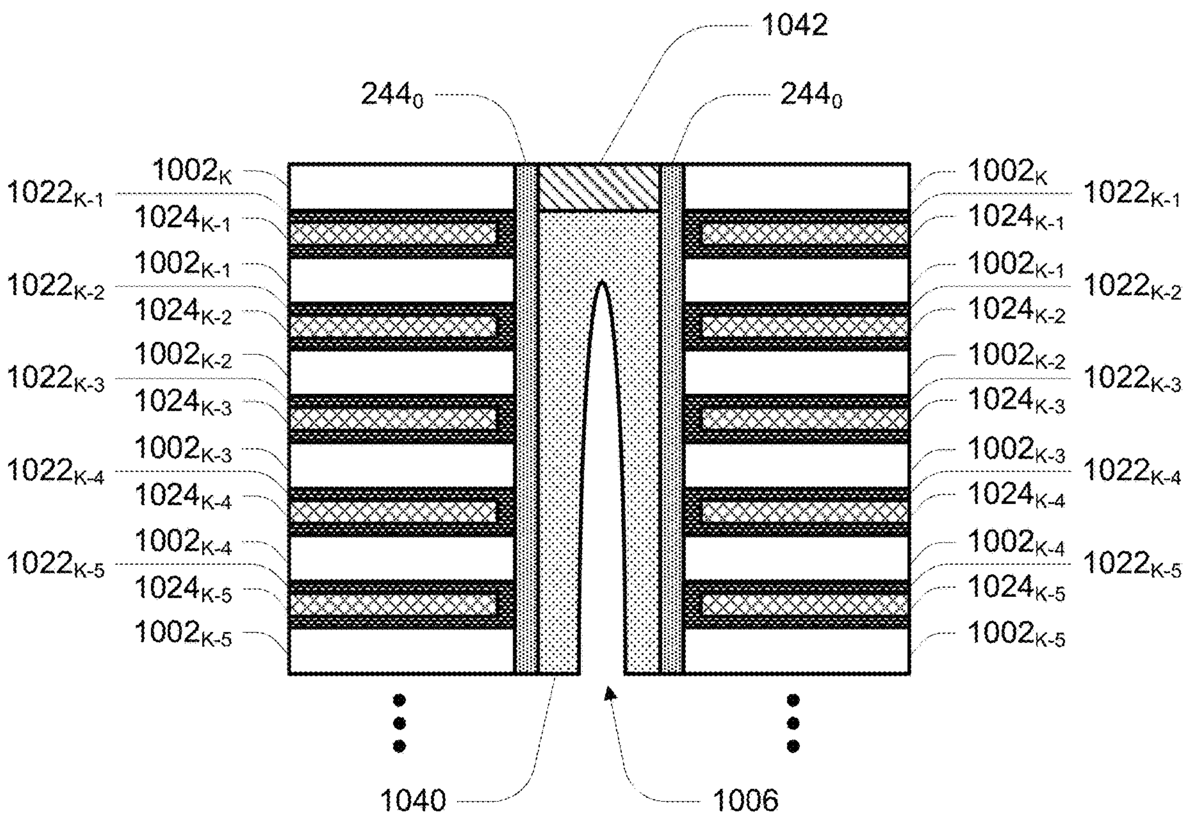

In FIG. 10G, the instances of sacrificial material 1004 might be removed to define voids 1020, e.g., voids $\mathbf{1020}_{K-1}$ to $\mathbf{1020}_{K-5}$. The removal might include an isotropic removal process, e.g., a plasma etching process. In FIG. 10H, instances of an optional charge-blocking material 1022, e.g., instances of charge-blocking material $\mathbf{1022}_{K-1}$ to $\mathbf{1022}_{K-5}$, might be formed to line the voids 1020, e.g., voids $\mathbf{1020}_{K-1}$ to $\mathbf{1020}_{K-5}$, respectively. The instances of charge-blocking material 1022 might include one or more dielectric materials, such as described with reference to the dielectric 1002, and might include a high-K dielectric material. For embodiments with the charge-blocking material 1012, the instances of charge-blocking material 1022 might function as an additional charge-blocking material of a charge-blocking node for future memory cells and other transistors having a same structure. For embodiments without the charge-blocking material 1012, the instances of charge-blocking material 1022 might function individually as a charge-blocking node for future memory cells and other transistors having a same structure. For embodiments with the charge-blocking material 1012, and without the instances of charge-blocking material 1022, the charge-blocking material 1012 might function individually as a charge-blocking node for future memory cells and other transistors having a same structure. Instances of a conductor 1024, e.g., instances of a conductor $\mathbf{1024}_{K-1}$ to $\mathbf{1024}_{K-5}$, might be formed to fill the voids 1020, e.g., voids $\mathbf{1020}_{K-1}$ to $\mathbf{1020}_{K-5}$, respectively. The instances of the conductor 1024 might contain one or more conductive materials. The instances of the conductor 1024 might comprise, consist of, or consist essentially of conductively doped polysilicon and/or might comprise, consist of, or consist essentially of metal, such as a refractory metal, or a metal-containing material, such as a refractory metal silicide or a metal nitride, e.g., a refractory metal nitride, as well as any other conductive material.

A transistor might be formed at each intersection of an instance of the conductor 1024 and the channel material 1018, where an instance of the conductor 1024 might function as a control gate of the transistor, adjacent channel material 1018 might function as a channel of the transistor, and an instance of charge-blocking material 1022 and/or charge-blocking material 1012, charge-storage material 1014, and dielectric 1016 between the instance of the conductor 1024 and the adjacent channel material 1018 might function as a charge-blocking node, charge-storage node and gate dielectric, respectively, of that transistor. Such transistors could include memory cells 208, GIDL generator gates 220 and 222, select gates 210 and 212, and pre-configured select gates 328, for example.

In this example corresponding to the structure of FIG. 5A, the instance of the conductor $\mathbf{1024}_{K-1}$ might correspond to the control line 226, the instance of the conductor $\mathbf{1024}_{K-2}$ might correspond to the select line $\mathbf{330}_1$, the instance of the conductor $\mathbf{1024}_{K-3}$ might correspond to the select line $\mathbf{330}_0$, the instance of the conductor $\mathbf{1024}_{K-4}$ might correspond to the dummy line 450, and the instance of the conductor $\mathbf{1024}_{K-5}$ might correspond to the select line $\mathbf{218}_{32}$. These correspondences are reflected beginning in FIG. 10I.

Figure 10I:
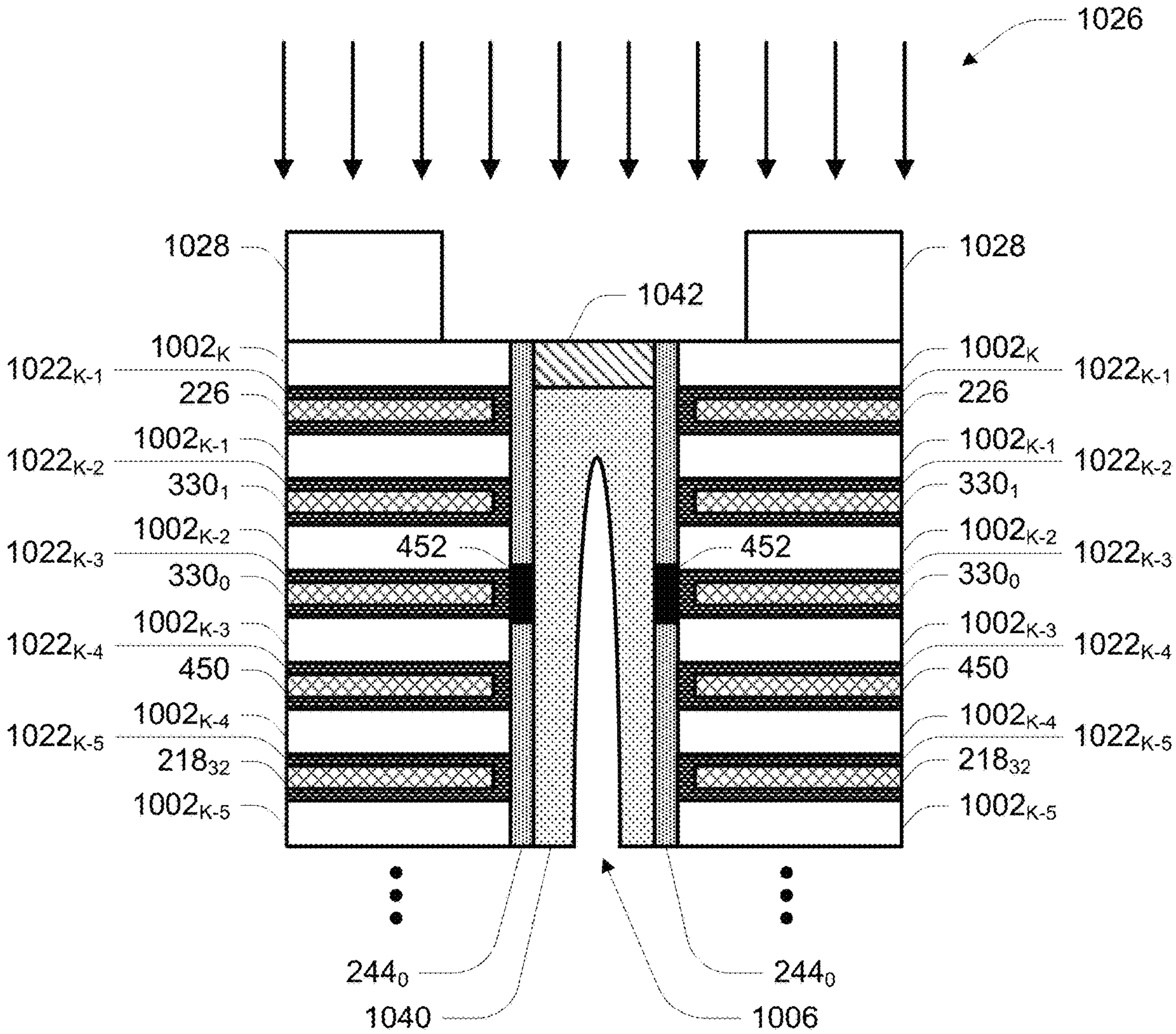

In FIG. 10I, portions of the channel material structure $\mathbf{244}_0$, e.g., its channel material 1018, adjacent the select line $\mathbf{330}_0$ might be doped using a dopant impurity configured to increase a threshold voltage of the pre-configured select gate 328 to be formed at the intersection of the channel material structure $\mathbf{244}_0$ and the select line $\mathbf{330}_0$. This might define a doped section 452. For purposes herein, a dopant impurity is an ion, element or molecule, or some combination of ions, elements and/or molecules, selectively added to the channel material 1018. Such doping might involve the acceleration of the dopant impurity, as depicted conceptually by arrows 1026. As one example, the dopant impurity might be a p-type impurity, such as ions of boron (B) or another p-type impurity. Alternatively, the dopant impurity might be an n-type impurity, such as ions of arsenic (As), antimony (Sb), phosphorus (P) or another n-type impurity. The dopant impurity might further be any other impurity that could be added to the channel material 1018 to facilitate an increase in threshold voltage. Examples of suitable doping processes might include plasma doping (PLAD) and/or beam-line implantation. Note that a counter implant of an opposite type might be used where lateral side scattering of the dopant impurity occurs during the definition of the doped section 452. For example, where a p-type dopant impurity, e.g., boron, is used to define the doped section 452, an n-type dopant impurity, e.g., phosphorous, might be used to compensate unwanted boron injection to the upper, e.g., shallower, portion of the channel.

A mask 1028, e.g., a photolithographic mask, might be used to cover channel material structures 244 (e.g., channel material structures $\mathbf{244}_2$ and $\mathbf{244}_3$) that are not to receive a doped section 452, and to expose channel material structures 244 (e.g., channel material structures $\mathbf{244}_0$ and $\mathbf{244}_1$) that are to receive a doped section 452. Although depicted in FIG. 10I to surround the channel material structure $\mathbf{244}_0$, the mask 1028 might simply be a rectangular mask extending over all channel material structures 244 of a block of memory cells that are not to receive the doped section 452. For example, with reference to FIG. 5B, the mask 1028 could be a rectangle that overlies the channel material structures 244 of the sub-blocks of memory cells $\mathbf{240}_2$ and $\mathbf{240}_3$, and has an edge extending along the dotted line between the sub-blocks of memory cells $\mathbf{240}_1$ and $\mathbf{240}_2$. An anneal process might be used to diffuse the implanted dopant impurity within portions of the channel material 1018, thereby further defining the doped section 452.

Figure 10J:
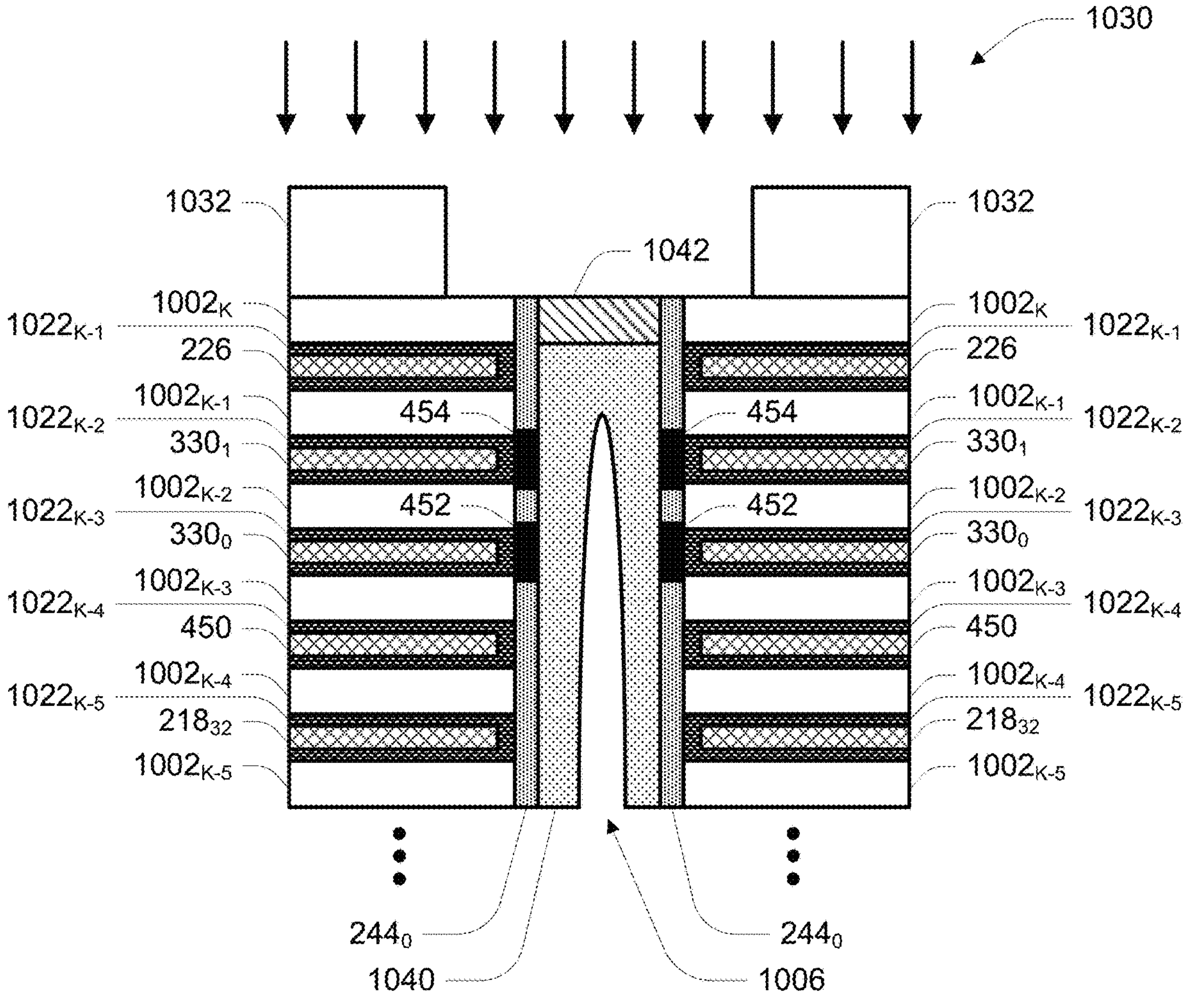

In FIG. 10J, portions of the channel material structure $\mathbf{244}_0$ adjacent the select line $\mathbf{330}_1$ might be doped using a dopant impurity configured to increase a threshold voltage of the pre-configured select gate 328 to be formed at the intersection of the channel material structure $\mathbf{244}_0$ and the select line $\mathbf{330}_1$ to define the doped section 454. Such doping might involve the acceleration of the dopant impurity, as depicted conceptually by arrows 1030. The doping depicted conceptually in FIG. 10J by arrows 1030 might use a lower power than the doping depicted conceptually in FIG. 10I by arrows 1026 to place the dopant impurity closer to the surface. Note that a counter implant of an opposite type might be used where lateral side scattering of the dopant impurity occurs during the definition of the doped section 454. For example, where a p-type dopant impurity, e.g., boron, is used to define the doped section 454, an n-type dopant impurity, e.g., phosphorous, might be used to compensate unwanted boron injection to the upper, e.g., shallower, portion of the channel.

A mask 1032, e.g., a photolithographic mask, might be used to cover channel material structures 244 (e.g., channel material structures $\mathbf{244_1}$ and $\mathbf{244_3}$) that are not to receive a doped section 454, and to expose channel material structures 244 (e.g., channel material structures $\mathbf{244_0}$ and $\mathbf{244_2}$) that are to receive a doped section 454. Although depicted in FIG. 10J to surround the channel material structure $\mathbf{244_0}$, the mask 1032 might simply be a rectangular mask extending over all channel material structures 244 of a block of memory cells that are not to receive the doped section 454. For example, with reference to FIG. 5B, the mask 1032 could include a first rectangle that overlies the channel material structures 244 of the sub-block of memory cell $\mathbf{240_1}$, and has edges extending along the dotted lines between the sub-blocks of memory cells $\mathbf{240_0}$ and $\mathbf{240_1}$ and between the sub-blocks of memory cells $\mathbf{240_1}$ and $\mathbf{240_2}$. The mask 1032 could further include a second rectangle that overlies the channel material structures 244 of the sub-block of memory cell $\mathbf{240_3}$, and has an edge extending along the dotted line between the sub-blocks of memory cells $\mathbf{240_2}$ and $\mathbf{240_3}$ and between the sub-blocks of memory cells $\mathbf{240_1}$ and $\mathbf{240_2}$. An anneal process might be used to diffuse the implanted dopant impurity within portions of the channel material 1018, thereby further defining the doped section 454.

Figure 10K:
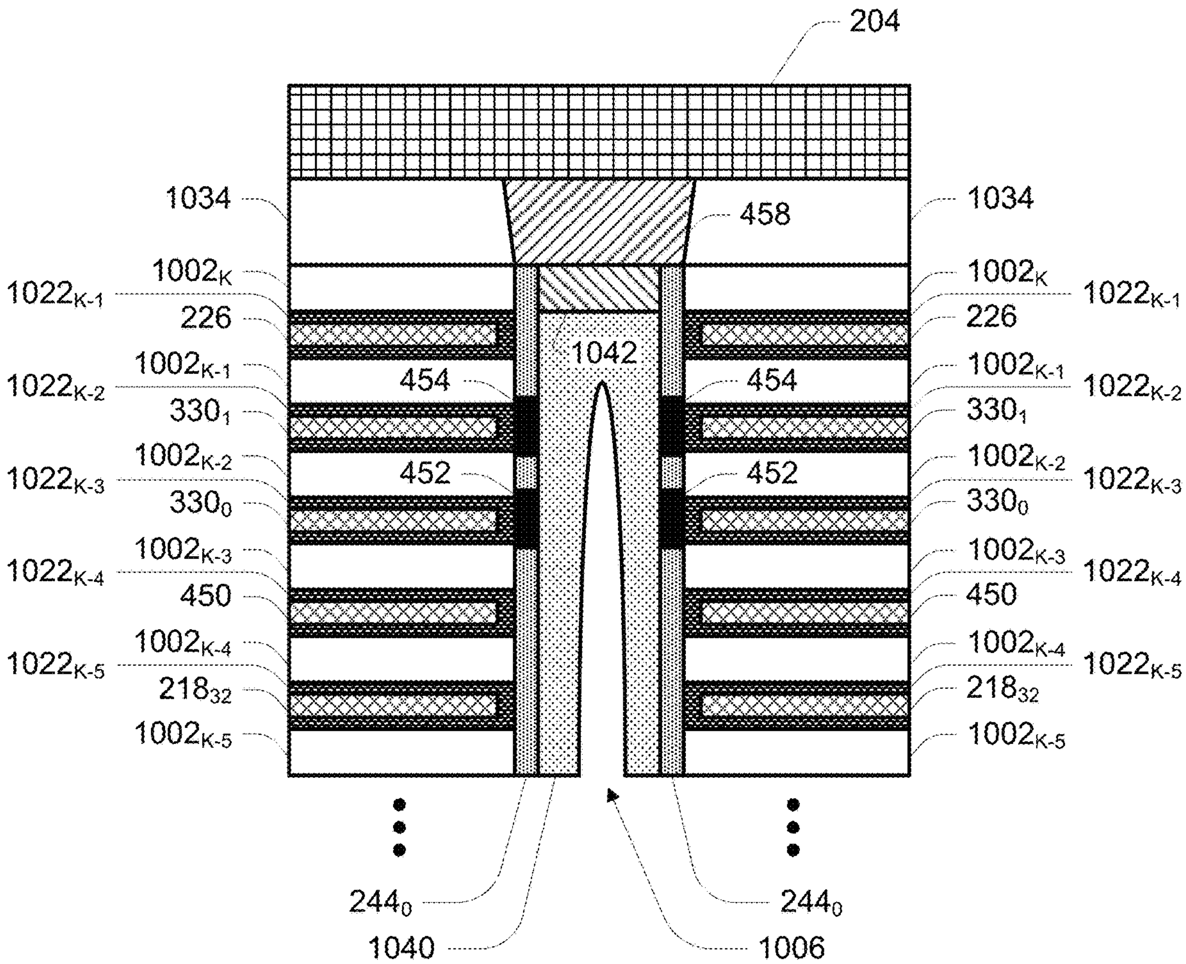

In FIG. 10K, a data line contact 458 might be formed through a dielectric 1034 that might be formed overlying the structure of FIG. 10J. The data line contact 458 might be formed to be in contact with the conductive plug 1042. A data line 204 might be formed overlying the data line contact 458. The data line 204 might be connected to the channel material 1018 of the channel material structure $\mathbf{244_0}$ through the contact 458 and conductive plug 1042. The contact 458 might contain one or more conductive materials, e.g., conductive materials such as described with reference to the conductor 1024. For some embodiments, the contact 458 might contain an $n^+$-type conductively-doped polysilicon. For other embodiments, the contact 458 might include an $n^+$-type conductively-doped polysilicon formed overlying the channel material structure $\mathbf{244_0}$, titanium nitride (TiN) formed overlying the $n^+$-type conductively-doped polysilicon, and tungsten (W) formed overlying the titanium nitride. For further embodiments, the upper portion of the channel material 1018 of the channel material structure $\mathbf{244_0}$ might be doped to an $n^+$-type conductivity, and the contact 458 might include titanium nitride (TiN) formed overlying the channel material structure $\mathbf{244_0}$, and tungsten (W) formed overlying the titanium nitride. While FIGS. 10A-10K depicted an example method of fabricating a portion of the array structure of FIG. 5A, other methods of fabrication could be used with various embodiments.

Figure 11:
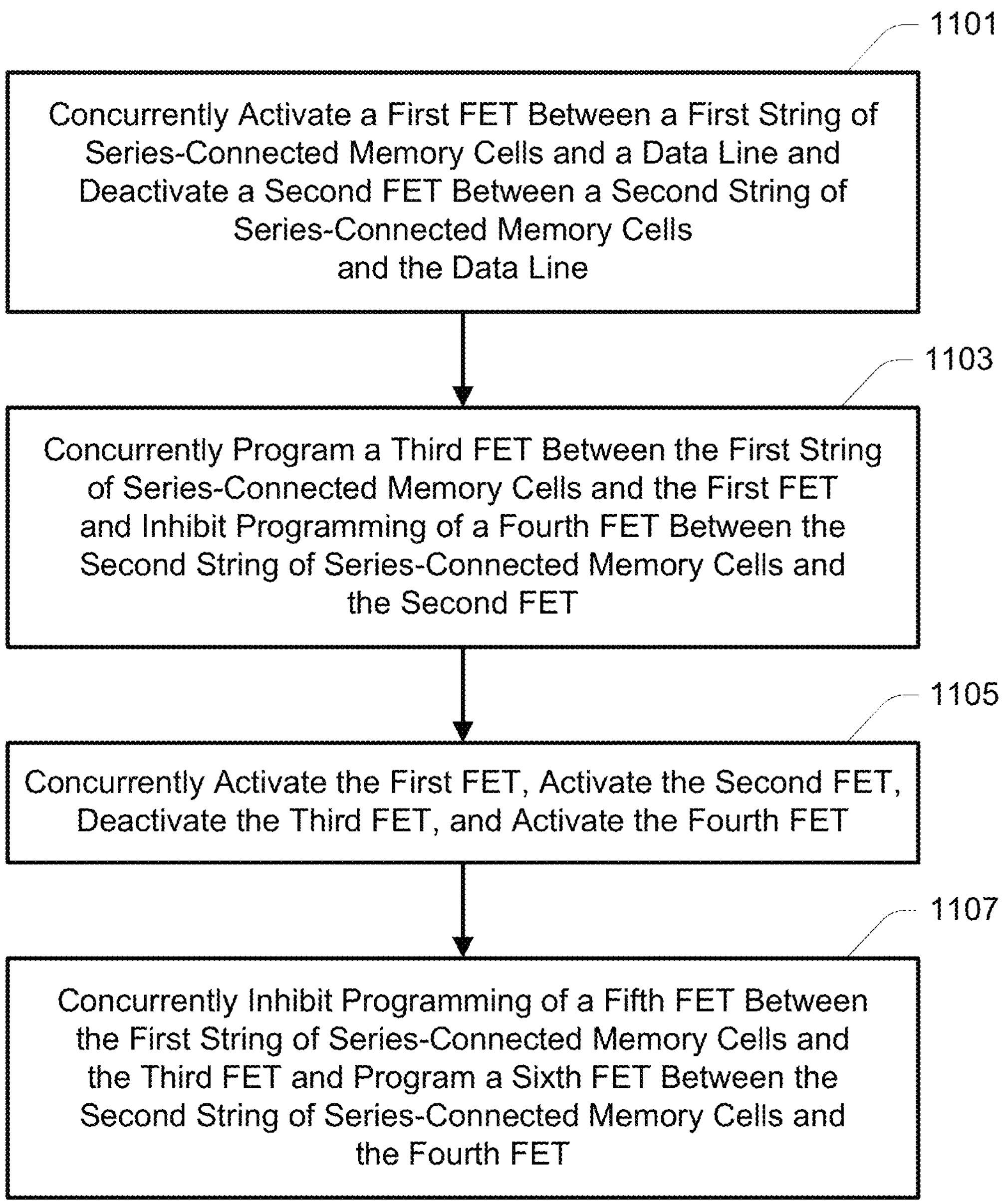
FIG. 11 is a flowchart of a method of operating an apparatus in accordance with an embodiment.

FIG. 11 is a flowchart of a method of operating an apparatus, e.g., a memory, in accordance with an embodiment. The method might be in the form of computer-readable instructions, e.g., stored to the instruction registers 128. Such computer-readable instructions might be executed by a controller, e.g., the control logic 116, to cause the relevant components of the apparatus to perform the method.

At 1101, a first field-effect transistor between a first string of series-connected memory cells and a data line might be activated concurrently with deactivating a second field-effect transistor between a second string of series-connected memory cells and the data line. The first field-effect transistor and the second field-effect transistor might have their control gates connected to a same select line. For example, the first field-effect transistor and the second field-effect transistor might correspond to the pre-configured select gates formed at the intersections of the select line 330 and the channel material structures $\mathbf{244_1}$ and $\mathbf{244_0}$, respectively, of FIG. 4A. Alternatively, the first field-effect transistor and the second field-effect transistor might correspond to the pre-configured select gates formed at the intersections of the select line $\mathbf{330_1}$ and the channel material structures $\mathbf{244_3}$ and $\mathbf{244_2}$, respectively, of FIG. 5A. Alternatively, the first field-effect transistor and the second field-effect transistor might correspond to the pre-configured select gates formed at the intersections of the select line $\mathbf{330_1}$ and the channel material structures $\mathbf{244_7}$ and $\mathbf{244_6}$, respectively, of FIG. 6A.

At 1103, a third field-effect transistor between the first string of series-connected memory cells and the first field-effect transistor might be programmed concurrently with inhibiting programming of a fourth field-effect transistor between the second string of series-connected memory cells and the second field-effect transistor. The third field-effect transistor and the fourth field-effect transistor might have their control gates connected to a same select line. For example, the third field-effect transistor and the fourth field-effect transistor might correspond to the select gates formed at the intersections of the select line $\mathbf{218_{10}}$ and the channel material structures $\mathbf{244_1}$ and $\mathbf{244_0}$, respectively, of FIG. 4A. Alternatively, the third field-effect transistor and the fourth field-effect transistor might correspond to the select gates formed at the intersections of the select line $\mathbf{218_{30}}$ and the channel material structures $\mathbf{244_3}$ and $\mathbf{244_2}$, respectively, of FIG. 5A. Alternatively, the third field-effect transistor and the fourth field-effect transistor might correspond to the select gates formed at the intersections of the select line $\mathbf{218_{70}}$ and the channel material structures $\mathbf{244_7}$ and $\mathbf{244_6}$, respectively, of FIG. 6A.

At 1105, the first field-effect transistor might be activated concurrently with activating the second field-effect transistor, deactivating the third field-effect transistor, and activating the fourth field-effect transistor. At 1107, a fifth field-effect transistor between the first string of series-connected memory cells and the third field-effect transistor might be inhibited from programming concurrently with programming a sixth field-effect transistor between the second string of series-connected memory cells and the fourth field-effect transistor. The fifth field-effect transistor and the sixth field-effect transistor might have their control gates connected to a same select line. For example, the fifth field-effect transistor and the sixth field-effect transistor might correspond to the select gates formed at the intersections of the select line $\mathbf{218_{00}}$ and the channel material structures $\mathbf{244_1}$ and $\mathbf{244_0}$, respectively, of FIG. 4A. Alternatively, the fifth field-effect transistor and the sixth field-effect transistor might correspond to the select gates formed at the intersections of the select line $\mathbf{218_{20}}$ and the channel material structures $\mathbf{244_3}$ and $\mathbf{244_2}$, respectively, of FIG. 5A. Alternatively, the fifth field-effect transistor and the sixth field-effect transistor might correspond to the select gates formed at the intersections of the select line $218_{60}$ and the channel material structures $244_7$ and $244_6$, respectively, of FIG. 6A.

Figure 12:
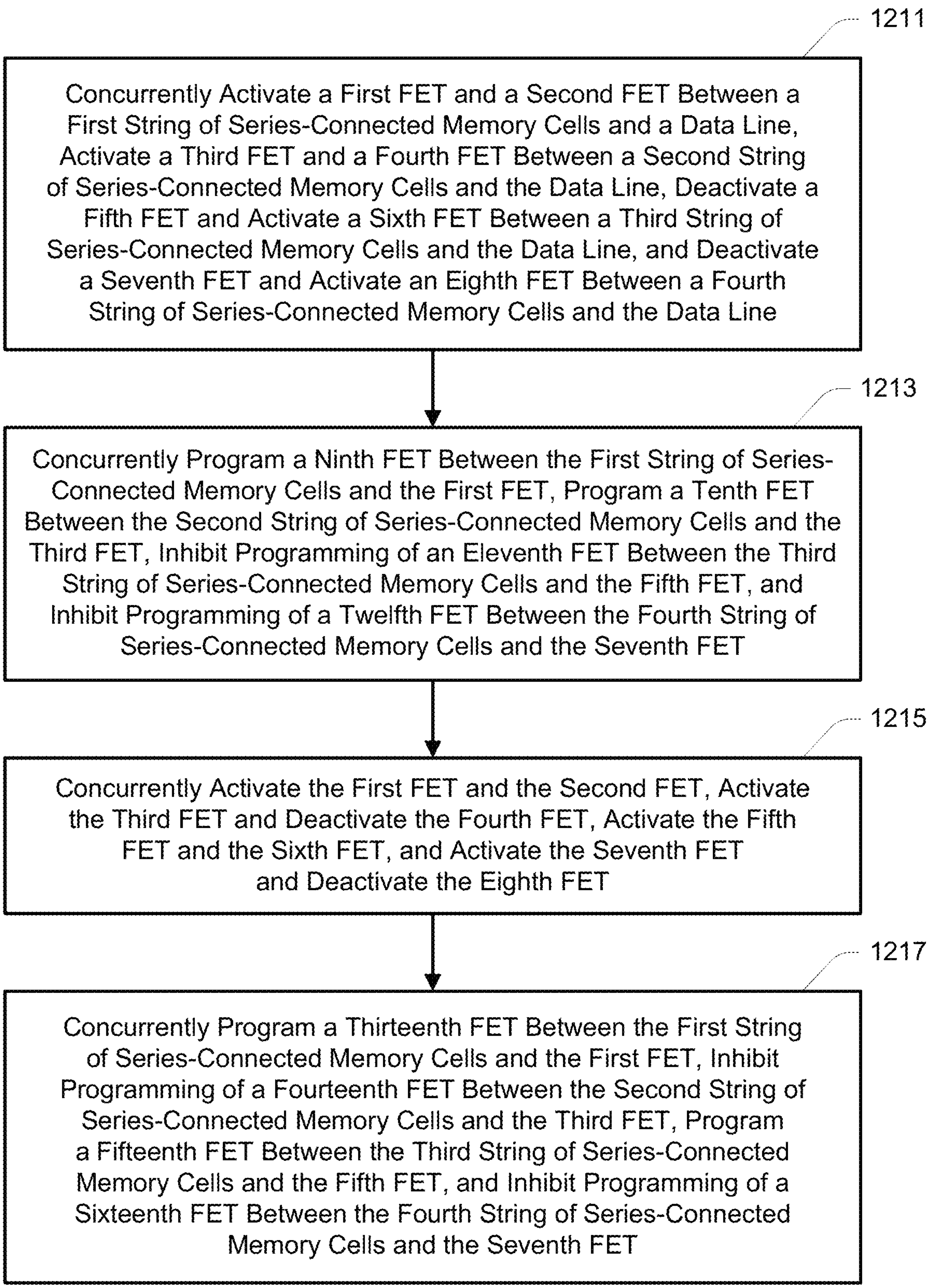
FIG. 12 is a flowchart of a method of operating an apparatus in accordance with another embodiment.

FIG. 12 is a flowchart of a method of operating an apparatus, e.g., a memory, in accordance with an embodiment. The method might be in the form of computer-readable instructions, e.g., stored to the instruction registers 128. Such computer-readable instructions might be executed by a controller, e.g., the control logic 116, to cause the relevant components of the apparatus to perform the method.

At 1211, a first field-effect transistor and a second field-effect transistor between a first string of series-connected memory cells and a data line might be activated concurrently with activating a third field-effect transistor and a fourth field-effect transistor between a second string of series-connected memory cells and the data line, deactivating a fifth field-effect transistor and activating a sixth field-effect transistor between a third string of series-connected memory cells and the data line, and deactivating a seventh field-effect transistor and activating an eighth field-effect transistor between a fourth string of series-connected memory cells and the data line.

The first field-effect transistor, the third field-effect transistor, the fifth field-effect transistor, and the seventh field-effect transistor might have their control gates connected to a same select line. For example, the first field-effect transistor, the third field-effect transistor, the fifth field-effect transistor, and the seventh field-effect transistor might correspond to the pre-configured select gates formed at the intersections of the select line $330_0$ and the channel material structures $244_3$, $244_1$, $244_2$, and $244_0$, respectively, of FIG. 9A. Alternatively, the first field-effect transistor, the third field-effect transistor, the fifth field-effect transistor, and the seventh field-effect transistor might correspond to the pre-configured select gates formed at the intersections of the select line $330_1$ and the channel material structures $244_7$, $244_5$, $244_6$, and $244_4$, respectively, of FIG. 9E.

The second field-effect transistor, the fourth field-effect transistor, the sixth field-effect transistor, and the eighth field-effect transistor might have their control gates connected to a same select line. For example, the second field-effect transistor, the fourth field-effect transistor, the sixth field-effect transistor, and the eighth field-effect transistor might correspond to the pre-configured select gates formed at the intersections of the select line $330_1$ and the channel material structures $244_3$, $244_1$, $244_2$, and $244_0$, respectively, of FIG. 9A. Alternatively, the second field-effect transistor, the fourth field-effect transistor, the sixth field-effect transistor, and the eighth field-effect transistor might correspond to the pre-configured select gates formed at the intersections of the select line $330_0$ and the channel material structures $244_7$, $244_5$, $244_6$, and $244_4$, respectively, of FIG. 9E.

At 1213, a ninth field-effect transistor between the first string of series-connected memory cells and the first field-effect transistor might be programmed concurrently with programming a tenth field-effect transistor between the second string of series-connected memory cells and the third field-effect transistor, inhibiting programming of an eleventh field-effect transistor between the third string of series-connected memory cells and the fifth field-effect transistor, and inhibiting programming of a twelfth field-effect transistor between the fourth string of series-connected memory cells and the seventh field-effect transistor. The ninth field-effect transistor, the tenth field-effect transistor, the eleventh field-effect transistor, and the twelfth field-effect transistor might have their control gates connected to a same select line. For example, the ninth field-effect transistor, tenth field-effect transistor, eleventh field-effect transistor, and twelfth field-effect transistor might correspond to the complementary select gates formed at the intersections of the select line $930_0$ and the channel material structures $244_3$, $244_1$, $244_2$, and $244_0$, respectively, of FIG. 9A. Alternatively, the ninth field-effect transistor, tenth field-effect transistor, eleventh field-effect transistor, and twelfth field-effect transistor might correspond to the complementary select gates formed at the intersections of the select line $930_1$ and the channel material structures $244_7$, $244_5$, $244_6$, and $244_4$, respectively, of FIG. 9E.

The ninth field-effect transistor might further be between the first string of series-connected memory cells and the second field-effect transistor, the tenth field-effect transistor might further be between the second string of series-connected memory cells and the fourth field-effect transistor, the eleventh field-effect transistor might further be between the third string of series-connected memory cells and the sixth field-effect transistor, and the twelfth field-effect transistor might further be between the fourth string of series-connected memory cells and the eighth field-effect transistor.

At 1215, the first field-effect transistor and the second field-effect transistor might be activated concurrently with activating the third field-effect transistor and deactivating the fourth field-effect transistor, activating the fifth field-effect transistor and the sixth field-effect transistor, and activating the seventh field-effect transistor and deactivating the eighth field-effect transistor.

At 1217, a thirteenth field-effect transistor between the first string of series-connected memory cells and the first field-effect transistor might be programmed concurrently with inhibiting programming of a fourteenth field-effect transistor between the second string of series-connected memory cells and the third field-effect transistor, programming a fifteenth field-effect transistor between the third string of series-connected memory cells and the fifth field-effect transistor, and inhibiting programming of a sixteenth field-effect transistor between the fourth string of series-connected memory cells and the seventh field-effect transistor. The thirteenth field-effect transistor, the fourteenth field-effect transistor, the fifteenth field-effect transistor, and the sixteenth field-effect transistor might have their control gates connected to a same select line. For example, the thirteenth field-effect transistor, fourteenth field-effect transistor, fifteenth field-effect transistor, and sixteenth field-effect transistor might correspond to the complementary select gates formed at the intersections of the select line $930_1$ and the channel material structures $244_3$, $244_1$, $244_2$, and $244_0$, respectively, of FIG. 9A. Alternatively, the thirteenth field-effect transistor, fourteenth field-effect transistor, fifteenth field-effect transistor, and sixteenth field-effect transistor might correspond to the complementary select gates formed at the intersections of the select line $930_0$ and the channel material structures $244_7$, $244_5$, $244_6$, and $244_4$, respectively, of FIG. 9E.

The thirteenth field-effect transistor might further be between the first string of series-connected memory cells and the second field-effect transistor, the fourteenth field-effect transistor might further be between the second string of series-connected memory cells and the fourth field-effect transistor, the fifteenth field-effect transistor might further be between the third string of series-connected memory cells and the sixth field-effect transistor, and the sixteenth field-effect transistor might further be between the fourth string of series-connected memory cells and the eighth field-effect transistor. In addition, the ninth field-effect transistor might further be between the first string of series-connected memory cells and the thirteenth field-effect transistor, the tenth field-effect transistor might further be between the second string of series-connected memory cells and the fourteenth field-effect transistor, the eleventh field-effect transistor might further be between the third string of series-connected memory cells and the fifteenth field-effect transistor, and the twelfth field-effect transistor might further be between the fourth string of series-connected memory cells and the sixteenth field-effect transistor.

Figure 13:
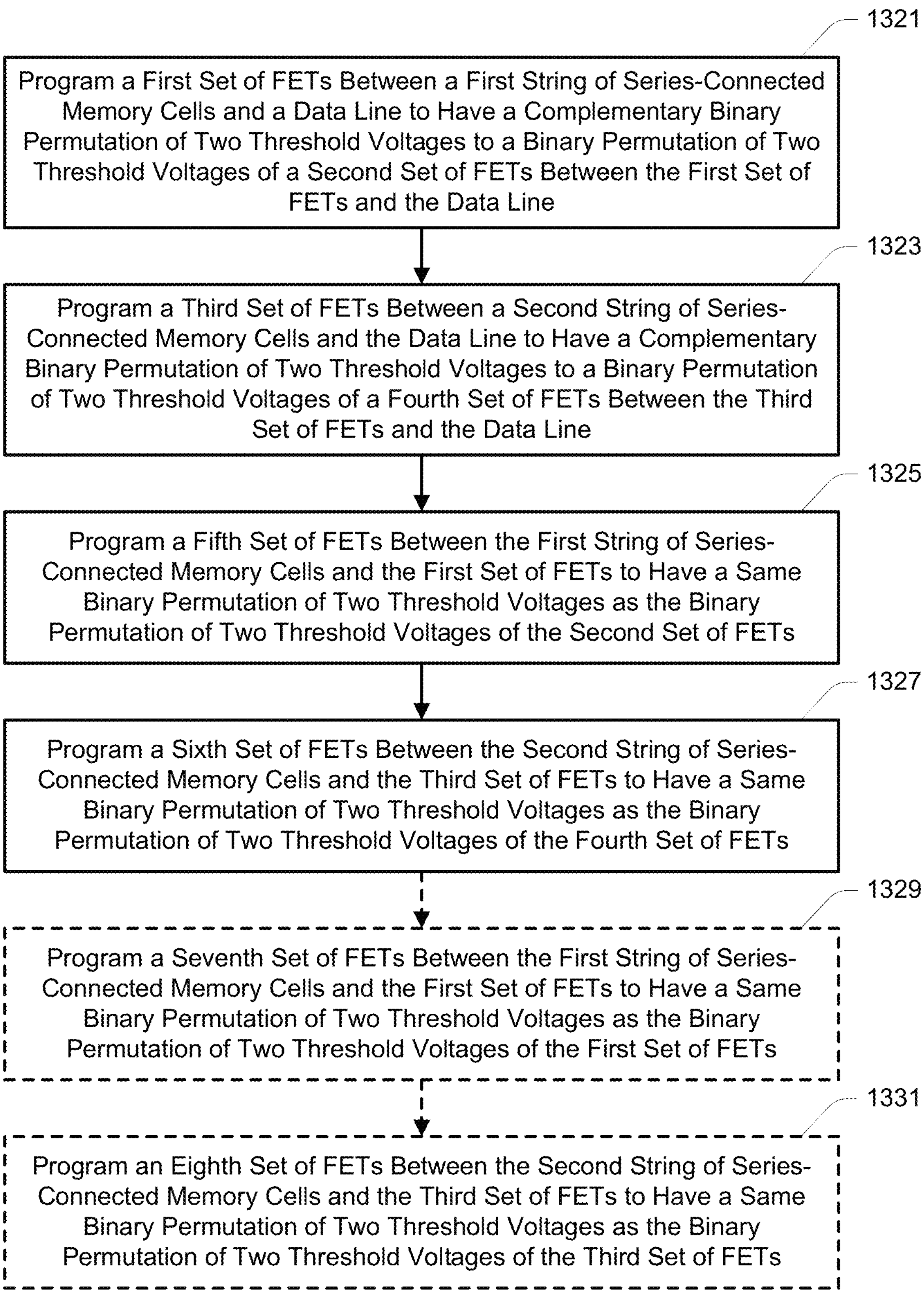
FIG. 13 is a flowchart of a method of operating an apparatus in accordance with a further embodiment.

FIG. 13 is a flowchart of a method of operating an apparatus, e.g., a memory, in accordance with an embodiment. The method might be in the form of computer-readable instructions, e.g., stored to the instruction registers 128. Such computer-readable instructions might be executed by a controller, e.g., the control logic 116, to cause the relevant components of the apparatus to perform the method.

At 1321, a first set of field-effect transistors between a first string of series-connected memory cells and a data line might be programmed to have a complementary binary permutation of two threshold voltages to a binary permutation of two threshold voltages of a second set of field-effect transistors between the first set of field-effect transistors and the data line. The first set of field-effect transistors might be the complementary select gates formed at intersections of the channel material structure $244_3$ and the select lines $930_0$ and $930_1$ of FIG. 9A or 9B, while the second set of field-effect transistors might be the pre-configured select gates formed at intersections of the channel material structure $244_3$ and the select lines $330_0$ and $330_1$ of FIG. 9A or 9B, respectively. Alternatively, the first set of field-effect transistors might be the complementary select gates formed at intersections of the channel material structure $244_7$ and the select lines $930_0$, $930_1$, and $930_2$ of FIG. 9E, while the second set of field-effect transistors might be the pre-configured select gates formed at intersections of the channel material structure $244_7$ and the select lines $330_0$, $330_1$, and $330_2$ of FIG. 9E.

At 1323, a third set of field-effect transistors between a second string of series-connected memory cells and the data line might be programmed to have a complementary binary permutation of two threshold voltages to a binary permutation of two threshold voltages of a fourth set of field-effect transistors between the third set of field-effect transistors and the data line. The third set of field-effect transistors might be the complementary select gates formed at intersections of the channel material structure $244_2$ and the select lines $930_0$ and $930_1$ of FIG. 9A or 9B, while the fourth set of field-effect transistors might be the pre-configured select gates formed at intersections of the channel material structure $244_2$ and the select lines $330_0$ and $330_1$ of FIG. 9A or 9B, respectively. Alternatively, the third set of field-effect transistors might be the complementary select gates formed at intersections of the channel material structure $244_6$ and the select lines $930_0$, $930_1$, and $930_2$ of FIG. 9E, while the fourth set of field-effect transistors might be the pre-configured select gates formed at intersections of the channel material structure $244_6$ and the select lines $330_0$, $330_1$, and $330_2$ of FIG. 9E.

For each position of the binary permutation of two threshold voltages of the first set of field-effect transistors, a field-effect transistor of the first set of field-effect transistors corresponding to that position of the binary permutation of two threshold voltages of the first set of field-effect transistors, and a field-effect transistor of the third set of field-effect transistors corresponding to that position of the binary permutation of two threshold voltages of the third set of field-effect transistors, might be connected (e.g., have their respective control gates connected) to a same select line.

For each position of the binary permutation of two threshold voltages of the second set of field-effect transistors, a field-effect transistor of the second set of field-effect transistors corresponding to that position of the binary permutation of two threshold voltages of the second set of field-effect transistors, and a field-effect transistor of the fourth set of field-effect transistors corresponding to that position of the binary permutation of two threshold voltages of the fourth set of field-effect transistors, might be connected (e.g., have their respective control gates connected) to a same select line.

Programming of the first set of field-effect transistors might be performed sequentially, and programming of the third set of field-effect transistors might be performed sequentially. For example, if the first set of field-effect transistors includes the complementary select gates formed at intersections of the channel material structure $244_3$ and the select lines $930_0$ and $930_1$ of FIG. 9A, the complementary select gate formed at the intersection of the channel material structure $244_3$ and the select line $930_0$ might be subjected to a first programming operation (e.g., either programmed or inhibited from programming), and the complementary select gate formed at the intersection of the channel material structure $244_3$ and the select line $930_1$ might then be subjected to a second programming operation (e.g., either programmed or inhibited from programming). In addition, programming of the first and third sets of field-effect transistors might occur concurrently. To continue with the example, the complementary select gates formed at intersections of the select line $930_0$ and the channel material structures $244_2$ and $244_3$ might be subjected (e.g., concurrently) to the first programming operation (e.g., either programmed or inhibited from programming), and the complementary select gates formed at intersections of the select line $930_1$ and the channel material structures $244_2$ and $244_3$ might be subjected (e.g., concurrently) to the second programming operation (e.g., either programmed or inhibited from programming). As used herein, a set of field-effect transistors will be deemed to be programmed to have its binary permutation of two threshold voltages even if each field-effect transistor of that set of field-effect transistors is to remain at an initial, e.g., erased, threshold voltage during the one or more programming operations.

At 1325, a fifth set of field-effect transistors between the first string of series-connected memory cells and the first set of field-effect transistors might be programmed to have a same binary permutation of two threshold voltages as the binary permutation of two threshold voltages of the second set of field-effect transistors. The fifth set of field-effect transistors might be the select gates formed at intersections of the channel material structure $244_3$ and the select lines $218_2$ and $218_3$ of FIG. 9A. Alternatively, the fifth set of field-effect transistors might be the select gates formed at intersections of the channel material structure $244_3$ and the select lines $218_0$ and $218_1$ of FIG. 9B. Alternatively, the fifth set of field-effect transistors might be the select gates formed at intersections of the channel material structure $244_7$ and the select lines $218_3$, $218_4$, and $218_5$ of FIG. 9E.

At 1327, a sixth set of field-effect transistors between the second string of series-connected memory cells and the third set of field-effect transistors might be programmed to have a same binary permutation of two threshold voltages as the binary permutation of two threshold voltages of the fourth set of field-effect transistors. The sixth set of field-effect transistors might be the select gates formed at intersections of the channel material structure $244_2$ and the select lines $218_2$ and $218_3$ of FIG. 9A. Alternatively, the sixth set of field-effect transistors might be the select gates formed at intersections of the channel material structure $244_2$ and the select lines $218_0$ and $218_1$ of FIG. 9B. Alternatively, the sixth set of field-effect transistors might be the select gates formed at intersections of the channel material structure $244_6$ and the select lines $218_3$, $218_4$, and $218_5$ of FIG. 9E.

For each position of the binary permutation of two threshold voltages of the fifth set of field-effect transistors, a field-effect transistor of the fifth set of field-effect transistors corresponding to that position of the binary permutation of two threshold voltages of the fifth set of field-effect transistors, and a field-effect transistor of the sixth set of field-effect transistors corresponding to that position of the binary permutation of two threshold voltages of the sixth set of field-effect transistors, might be connected (e.g., have their respective control gates connected) to a same select line.

Similar to that discussed with reference to the first set of field-effect transistors and the third set of field-effect transistors, programming of the fifth set of field-effect transistors and programming of the sixth set of field-effect transistors might be performed sequentially through the individual field-effect transistors of those sets of field-effect transistors, and concurrently among those sets of field-effect transistors.

Optionally, at 1329, a seventh set of field-effect transistors between the first string of series-connected memory cells and the first set of field-effect transistors might be programmed to have a same binary permutation of two threshold voltages as the binary permutation of two threshold voltages of the first set of field-effect transistors. The seventh set of field-effect transistors might be the select gates formed at intersections of the channel material structure $244_3$ and the select lines $218_0$ and $218_1$ of FIG. 9A. Alternatively, the seventh set of field-effect transistors might be the select gates formed at intersections of the channel material structure $244_7$ and the select lines $218_0$, $218_1$, and $218_2$ of FIG. 9E.

Optionally, at 1331, an eighth set of field-effect transistors between the second string of series-connected memory cells and the third set of field-effect transistors might be programmed to have a same binary permutation of two threshold voltages as the binary permutation of two threshold voltages of the third set of field-effect transistors. The eighth set of field-effect transistors might be the select gates formed at intersections of the channel material structure $244_2$ and the select lines $218_0$ and $218_1$ of FIG. 9A. Alternatively, the eighth set of field-effect transistors might be the select gates formed at intersections of the channel material structure $244_6$ and the select lines $218_0$, $218_1$, and $218_2$ of FIG. 9E.

For each position of the binary permutation of two threshold voltages of the seventh set of field-effect transistors, a field-effect transistor of the seventh set of field-effect transistors corresponding to that position of the binary permutation of two threshold voltages of the seventh set of field-effect transistors, and a field-effect transistor of the eighth set of field-effect transistors corresponding to that position of the binary permutation of two threshold voltages of the eighth set of field-effect transistors, might be connected (e.g., have their respective control gates connected) to a same select line.

Similar to that discussed with reference to the first set of field-effect transistors and the third set of field-effect transistors, programming of the seventh set of field-effect transistors and programming of the eighth set of field-effect transistors might be performed sequentially through the individual field-effect transistors of those sets of field-effect transistors, and concurrently among those sets of field-effect transistors.

Figure 14:
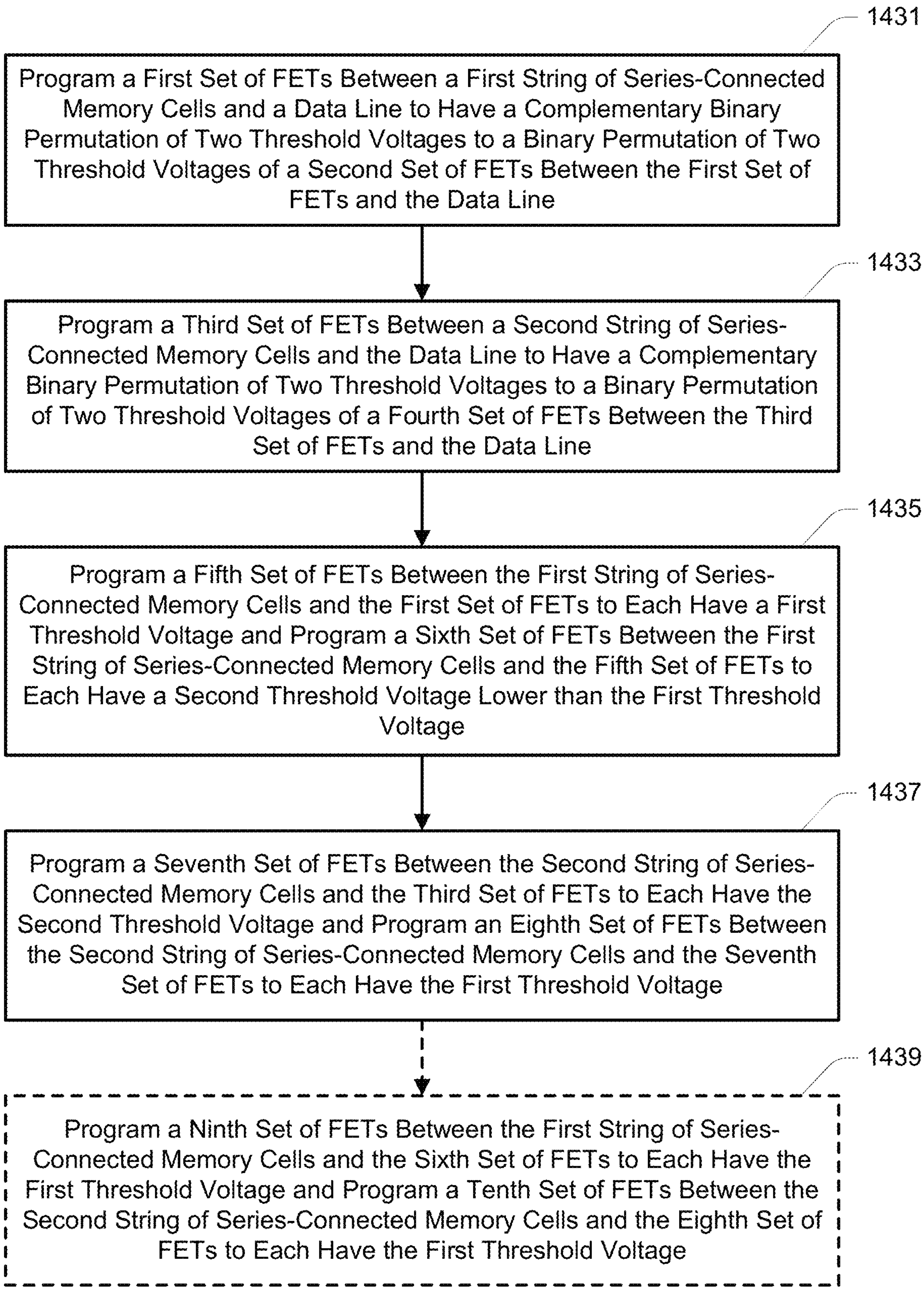
FIG. 14 is a flowchart of a method of operating an apparatus in accordance with a still further embodiment.

FIG. 14 is a flowchart of a method of operating an apparatus, e.g., a memory, in accordance with an embodiment. The method might be in the form of computer-readable instructions, e.g., stored to the instruction registers 128. Such computer-readable instructions might be executed by a controller, e.g., the control logic 116, to cause the relevant components of the apparatus to perform the method.

At 1431, a first set of field-effect transistors between a first string of series-connected memory cells and a data line might be programmed to have a complementary binary permutation of two threshold voltages to a binary permutation of two threshold voltages of a second set of field-effect transistors between the first set of field-effect transistors and the data line. The first set of field-effect transistors might be the complementary select gates formed at intersections of the channel material structure $244_3$ and the select lines $930_0$ and $930_1$ of FIG. 9C or 9D, while the second set of field-effect transistors might be the pre-configured select gates formed at intersections of the channel material structure $244_3$ and the select lines $330_0$ and $330_1$ of FIG. 9C or 9D, respectively.

At 1433 a third set of field-effect transistors between a second string of series-connected memory cells and the data line might be programmed to have a complementary binary permutation of two threshold voltages to a binary permutation of two threshold voltages of a fourth set of field-effect transistors between the third set of field-effect transistors and the data line. The third set of field-effect transistors might be the complementary select gates formed at intersections of the channel material structure $244_2$ and the select lines $930_0$ and $930_1$ of FIG. 9C or 9D, while the fourth set of field-effect transistors might be the pre-configured select gates formed at intersections of the channel material structure $244_2$ and the select lines $330_0$ and $330_1$ of FIG. 9C or 9D, respectively.

For each position of the binary permutation of two threshold voltages of the first set of field-effect transistors, a field-effect transistor of the first set of field-effect transistors corresponding to that position of the binary permutation of two threshold voltages of the first set of field-effect transistors, and a field-effect transistor of the third set of field-effect transistors corresponding to that position of the binary permutation of two threshold voltages of the third set of field-effect transistors, might be connected (e.g., have their respective control gates connected) to a same select line.

For each position of the binary permutation of two threshold voltages of the second set of field-effect transistors, a field-effect transistor of the second set of field-effect transistors corresponding to that position of the binary permutation of two threshold voltages of the second set of field-effect transistors, and a field-effect transistor of the fourth set of field-effect transistors corresponding to that position of the binary permutation of two threshold voltages of the fourth set of field-effect transistors, might be connected (e.g., have their respective control gates connected) to a same select line.

Programming of the first set of field-effect transistors might be performed sequentially, and programming of the third set of field-effect transistors might be performed sequentially. For example, if the first set of field-effect transistors includes the complementary select gates formed at intersections of the channel material structure $244_3$ and the select lines $930_0$ and $930_1$ of FIG. 9C, the complementary select gate formed at the intersection of the channel material structure $244_3$ and the select line $930_0$ might be subjected to a first programming operation (e.g., either programmed or inhibited from programming), and the complementary select gate formed at the intersection of the channel material structure $244_3$ and the select line $930_1$ might then be subjected to a second programming operation (e.g., either programmed or inhibited from programming). In addition, programming of the first and third sets of field-effect transistors might occur concurrently. To continue with the example, the complementary select gates formed at intersections of the select line $930_0$ and the channel material structures $244_2$ and $244_3$ might be subjected (e.g., concurrently) to the first programming operation (e.g., either programmed or inhibited from programming), and the complementary select gates formed at intersections of the select line $930_1$ and the channel material structures $244_2$ and $244_3$ might be subjected (e.g., concurrently) to the second programming operation (e.g., either programmed or inhibited from programming). As used herein, a set of field-effect transistors will be deemed to be programmed to have its binary permutation of two threshold voltages even if each field-effect transistor of that set of field-effect transistors is to remain at an initial, e.g., erased, threshold voltage during the one or more programming operations.

At 1435, a fifth set of field-effect transistors between the first string of series-connected memory cells and the first set of field-effect transistors might be programmed to each have a first threshold voltage, and a sixth set of field-effect transistors between the first string of series-connected memory cells and the fifth set of field-effect transistors might be programmed to each have a second threshold voltage lower than the first threshold voltage. The fifth set of field-effect transistors might be the select gates formed at intersections of the channel material structure $244_3$ and the select lines $218_{30}$, $218_{31}$ and $218_{32}$ of FIG. 9C, and the sixth set of field-effect transistors might be the select gates formed at intersections of the channel material structure $244_3$ and the select lines $218_{20}$, $218_{21}$ and $218_{22}$ of FIG. 9C. Alternatively, the fifth set of field-effect transistors might be the select gate formed at the intersection of the channel material structure $244_3$ and the select line $218_3$ of FIG. 9D, and the sixth set of field-effect transistors might be the select gate formed at the intersection of the channel material structure $244_3$ and the select line $218_2$ of FIG. 9D.

Similar to that discussed with reference to the first set of field-effect transistors and the third set of field-effect transistors, programming of the fifth set of field-effect transistors and programming of the sixth set of field-effect transistors might be performed sequentially through the individual field-effect transistors of those sets of field-effect transistors. For example, the field-effect transistors of the sixth set of field-effect transistors might be programmed from bottom to top, then the field-effect transistors of the fifth set of field-effect transistors might be programmed from bottom to top. For embodiments having more than two sub-blocks of memory cells, additional sets of field-effect transistors, e.g., the select gates formed at intersections of the channel material structure $244_3$ and the select lines $218_{00}$, $218_{01}$, $218_{02}$, $218_{10}$, $218_{11}$, and $218_{12}$ of FIG. 9C, might be programmed, e.g., sequentially programmed, to have the second threshold voltage prior to programming the sixth set of field-effect transistors.

At 1437, a seventh set of field-effect transistors between the second string of series-connected memory cells and the third set of field-effect transistors might be programmed to each have the second threshold voltage, and an eighth set of field-effect transistors between the second string of series-connected memory cells and the seventh set of field-effect transistors might be programmed to each have the first threshold voltage. The seventh set of field-effect transistors might be the select gates formed at intersections of the channel material structure $244_2$ and the select lines $218_{30}$, $218_{31}$ and $218_{32}$ of FIG. 9C, and the eighth set of field-effect transistors might be the select gates formed at intersections of the channel material structure $244_2$ and the select lines $218_{20}$, $218_{21}$ and $218_{22}$ of FIG. 9C. Alternatively, the seventh set of field-effect transistors might be the select gate formed at the intersection of the channel material structure $244_2$ and the select line $218_3$ of FIG. 9D, and the eighth set of field-effect transistors might be the select gate formed at the intersection of the channel material structure $244_2$ and the select line $218_2$ of FIG. 9D.

Similar to that discussed with reference to the first set of field-effect transistors and the third set of field-effect transistors, programming of the seventh set of field-effect transistors and programming of the eighth set of field-effect transistors might be performed sequentially through the individual field-effect transistors of those sets of field-effect transistors. For example, the field-effect transistors of the eighth set of field-effect transistors might be programmed from bottom to top, then the field-effect transistors of the seventh set of field-effect transistors might be programmed from bottom to top. For embodiments having more than two sub-blocks of memory cells, additional sets of field-effect transistors, e.g., the select gates formed at intersections of the channel material structure $244_2$ and the select lines $218_{00}$, $218_{01}$, $218_{02}$, $218_{10}$, $218_{11}$, and $218_{12}$ of FIG. 9C, might be programmed, e.g., sequentially programmed, to have the second threshold voltage prior to programming the eighth set of field-effect transistors.

Optionally, at 1439, a ninth set of field-effect transistors between the first string of series-connected memory cells and the sixth set of field-effect transistors might be programmed to have the first threshold voltage and a tenth set of field-effect transistors between the second string of series-connected memory cells and the eighth set of field-effect transistors might be programmed to have the first threshold voltage. The ninth set of field-effect transistors might be the select gates formed at intersections of the channel material structure $244_3$ and the select lines $918_0$, $918_1$, and $918_2$ of FIG. 9D, and the tenth set of field-effect transistors might be the select gates formed at intersections of the channel material structure $244_2$ and the select lines $918_0$, $918_1$, and $918_2$ of FIG. 9D

CONCLUSION

Although specific embodiments have been illustrated and described herein, it will be appreciated by those of ordinary skill in the art that any arrangement that is calculated to achieve the same purpose might be substituted for the specific embodiments shown. Many adaptations of the embodiments will be apparent to those of ordinary skill in the art. Accordingly, this application is intended to cover any adaptations or variations of the embodiments.

What is claimed is:

1. An apparatus, comprising:

an array of memory cells comprising a plurality of strings of series-connected memory cells;

a data line;

a first set of field-effect transistors between the data line and a first string of series-connected memory cells of the plurality of strings of series-connected memory cells, wherein each field-effect transistor of the first set of field-effect transistors is connected in series between the data line and the first string of series-connected memory cells;

a second set of field-effect transistors between the data line and a second string of series-connected memory cells of the plurality of strings of series-connected memory cells, wherein each field-effect transistor of the second set of field-effect transistors is connected in series between the data line and the second string of series-connected memory cells;

a first select line connected to a control gate of a respective field-effect transistor of the first set of field-effect transistors, and to a control gate of a respective field-effect transistor of the second set of field-effect transistors, corresponding to a first position of the first binary permutation of two threshold voltages and of the second binary permutation of two threshold voltages; and a second select line connected to a control gate of a respective field-effect transistor of the first set of field-effect transistors, and to a control gate of a respective field-effect transistor of the second set of field-effect transistors, corresponding to a second position of the first binary permutation of two threshold voltages and of the second binary permutation of two threshold voltages;

wherein the first set of field-effect transistors was fabricated to have a first binary permutation of two threshold voltages; and wherein the second set of field-effect transistors was fabricated to have a second binary permutation of two threshold voltages different than the first binary permutation of two threshold voltages.

2. The apparatus of claim 1, wherein a respective channel of each field-effect transistor of the first set of field-effect transistors is configured to have a respective concentration of an impurity selected from a group consisting of a first concentration of the impurity and a second concentration of the impurity different than the first concentration of the impurity.

3. The apparatus of claim 2, wherein the second concentration of the impurity is lower than the first concentration of the impurity.

4. The apparatus of claim 3, wherein a channel of a field-effect transistor having the second concentration of the impurity is devoid of the impurity.

5. The apparatus of claim 2, wherein the impurity comprises boron.

6. The apparatus of claim 1, further comprising:

a third set of field-effect transistors between the data line and a third string of series-connected memory cells of the plurality of strings of series-connected memory cells;

wherein the first select line is further connected to a control gate of a respective field-effect transistor of the third set of field-effect transistors;

wherein the second select line is further connected to a control gate of a respective field-effect transistor of the third set of field-effect transistors; and wherein the third set of field-effect transistors was fabricated to have a third binary permutation of two threshold voltages different than the first binary permutation of two threshold voltages and different than the second binary permutation of two threshold voltages.

7. The apparatus of claim 6, further comprising:

a fourth set of field-effect transistors between the data line and a fourth string of series-connected memory cells of the plurality of strings of series-connected memory cells;

wherein the first select line is further connected to a control gate of a respective field-effect transistor of the fourth set of field-effect transistors;

wherein the second select line is further connected to a control gate of a respective field-effect transistor of the fourth set of field-effect transistors; and wherein the fourth set of field-effect transistors was fabricated to have a fourth binary permutation of two threshold voltages different than the first binary permutation of two threshold voltages, different than the second binary permutation of two threshold voltages, and different than the third binary permutation of two threshold voltages.

8. The apparatus of claim 1, further comprising:

a third select line connected to a control gate of a respective field-effect transistor of the first set of field-effect transistors, and to a control gate of a respective field-effect transistor of the second set of field-effect transistors.

9. The apparatus of claim 8, further comprising:

a third set of field-effect transistors between the data line and a third string of series-connected memory cells of the plurality of strings of series-connected memory cells;

a fourth set of field-effect transistors between the data line and a fourth string of series-connected memory cells of the plurality of strings of series-connected memory cells; and a fifth set of field-effect transistors between the data line and a fifth string of series-connected memory cells of the plurality of strings of series-connected memory cells;

wherein the first select line is further connected to a control gate of a respective field-effect transistor of the third set of field-effect transistors, to a control gate of a respective field-effect transistor of the fourth set of field-effect transistors, and to a control gate of a respective field-effect transistor of the fifth set of field-effect transistors;

wherein the second select line is further connected to a control gate of a respective field-effect transistor of the third set of field-effect transistors, to a control gate of a respective field-effect transistor of the fourth set of field-effect transistors, and to a control gate of a respective field-effect transistor of the fifth set of field-effect transistors;

wherein the third select line is further connected to a control gate of a respective field-effect transistor of the third set of field-effect transistors, to a control gate of a respective field-effect transistor of the fourth set of field-effect transistors, and to a control gate of a respective field-effect transistor of the fifth set of field-effect transistors;

wherein the third set of field-effect transistors was fabricated to have a third binary permutation of two threshold voltages;

wherein the fourth set of field-effect transistors was fabricated to have a fourth binary permutation of two threshold voltages;

wherein the fifth set of field-effect transistors was fabricated to have a fifth binary permutation of two threshold voltages; and wherein the first binary permutation of two threshold voltages, the second binary permutation of two threshold voltages, the third binary permutation of two threshold voltages, the fourth binary permutation of two threshold voltages, and the fifth binary permutation of two threshold voltages are each mutually exclusive.

10. The apparatus of claim 9, further comprising:

a sixth set of field-effect transistors between the data line and a sixth string of series-connected memory cells of the plurality of strings of series-connected memory cells;

a seventh set of field-effect transistors between the data line and a seventh string of series-connected memory cells of the plurality of strings of series-connected memory cells; and an eighth set of field-effect transistors between the data line and an eighth string of series-connected memory cells of the plurality of strings of series-connected memory cells;

wherein the first select line is further connected to a control gate of a respective field-effect transistor of the sixth set of field-effect transistors, to a control gate of a respective field-effect transistor of the seventh set of field-effect transistors, and to a control gate of a respective field-effect transistor of the eighth set of field-effect transistors;

wherein the second select line is further connected to a control gate of a respective field-effect transistor of the sixth set of field-effect transistors, to a control gate of a respective field-effect transistor of the seventh set of field-effect transistors, and to a control gate of a respective field-effect transistor of the eighth set of field-effect transistors;

wherein the third select line is further connected to a control gate of a respective field-effect transistor of the sixth set of field-effect transistors, to a control gate of a respective field-effect transistor of the seventh set of field-effect transistors, and to a control gate of a respective field-effect transistor of the eighth set of field-effect transistors;

wherein the sixth set of field-effect transistors was fabricated to have a sixth binary permutation of two threshold voltages;

wherein the seventh set of field-effect transistors was fabricated to have a seventh binary permutation of two threshold voltages;

wherein the eighth set of field-effect transistors was fabricated to have an eighth binary permutation of two threshold voltages; and wherein the first binary permutation of two threshold voltages, the second binary permutation of two threshold voltages, the third binary permutation of two threshold voltages, the fourth binary permutation of two threshold voltages, the fifth binary permutation of two threshold voltages, the sixth binary permutation of two threshold voltages, the seventh binary permutation of two threshold voltages and the eighth binary permutation of two threshold voltages are each mutually exclusive.

11. An apparatus, comprising:

an array of memory cells comprising a plurality of strings of series-connected memory cells;

a data line;

a plurality of sets of field-effect transistors, wherein each set of field-effect transistors of the plurality of sets of field-effect transistors is between the data line and a respective string of series-connected memory cells of the plurality of strings of series-connected memory cells, wherein each set of field-effect transistors of the plurality of sets of field-effect transistors has N field-effect transistors connected in series, and wherein each set of field-effect transistors of the plurality of sets of field-effect transistors was fabricated to have a respective binary permutation of two threshold voltages of a plurality of possible binary permutations of two threshold voltages having N positions; and N select lines, wherein each select line of the N select lines is connected to a control gate of a respective field-effect transistor of each set of field-effect transistors of the plurality of sets of field-effect transistors corresponding to a same position of the plurality of possible binary permutations of two threshold voltages.

12. The apparatus of claim 11, wherein the array of memory cells comprises a block of memory cells containing a plurality of sub-blocks of memory cells, wherein each sub-block of memory cells of the plurality of sub-blocks of memory cells contains a respective set of field-effect transistors of the plurality of sets of field-effect transistors, and wherein a number of sub-blocks of memory cells of the plurality of sub-blocks of memory cells is less than or equal to 2^N.

13. The apparatus of claim 12, wherein the plurality of sets of field-effect transistors is a first plurality of sets of field-effect transistors, wherein the data line is a first data line, wherein the plurality of strings of series-connected memory cells is a first plurality of strings of series-connected memory cells, wherein the array of memory cells further comprises a second plurality of strings of series-connected memory cells, and wherein the apparatus further comprises:

a second data line; and a second plurality of sets of field-effect transistors, wherein each set of field-effect transistors of the second plurality of sets of field-effect transistors is between the second data line and a respective string of series-connected memory cells of the second plurality of strings of series-connected memory cells, wherein each set of field-effect transistors of the second plurality of sets of field-effect transistors has N field-effect transistors connected in series, and wherein each set of field-effect transistors of the second plurality of sets of field-effect transistors was fabricated to have a respective binary permutation of two threshold voltages of a plurality of possible binary permutations of two threshold voltages having N positions;

wherein each select line of the N select lines is connected to a control gate of a respective field-effect transistor of each set of field-effect transistors of the first plurality of sets of field-effect transistors and each set of field-effect transistors of the second plurality of sets of field-effect transistors corresponding to a same position of the plurality of possible binary permutations of two threshold voltages;

wherein each sub-block of memory cells of the plurality of sub-blocks of memory cells further contains a respective set of field-effect transistors of the second plurality of sets of field-effect transistors; and wherein, for each sub-block of memory cells of the plurality of sub-blocks of memory cells, its respective set of field-effect transistors of the first plurality of sets of field-effect transistors and its respective set of field-effect transistors of the second plurality of sets of field-effect transistors were fabricated to have a same binary permutation of two threshold voltages.

14. The apparatus of claim 11, wherein N is greater than or equal to one.

15. The apparatus of claim 14, wherein N is greater than one, and wherein, for at least one set of field-effect transistors of the plurality of sets of field-effect transistors, one of the N field-effect transistors of that set of field-effect transistors comprises a channel having a first concentration of an impurity and a different one of the N field-effect transistors of that set of field-effect transistors comprises a channel having a second concentration of the impurity different than the first concentration of the impurity.

16. The apparatus of claim 15, wherein the second concentration of the impurity is lower than the first concentration of the impurity.

17. The apparatus of claim 15, wherein the impurity is boron.

18. The apparatus of claim 15, wherein, for at least one other set of field-effect transistors of the plurality of sets of field-effect transistors, one of the N field-effect transistors of that set of field-effect transistors comprises a channel having the first concentration of the impurity and a different one of the N field-effect transistors of that set of field-effect transistors comprises a channel having the first concentration of the impurity.

19. The apparatus of claim 11, wherein the plurality of sets of field-effect transistors is a first plurality of sets of field-effect transistors, wherein the N select lines is N first select lines, and wherein the apparatus further comprises:

a second plurality of sets of field-effect transistors, wherein each set of field-effect transistors of the second plurality of sets of field-effect transistors is between a respective set of field-effect transistors of the first plurality of field-effect transistors and the respective string of series-connected memory cells of its respective set of field-effect transistors of the first plurality of field-effect transistors, wherein each set of field-effect transistors of the second plurality of sets of field-effect transistors has N field-effect transistors connected in series, and wherein each set of field-effect transistors of the second plurality of sets of field-effect transistors is configured to be programmed to have a respective binary permutation of two threshold voltages of the plurality of possible binary permutations of two threshold voltages having N positions that is a complement of the binary permutation of two threshold voltages of its respective set of field-effect transistors of the first plurality of field-effect transistors; and N second select lines, wherein each second select line of the N second select lines is connected to a control gate of a respective field-effect transistor of each set of field-effect transistors of the second plurality of sets of field-effect transistors corresponding to a same position of the plurality of possible binary permutations of two threshold voltages.

20. The apparatus of claim 1, wherein a first threshold voltage of the first binary permutation of two threshold voltages is higher than a second threshold voltage of the first binary permutation of two threshold voltages, wherein a first threshold voltage of the second binary permutation of two threshold voltages is higher than a second threshold voltage of the second binary permutation of two threshold voltages, and wherein the first threshold voltage of the first binary permutation of two threshold voltages is different than the first threshold voltage of the second binary permutation of two threshold voltages.

21. The apparatus of claim 1, wherein a first threshold voltage of the respective field-effect transistor of the first set of field-effect transistors for the first select line is higher than a second threshold voltage of the respective field-effect transistor of the second set of field-effect transistors for the first select line, and wherein a third threshold voltage of the respective field-effect transistor of the first set of field-effect transistors for the second select line is lower than a fourth threshold voltage of the respective field-effect transistor of the second set of field-effect transistors for the second select line.

22. The apparatus of claim 21, wherein the first threshold voltage is equal to the fourth threshold voltage, and wherein the second threshold voltage is equal to the third threshold voltage.

23. The apparatus of claim 21, wherein the first threshold voltage is different than the fourth threshold voltage, and wherein the second threshold voltage is different than the third threshold voltage.

24. The apparatus of claim 1, further comprising:

a third set of field-effect transistors between the data line and the first string of series-connected memory cells;

a fourth set of field-effect transistors between the data line and the second string of series-connected memory cells;

a third select line connected to a control gate of a respective field-effect transistor of the third set of field-effect transistors, and to a control gate of a respective field-effect transistor of the fourth set of field-effect transistors; and a fourth select line connected to a control gate of a respective field-effect transistor of the third set of field-effect transistors, and to a control gate of a respective field-effect transistor of the fourth set of field-effect transistors;

wherein the third set of field-effect transistors was fabricated to have the first binary permutation of two threshold voltages;

wherein the fourth set of field-effect transistors was fabricated to have the second binary permutation of two threshold voltages;

wherein each field-effect transistor of the first set of field-effect transistors is immediately adjacent a corresponding field-effect transistor of the first set of field-effect transistors fabricated to have a same threshold voltage; and wherein each field-effect transistor of the second set of field-effect transistors is immediately adjacent a corresponding field-effect transistor of the fourth set of field-effect transistors fabricated to have a same threshold voltage.

25. The apparatus of claim 10, wherein a first threshold voltage of the first binary permutation of two threshold voltages is higher than a second threshold voltage of the first binary permutation of two threshold voltages, wherein a first threshold voltage of the second binary permutation of two threshold voltages is higher than a second threshold voltage of the second binary permutation of two threshold voltages, and wherein the first threshold voltage of the first binary permutation of two threshold voltages and the first threshold voltage of the second binary permutation of two threshold voltages are each positive threshold voltages.

26. The apparatus of claim 25, wherein the second threshold voltage of the first binary permutation of two threshold voltages and the second threshold voltage of the second binary permutation of two threshold voltages are each positive threshold voltages.

27. The apparatus of claim 25, wherein the second threshold voltage of the first binary permutation of two threshold voltages and the second threshold voltage of the second binary permutation of two threshold voltages are each negative threshold voltages.

28. The apparatus of claim 1, wherein the second select line is nearer the data line than the first select line.

29. The apparatus of claim 8, wherein the third select line is between the first select line and the second select line.

30. The apparatus of claim 11, wherein a first threshold voltage of the respective binary permutation of two threshold voltages for a particular set of field-effect transistors of the plurality of sets of field-effect transistors is higher than a second threshold voltage of the respective binary permutation of two threshold voltages for the particular set of field-effect transistors of the plurality of sets of field-effect transistors, wherein a first threshold voltage of the respective binary permutation of two threshold voltages for a different set of field-effect transistors of the plurality of sets of field-effect transistors is higher than a second threshold voltage of the respective binary permutation of two threshold voltages for the different set of field-effect transistors of the plurality of sets of field-effect transistors, and wherein the first threshold voltage of the respective binary permutation of two threshold voltages for the particular set of field-effect transistors of the plurality of sets of field-effect transistors is a same threshold voltage as the first threshold voltage of the respective binary permutation of two threshold voltages for the different set of field-effect transistors of the plurality of sets of field-effect transistors.

31. The apparatus of claim 11, wherein a first threshold voltage of the respective field-effect transistor of a particular set of field-effect transistors of the plurality of sets of field-effect transistors for the first select line is higher than a second threshold voltage of the respective field-effect transistor of a different set of field-effect transistors of the plurality of sets of field-effect transistors for the first select line, and wherein a third threshold voltage of the respective field-effect transistor of the particular set of field-effect transistors of the plurality of sets of field-effect transistors for the second select line is lower than a fourth threshold voltage of the respective field-effect transistor of the different set of field-effect transistors of the plurality of sets of field-effect transistors for the second select line.

32. The apparatus of claim 31, wherein the first threshold voltage is equal to the fourth threshold voltage, and wherein the second threshold voltage is equal to the third threshold voltage.

33. The apparatus of claim 31, wherein the first threshold voltage is different than the fourth threshold voltage, and wherein the second threshold voltage is different than the third threshold voltage.

34. The apparatus of claim 11, wherein the N select lines are N first select lines, wherein the plurality of sets of field-effect transistors is a first plurality of sets of field-effect transistors, and wherein the apparatus further comprises:

a second plurality of sets of field-effect transistors, wherein each set of field-effect transistors of the second plurality of sets of field-effect transistors corresponds to a respective set of field-effect transistors of the first plurality of sets of field-effect transistors, wherein each set of field-effect transistors of the second plurality of sets of field-effect transistors is between the data line and the respective string of series-connected memory cells of its corresponding set of field-effect transistors of the first plurality of sets of field-effect transistors, wherein each set of field-effect transistors of the second plurality of sets of field-effect transistors has N field-effect transistors connected in series, and wherein each set of field-effect transistors of the second plurality of sets of field-effect transistors was fabricated to have a respective binary permutation of two threshold voltages of the plurality of possible binary permutations of two threshold voltages that is the same as the respective binary permutation of two threshold voltages of its corresponding set of field-effect transistors of the first plurality of sets of field-effect transistors; and N second select lines, wherein each second select line of the N second select lines is connected to a control gate of a respective field-effect transistor of each set of field-effect transistors of the second plurality of sets of field-effect transistors corresponding to a same position of the plurality of possible binary permutations of two threshold voltages;

wherein each field-effect transistor of each set of field-effect transistors of the second plurality of sets of field-effect transistors is immediately adjacent a corresponding field-effect transistor of its corresponding set of field-effect transistors of the first plurality of sets of field-effect transistors fabricated to have a same threshold voltage.

35. The apparatus of claim 11, wherein the two threshold voltages for each binary permutation of two threshold voltages of the plurality of possible binary permutations of two threshold voltages are each positive threshold voltages.

36. The apparatus of claim 11, wherein one threshold voltage of the two threshold voltages for each binary permutation of two threshold voltages of the plurality of possible binary permutations of two threshold voltages is a positive threshold voltage and wherein a different threshold voltage of the two threshold voltages for each binary permutation of two threshold voltages of the plurality of possible binary permutations of two threshold voltages is a negative threshold voltage.

37. An apparatus, comprising:

an array of memory cells comprising a plurality of strings of series-connected memory cells;

a first data line;

a second data line;

a first plurality of sets of field-effect transistors, wherein each set of field-effect transistors of the first plurality of sets of field-effect transistors is between the first data line and a respective string of series-connected memory cells of the plurality of strings of series-connected memory cells, wherein each set of field-effect transistors of the first plurality of sets of field-effect transistors has N field-effect transistors connected in series, and wherein each set of field-effect transistors of the first plurality of sets of field-effect transistors was fabricated to have a respective binary permutation of two threshold voltages of a plurality of possible binary permutations of two threshold voltages having N positions;

a second plurality of sets of field-effect transistors, wherein each set of field-effect transistors of the second plurality of sets of field-effect transistors is between the second data line and a respective string of series-connected memory cells of the plurality of strings of series-connected memory cells, wherein each set of field-effect transistors of the second plurality of sets of field-effect transistors has N field-effect transistors connected in series, and wherein each set of field-effect transistors of the second plurality of sets of field-effect transistors was fabricated to have a respective binary permutation of two threshold voltages of the plurality of possible binary permutations of two threshold voltages having N positions; and N select lines, wherein N is an integer value greater than or equal to one, and wherein each select line of the N select lines is connected to a control gate of a respective field-effect transistor of each set of field-effect transistors of the first plurality of sets of field-effect transistors and a respective field-effect transistor of each set of field-effect transistors of the second plurality of sets of field-effect transistors corresponding to a same position of the plurality of possible binary permutations of two threshold voltages.

38. The apparatus of claim 37, wherein each set of field-effect transistors of the first plurality of sets of field-effect transistors corresponds to a respective set of field-effect transistors of the second plurality of sets of field-effect transistors, and wherein each set of field-effect transistors of the first plurality of sets of field-effect transistors was fabricated to have a same binary permutation of two threshold voltages as the binary permutation of two threshold voltages of its corresponding set of field-effect transistors of the second plurality of sets of field-effect transistors.

39. The apparatus of claim 38, wherein the array of memory cells comprises a block of memory cells containing a plurality of sub-blocks of memory cells, wherein each sub-block of memory cells of the plurality of sub-blocks of memory cells contains a respective set of field-effect transistors of the first plurality of sets of field-effect transistors and its corresponding set of field-effect transistors of the second plurality of sets of field-effect transistors, and wherein a number of sub-blocks of memory cells of the plurality of sub-blocks of memory cells is less than or equal to 2N.

40. The apparatus of claim 39, wherein N is greater than one, and wherein, for a particular set of field-effect transistors of the first plurality of sets of field-effect transistors, one of the N field-effect transistors of the particular set of field-effect transistors of the first plurality of sets of field-effect transistors comprises a channel having a first concentration of an impurity and a different one of the N field-effect transistors of the particular set of field-effect transistors of the first plurality of sets of field-effect transistors comprises a channel having a second concentration of the impurity different than the first concentration of the impurity.

41. The apparatus of claim 40, wherein the control gate of the one of the N field-effect transistors of the particular set of field-effect transistors of the first plurality of sets of field-effect transistors is connected to one select line of the N select lines, wherein the control gate of the different one of the N field-effect transistors of the particular set of field-effect transistors of the first plurality of sets of field-effect transistors is connected to a different select line of the N select lines, wherein a field-effect transistor of the corresponding set of field-effect transistors of the second plurality of sets of field-effect transistors for the particular set of field-effect transistors of the first plurality of sets of field-effect transistors having its control gate connected to the one select line comprises a channel having the first concentration of the impurity, and wherein a field-effect transistor of the corresponding set of field-effect transistors of the second plurality of sets of field-effect transistors for the particular set of field-effect transistors of the first plurality of sets of field-effect transistors having its control gate connected to the different select line comprises a channel having the second concentration of the impurity.

42. The apparatus of claim 40, wherein the impurity is a p-type impurity.

43. The apparatus of claim 40, wherein a channel having the second concentration of the impurity is devoid of the impurity.

44. The apparatus of claim 37, wherein the N select lines are N first select lines, and wherein the apparatus further comprises:

a third plurality of sets of field-effect transistors, wherein each set of field-effect transistors of the third plurality of sets of field-effect transistors is between a respective set of field-effect transistors of the first plurality of field-effect transistors and the respective string of series-connected memory cells of its respective set of field-effect transistors of the first plurality of field-effect transistors, wherein each set of field-effect transistors of the third plurality of sets of field-effect transistors has N field-effect transistors connected in series, and wherein each set of field-effect transistors of the third plurality of sets of field-effect transistors is configured to be programmed to have a respective binary permutation of two threshold voltages of the plurality of possible binary permutations of two threshold voltages having N positions that is a complement of the binary permutation of two threshold voltages of its respective set of field-effect transistors of the first plurality of field-effect transistors;

a fourth plurality of sets of field-effect transistors, wherein each set of field-effect transistors of the fourth plurality of sets of field-effect transistors is between a respective set of field-effect transistors of the second plurality of field-effect transistors and the respective string of series-connected memory cells of its respective set of field-effect transistors of the second plurality of field-effect transistors, wherein each set of field-effect transistors of the fourth plurality of sets of field-effect transistors has N field-effect transistors connected in series, and wherein each set of field-effect transistors of the fourth plurality of sets of field-effect transistors is configured to be programmed to have a respective binary permutation of two threshold voltages of the plurality of possible binary permutations of two threshold voltages having N positions that is a complement of the binary permutation of two threshold voltages of its respective set of field-effect transistors of the second plurality of field-effect transistors; and N second select lines, wherein each second select line of the N second select lines is connected to a control gate of a respective field-effect transistor of each set of field-effect transistors of the third plurality of sets of field-effect transistors and to a control gate of a respective field-effect transistor of each set of field-effect transistors of the fourth plurality of sets of field-effect transistors corresponding to a same position of the plurality of possible binary permutations of two threshold voltages.

45. The apparatus of claim 37, wherein the N select lines are N first select lines, and wherein the apparatus further comprises:

a third plurality of sets of field-effect transistors, wherein each set of field-effect transistors of the third plurality of sets of field-effect transistors corresponds to a respective set of field-effect transistors of the first plurality of sets of field-effect transistors, wherein each set of field-effect transistors of the third plurality of sets of field-effect transistors is between the first data line and the respective string of series-connected memory cells of its corresponding set of field-effect transistors of the first plurality of sets of field-effect transistors, wherein each set of field-effect transistors of the third plurality of sets of field-effect transistors has N field-effect transistors connected in series, and wherein each set of field-effect transistors of the third plurality of sets of field-effect transistors was fabricated to have a respective binary permutation of two threshold voltages of the plurality of possible binary permutations of two threshold voltages that is the same as the respective binary permutation of two threshold voltages of its corresponding set of field-effect transistors of the first plurality of sets of field-effect transistors;

a fourth plurality of sets of field-effect transistors, wherein each set of field-effect transistors of the fourth plurality of sets of field-effect transistors corresponds to a respective set of field-effect transistors of the second plurality of sets of field-effect transistors, wherein each set of field-effect transistors of the fourth plurality of sets of field-effect transistors is between the second data line and the respective string of series-connected memory cells of its corresponding set of field-effect transistors of the second plurality of sets of field-effect transistors, wherein each set of field-effect transistors of the fourth plurality of sets of field-effect transistors has N field-effect transistors connected in series, and wherein each set of field-effect transistors of the fourth plurality of sets of field-effect transistors was fabricated to have a respective binary permutation of two threshold voltages of the plurality of possible binary permutations of two threshold voltages that is the same as the respective binary permutation of two threshold voltages of its corresponding set of field-effect transistors of the second plurality of sets of field-effect transistors; and N second select lines, wherein each second select line of the N second select lines is connected to a control gate of a respective field-effect transistor of each set of field-effect transistors of the third plurality of sets of field-effect transistors and to a control gate of a respective field-effect transistor of each set of field-effect transistors of the fourth plurality of sets of field-effect transistors corresponding to a same position of the plurality of possible binary permutations of two threshold voltages;

wherein each field-effect transistor of each set of field-effect transistors of the third plurality of sets of field-effect transistors is immediately adjacent a corresponding field-effect transistor of its corresponding set of field-effect transistors of the first plurality of sets of field-effect transistors fabricated to have a same threshold voltage; and wherein each field-effect transistor of each set of field-effect transistors of the fourth plurality of sets of field-effect transistors is immediately adjacent a corresponding field-effect transistor of its corresponding set of field-effect transistors of the second plurality of sets of field-effect transistors fabricated to have a same threshold voltage.

* * * * *